US012604722B2

(12) United States Patent
Park et al.

(10) Patent No.: US 12,604,722 B2
(45) Date of Patent: Apr. 14, 2026

(54) SEMICONDUCTOR DEVICES

(71) Applicant: Samsung Electronics Co., Ltd.,
Suwon-si (KR)

(72) Inventors: Sangoh Park, Hwaseong-si (KR);
Hyunseo Shin, Hwaseong-si (KR);
Seokhan Park, Seongnam-si (KR);
Seunghune Yang, Seoul (KR)

(73) Assignee: Samsung Electronics Co., Ltd.,
Suwon-si (KR)

( * ) Notice: Subject to any disclaimer, the term of this
patent is extended or adjusted under 35
U.S.C. 154(b) by 323 days.

(21) Appl. No.: 17/487,460

(22) Filed: Sep. 28, 2021

(65) Prior Publication Data

US 2022/0262731 A1      Aug. 18, 2022

(30) Foreign Application Priority Data

Feb. 16, 2021     (KR) ........................ 10-2021-0020395

(51) Int. Cl.
H01L 23/528          (2006.01)
H01L 23/522          (2006.01)
(Continued)

(52) U.S. Cl.
CPC ..... H01L 23/5283 (2013.01); H10B 12/0335
(2023.02); H10B 12/315 (2023.02);
(Continued)

(58) Field of Classification Search
CPC . H01L 23/522; H01L 23/5226; H01L 23/528;
H01L 23/5283; H01L 29/66484;
(Continued)

(56) References Cited

U.S. PATENT DOCUMENTS 6,522,003 B1 *   2/2003  Minami ................ G03F 9/7084
257/E23.179
8,298,893 B2    10/2012  Kim
(Continued)

FOREIGN PATENT DOCUMENTS

KR        20010059019 A        7/2001
KR        20040008635 A        1/2004

*Primary Examiner* — Monica D Harrison
*Assistant Examiner* — John Lin
(74) *Attorney, Agent, or Firm* — Wolf, Greenfield &
Sacks, P.C.

(57)          ABSTRACT

A semiconductor device may include a gate structure, first
and second source/drain layers, first and second contact
plugs, first and second conductive structures, and a third
contact plug. The gate structure may be on a substrate. The
first and second source/drain layers may be at upper por-
tions, respectively, of the substrate on opposite sidewalls of
the gate structure and adjacent thereto. The first and second
contact plugs may be on the first and second source/drain
layers, respectively, and each contact plugs may extend in a
vertical direction. The first and second conductive structures
may contact upper surfaces of the first and second contact
plugs, respectively. The third contact plug may contact an
upper surface of the second conductive structure. A height
and a width of the second conductive structure may be
greater than a height and a width of the first conductive
structure.

20 Claims, 54 Drawing Sheets

(51) Int. Cl.
    *H10B 12/00*     (2023.01)
    *H10D 64/23*     (2025.01)

(52) U.S. Cl.
    CPC ......... *H10B 12/482* (2023.02); *H10B 12/485* (2023.02); *H10B 12/50* (2023.02); *H10D 64/258* (2025.01)

(58) Field of Classification Search
    CPC ........... H01L 29/7831; H01L 29/41775; H01L 21/76897; H01L 21/823418; H01L 21/823425; H10B 12/48; H10B 12/482; H10B 12/485; H10B 12/09; H10B 12/50; H10D 84/013; H10D 84/0133; H10D 30/023; H10D 30/611; H10D 64/258
    See application file for complete search history.

(56) References Cited

U.S. PATENT DOCUMENTS

| | | | |
|---|---|---|---|
| 8,324,673 B2 | 12/2012 | Chung et al. | |
| 8,652,968 B2 | 2/2014 | Yu et al. | |
| 8,760,952 B2 | 6/2014 | Carlson | |
| 9,093,297 B2 | 7/2015 | Song et al. | |
| 9,318,566 B2 | 4/2016 | Lee et al. | |
| 9,570,409 B2 | 2/2017 | Park et al. | |
| 9,768,176 B2 | 9/2017 | Yoo | |
| 10,204,910 B2 | 2/2019 | Kim et al. | |
| 10,332,831 B2 | 6/2019 | Hong et al. | |
| 10,373,961 B2 | 8/2019 | Yoon et al. | |
| 2002/0019090 A1* | 2/2002 | Ogata | H01L 21/823418 257/E21.507 |
| 2003/0032236 A1* | 2/2003 | Sogo | H01L 27/105 257/E21.654 |
| 2005/0001253 A1* | 1/2005 | Sugimura | H01L 21/76838 257/E21.585 |
| 2005/0236713 A1* | 10/2005 | Mitani | H10B 41/30 257/E27.103 |
| 2008/0157227 A1* | 7/2008 | Manabe | H01L 21/76897 257/E21.627 |
| 2012/0155195 A1* | 6/2012 | Carlson | G11C 7/02 257/E21.602 |
| 2013/0214428 A1* | 8/2013 | Maki | H01L 21/76805 257/774 |
| 2015/0145009 A1* | 5/2015 | Namioka | H10B 12/0335 257/296 |
| 2019/0385946 A1 | 12/2019 | Xie et al. | |

* cited by examiner 795     680     503     795     620     795          795

SEMICONDUCTOR DEVICES

CROSS-REFERENCE TO RELATED APPLICATION

This application claims priority under 35 U.S.C. § 119 to Korean Patent Application No. 10-2021-0020395 filed on Feb. 16, 2021, in the Korean Intellectual Property Office, the disclosure of which is hereby incorporated by reference in its entirety.

TECHNICAL FIELD

Aspects of the present disclosure relate to semiconductor devices. More particularly, aspects of the present disclosure relate to semiconductor devices including transistors and wiring structures electrically connected thereto.

BACKGROUND

A bit line structure may be formed in a cell region of a DRAM (dynamic random-access memory) device, and a transistor and a wiring structure may be formed in a peripheral circuit region to be electrically connected to the bit line structure. The wiring structure may have a minute size, and a plurality of wiring structures may be spaced apart from each other by a small pitch. Forming small structures in semiconductor devices may be difficult and/or require expensive processing equipment. Thus, forming the wiring structures may not be easy.

SUMMARY

Example embodiments provide a semiconductor device having improved characteristics.

According to some example embodiments of the inventive concepts, a semiconductor device is provided. The semiconductor device may include a gate structure, first and second source/drain layers, first and second contact plugs, first and second conductive structures, and a third contact plug. The gate structure may be formed on a substrate. The first and source/drain layers may be at upper portions, respectively, of the substrate and on opposite sidewalls of the gate structure and adjacent thereto. The first and second contact plugs may be on the first and second source/drain layers, respectively, and each of the first and second contact plugs may extend in a vertical direction perpendicular to an upper surface of the substrate. The first and second conductive structures may contact upper surfaces of the first and second contact plugs, respectively. The third contact plug may contact an upper surface of the second conductive structure. A height of the second conductive structure may be greater than a height of the first conductive structure, and a width of the second conductive structure may be greater than a width of the first conductive structure.

According to some example embodiments of the inventive concepts, a semiconductor device is provided. The semiconductor device may include a gate structure, first and second source/drain layers, first and second contact plugs, first and second conductive structures, a third contact plug, a third conductive structure, and a fourth contact plug. The gate structure may be on a substrate. The first and second source/drain layers may be at upper portions, respectively, of the substrate on opposite sidewalls of the gate structure and adjacent thereto. The first and second contact plugs may be formed on the first and second source/drain layers, respectively, and each of the first and second contact plugs may extend in a vertical direction perpendicular to an upper surface of the substrate. The first and second conductive structures may contact upper surfaces of the first and second contact plugs, respectively, and the first and second conductive structures may be at the same height as each other. The third contact plug may contact an upper surface of the second conductive structure. The third conductive structure may contact an upper surface of the third contact plug. The fourth contact plug may contact an upper surface of the third conductive structure. A width of the third conductive structure may be greater than a width of the second conductive structure, and a width of the fourth contact plug may be greater than a width of the third contact plug.

According to some example embodiments of the inventive concepts, a semiconductor device is provided. The semiconductor device may include an active region, gate structures, first, second and third impurity layers, first contact plugs, a second contact plug, first conductive structures, a second conductive structure, and a third contact plug. The active region may be on a substrate. The gate structures may be on the substrate and spaced apart from each other in a first direction parallel to an upper surface of the substrate, and each of the gate structures may overlap partially the active region in a vertical direction perpendicular to the upper surface of the substrate. The first, second and third impurity layers may be at upper portions, respectively, of the active region adjacent to the gate structure. The first contact plugs may be on the first and second impurity layers, respectively, and each of the first contact plugs may extend in the vertical direction. The second contact plug may be formed on the third impurity layer, and may extend in the vertical direction. The first conductive structures may contact upper surfaces of the first contact plugs, respectively, and each of the first conductive structures may extend in the first direction. The second conductive structure may contact an upper surface of the second contact plug and may extend in the first direction. The third contact plug may contact an upper surface of the second conductive structure. A height of the second conductive structure may be greater than a height of the first conductive structures, and a width of the second conductive structure may be greater than a width of the first conductive structures.

According to some example embodiments of the inventive concepts, there is a semiconductor device. The semiconductor device may include first and second active patterns, a first gate structure, a bit line structure, a contact plug structure, a capacitor, a second gate structure, first and second source/drain layers, first and second contact plugs, first and second conductive structures, a third contact plug, and a fourth contact plug. The first and second active patterns may be formed on a cell region and a peripheral circuit region, respectively, of a substrate, and the peripheral circuit region may surround the cell region. The first gate structure may be formed in an upper portion of the first active pattern, and may extend in a first direction parallel to an upper surface of the substrate. The bit line structure may extend in a second direction on the cell region and a portion of the peripheral circuit region adjacent thereto of the substrate, and may contact an upper surface of a middle portion of the first active pattern. The contact plug structure may contact each of opposite edge portions of the first active pattern. The capacitor may be formed on the contact plug structure. The second gate structure may be on the peripheral circuit region of the substrate, and may partially overlap the second active pattern in a vertical direction perpendicular to the upper surface of the substrate. The first and second source/drain layers may be at upper portions, respectively, of the second active pattern on opposite sides of the second gate structure and adjacent thereto. The first and second contact plugs may be formed on the first and second source/drain layers, respectively, and each of the first and second contact plugs may extend in the vertical direction. The first and second conductive structures may contact upper surfaces of the first and second contact plugs, respectively, and each of the first and second conductive structures may extend in the second direction on the peripheral circuit region of the substrate. The third contact plug may contact a lower surface of an end portion in the second direction of the first conductive structure, and may extend in the vertical direction to contact an end portion in the second direction of the bit line structure. The fourth contact plug may contact an upper surface of the second conductive structure. A height of the second conductive structure may be greater than a height of the first conductive structure, and a width of the second conductive structure may be greater than a width of the first conductive structure.

In methods of manufacturing the semiconductor device, some of the wirings on the peripheral circuit region of the substrate, which may apply electrical signals to the bit line structures on the cell region of the substrate, might not be formed at the same level as other wirings but may be formed at different levels therefrom. Thus, the wirings may have sufficiently large sizes and free layouts regardless of the other wirings. Accordingly, the electrical short or interference between the wirings may decrease, and even if misalignment occurs when forming contact plugs electrically connected to the wirings are formed, the contact plugs may contact the wirings very well.

BRIEF DESCRIPTION OF THE DRAWINGS

FIGS. 24 to 56 are plan views and cross-sectional views illustrating a method of manufacturing a semiconductor device according to some example embodiments.

DETAILED DESCRIPTION

The above and other aspects and features of methods of cutting a fine pattern, methods of forming active patterns using the same, and method of manufacturing semiconductor devices using the same in accordance with some example embodiments will become readily understood from detail descriptions that follow, with reference to the accompanying drawings. It will be understood that, although the terms "first," "second," and/or "third" may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second or third element, component, region, layer or section without departing from the teachings of inventive concepts.

FIGS. 1 to 13 are plan views and cross-sectional views illustrating a method of manufacturing a semiconductor device according to some example embodiments. More particularly, FIGS. 1, 3, 6, 8, 10 and 12 are the plan views, and FIGS. 2, 4-5, 7, 9, 11 and 13 are the cross-sectional views, which are taken along lines A-A' of the corresponding plan views.

Figure 1:
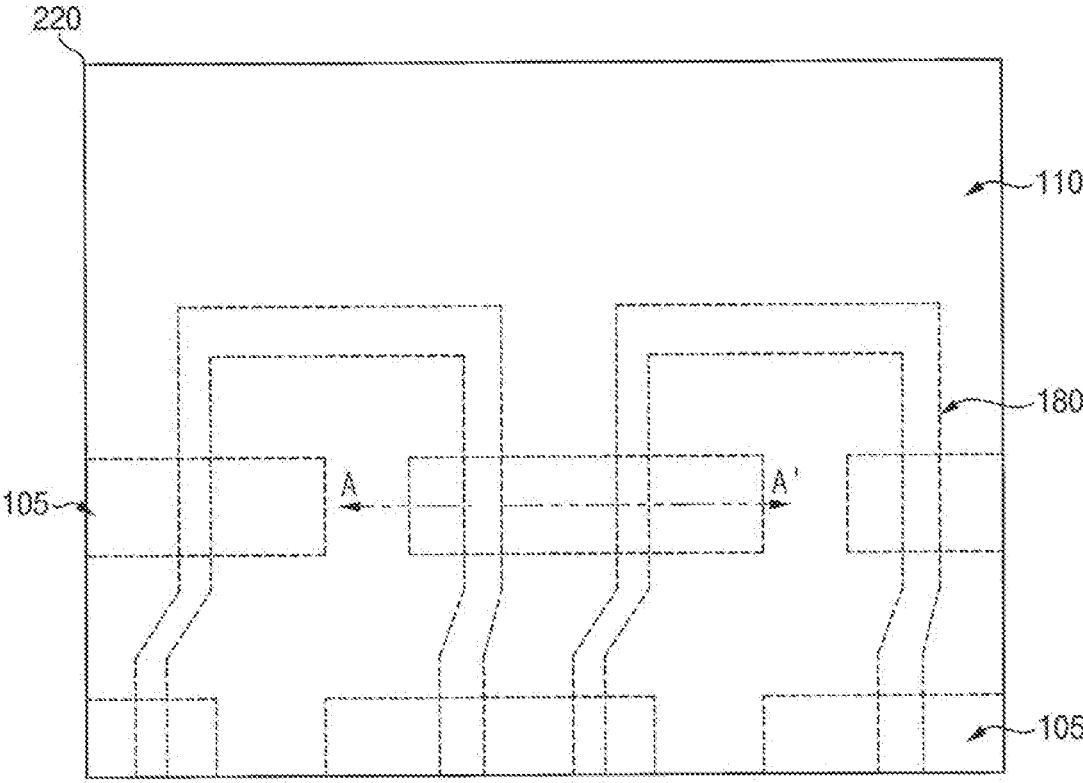
FIGS. 1 to 13 are plan views and cross-sectional views illustrating a method of manufacturing a semiconductor device according to some example embodiments.
Figure 1:
Figure 2:
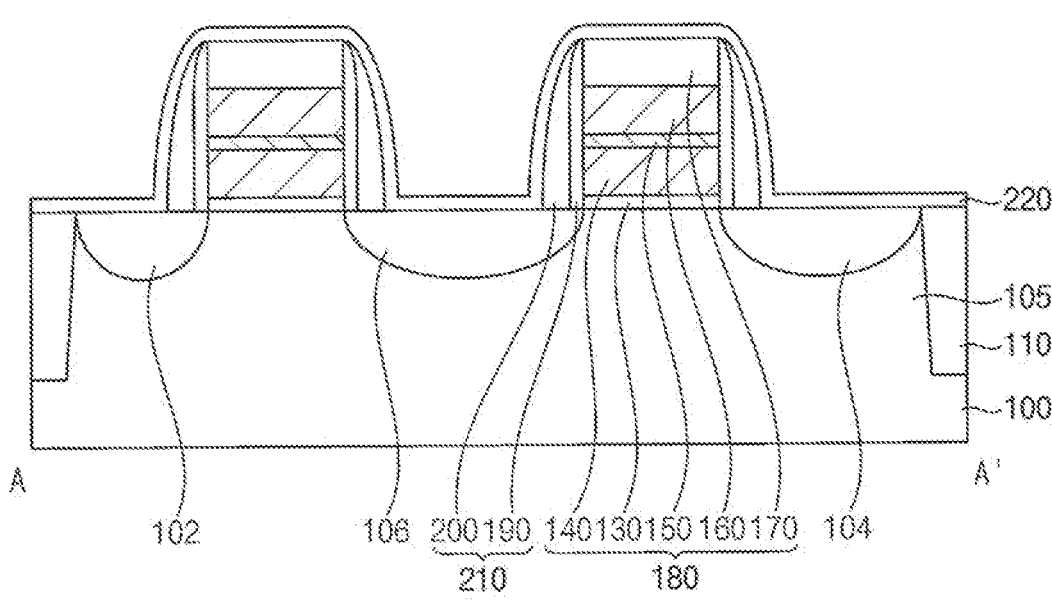
Figure 2:

Referring to FIGS. 1 and 2, a gate structure 180 may be formed on a substrate 100, a gate spacer structure 210 may be formed on a sidewall of the gate structure 180, and a first etch stop layer 220 may be formed on the substrate 100 to cover the gate structure 180 and the gate spacer structure 210.

The substrate 100 may include silicon, germanium, silicon-germanium, or a III-V group compound semiconductor, such as GaP, GaAs, or GaSb. In some example embodiments, the substrate 100 may be a silicon-on-insulator (SOI) substrate or a germanium-on-insulator (GOI) substrate.

The substrate 100 may include a field region on which an isolation pattern 110 is formed and an active region 105 on which no isolation pattern 110 is formed. A sidewall of the active region 105 may be covered by the isolation pattern 110. The active region 105 may be referred to as an active pattern. The isolation pattern 110 may include an oxide, e.g., silicon oxide.

In example embodiments, the active region 105 may extend in a first direction D1 parallel to an upper surface of the substrate 100. The active region 105 may be a first active region 105 of a plurality of active regions 105. The plurality of active regions 105 may be spaced apart from each other in a second direction D2 that is parallel to the upper surface of the substrate 100 and that crosses the first direction D1. In some example embodiments, the first and second directions D1 and D2 may be perpendicular to each other.

In some example embodiments, as seen in FIG. 1, a plurality of rows of active regions (e.g., first and second active region rows), each of which may include a plurality of active regions 105 arranged in the first direction D1, and may be spaced apart from each other in the second direction D2. An active region 105 included in one of the plurality of active region rows (e.g., the first active region row) may correspond with an active region 105 of a different active region row (e.g., the second active region row). For example, the corresponding active regions 105 may be the $n^{th}$ (e.g., sixth) active region 105 in their respective active region rows. The corresponding active regions 105 may not be entirely aligned with each other in the second direction D2, but may be shifted by a given distance in the first direction D1. The inventive concepts are not limited thereto, and the layout of the active regions 105 may be varied.

The gate structure 180 may be formed by sequentially forming a gate insulation layer, a first conductive layer, a diffusion barrier layer, a second conductive layer, and a gate mask layer on the substrate 100, patterning the gate mask layer to form a gate mask 170, and etching the second conductive layer, the diffusion barrier layer, the first conductive layer and the gate insulation layer. Thus, the gate structure 180 may be formed to include a gate insulation pattern 130, a first conductive pattern 140, a diffusion barrier 150, a second conductive pattern 160 and a gate mask 170 sequentially stacked in a vertical direction on the upper surface of the substrate 100. The sequentially stacked first conductive pattern 140, the diffusion barrier 150 and the second conductive pattern 160 may form a gate electrode.

The gate insulation pattern 130 may include an oxide, e.g., silicon oxide. The first conductive pattern 140 may include, e.g., doped polysilicon. The diffusion barrier 150 may include a metal silicon nitride, e.g., titanium silicon nitride. The second conductive pattern 160 may include a metal, e.g., tungsten. The gate mask 170 may include a nitride, e.g., silicon nitride. These examples are non-limiting and, in some embodiments, other materials may be used in the gate insulation pattern 130, the first conductive pattern 140, the diffusion barrier 150, the second conductive pattern 160 and/or the gate mask 170.

In some example embodiments, as seen in FIG. 1, the gate structure 180 includes a first extension portion extending in the first direction D1 and a second extension portion extending in the second direction D2 from each of opposing end portions of the first extension portion, however, the inventive concepts are not limited thereto. For example, the gate structure 180 may extend only in a direction, or may have a ring shape in a plan view.

In some example embodiments, as seen in FIG. 1, two gate structures 180 that are spaced apart from each other in the first direction D1 are shown, with a portion of each of the gate structures 180 formed on the active region 105 and another portion of the gate structures 180 formed on the isolation pattern 110. However, the inventive concepts are not limited thereto, and the number and/or the layout of the gate structure 180 may be varied.

After forming the gate structure 180, first to third impurity layers 102, 104 and 106 may be formed at upper portions of the active region 105 adjacent to the gate structure 180 by, e.g., an ion implantation process. The third impurity layer 106 may be formed at an upper portion of the active region 105 between neighboring or adjacent ones of the gate structures 180 in the first direction D1, and each of the first and second impurity layers 102 and 104 may be formed at an upper portion of the active region 105 opposite the third impurity layer 106 with each of the gate structures 180 as a reference.

Each of the first to third impurity layers 102, 104 and 106 may include n-type impurities, e.g., phosphorus or p-type impurities, e.g., boron. The first and third impurity layers 102 and 106 or the second and third impurity layers 104 and 106 together with the gate structure 180 therebetween may form a transistor, and each of the impurity layers 102, 104 and 106 may serve as a source/drain of the transistor.

The gate spacer structure 210 may include first and second gate spacers 190 and 200 sequentially stacked in a horizontal direction parallel to the upper surface of the substrate 100 from a sidewall of the gate structure 180.

The first gate spacer 190 may be formed by forming a first gate spacer layer on the substrate 100 having the gate structure 180 thereon and anisotropically etching the first gate spacer layer, and the second gate spacer 200 may be formed by forming a second gate spacer layer on the substrate 100 having the gate structure 180 and the first gate spacer 190 thereon and anisotropically etching the second gate spacer layer. The first gate spacer 190 may include a nitride, e.g., silicon nitride, and the second gate spacer 200 may include an oxide, e.g., silicon oxide.

However, the inventive concepts are not limited to the gate space structure 210 having the first gate spacer 190 and the second gate spacer 200, and the gate spacer structure 210 may have a single layer or a multi-layered structure include more than two layers.

The first etch stop layer 220 may include a nitride, e.g., silicon nitride, or a metal oxide, e.g., titanium oxide.

Figure 3:
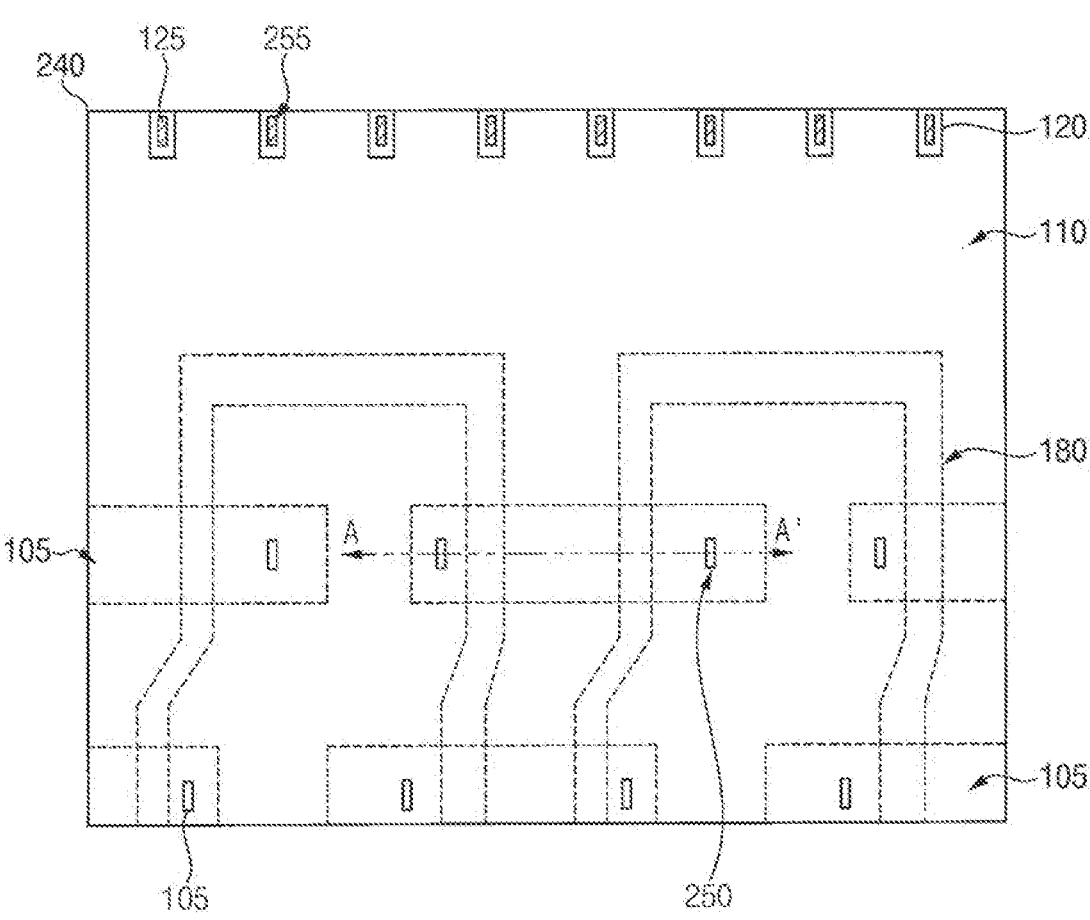
Figure 3:
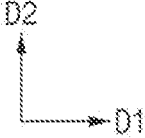
Figure 4:
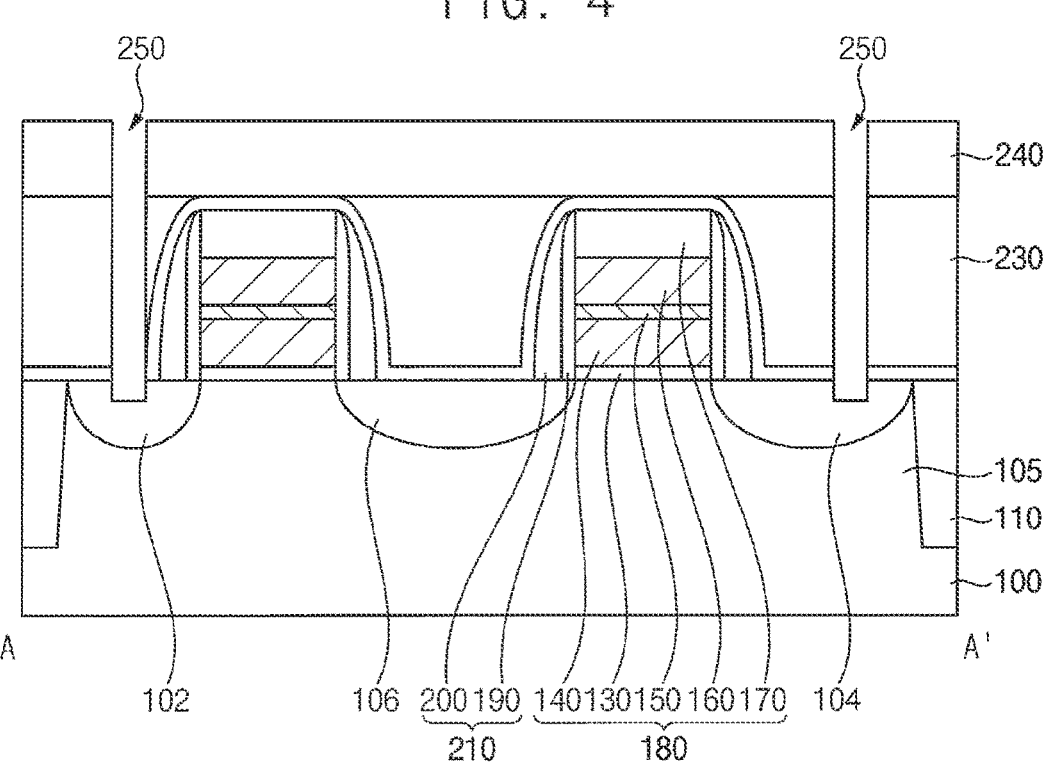

Referring to FIGS. 3 and 4, a first insulating interlayer 230 may be formed on the first etch stop layer 220, the first insulating interlayer 230 may be planarized, and a capping layer 240 may be formed on the first insulating interlayer 230.

The first insulating interlayer 230 may be planarized until an upper surface of a portion of the first etch stop layer 220 on an upper surface of the gate structure 180 is exposed, and thus a space between the gate spacer structures 210 on the sidewalls of the adjacent gate structures 180 may be filled with the first insulating interlayer 230.

The first insulating interlayer 230 may include an oxide, e.g., silicon oxide, and the capping layer 240 may include a nitride, e.g., silicon nitride.

A first conductive structure 120 may be further formed on the substrate 100. The first conductive structure 120 may include a conductive portion 125 and a mask portion that are sequentially stacked. In some example embodiments, the first conductive structure 120 may include the gate structure 180, the first etch stop layer 220 and the capping layer 240 sequentially stacked. The first conductive structure 120 may be one of a plurality of first conductive structures 120 that may be spaced apart from each other in the first direction D1.

A first opening 250 may be formed to extend through the first insulating interlayer 230, the capping layer 240 and the first etch stop layer 220 to expose the active region 105, and a second opening 255 may be formed to extend through the first conductive structure 120 to expose the conductive portion 125.

The first and second openings 250 and 255 may be formed by performing an exposure process and a developing process on a photoresist layer to form a photoresist pattern, and an etching process using the photoresist pattern as an etching mask. In some example embodiments, the exposure process and the developing process may be performed by an ArF lithography process using argon fluoride (ArF) laser equipment.

In some example embodiments, the first opening 250 may expose each of opposing edge upper surfaces in the first direction D1 of each of the active regions 105, that is, upper surfaces of the first and second impurity layers 102 and 104. In some example embodiments, as seen in FIG. 4, the first opening 250 is not formed on a portion of the active region 105 between the adjacent gate structures 180 spaced apart from each other in the first direction D1. In other words, a first opening 250 is not formed on a portion of the active region 105 on which the third impurity layer 106 is formed, but first openings 250 are formed on portions of the active region 105 where distal sidewalls of the adjacent gate structures 180 are located.

In some example embodiments, as seen in FIG. 4, distances from the first openings 250 to the sidewalls of the gate structures 180 are different from each other, however, the inventive concepts are not limited thereto.

Figure 5:
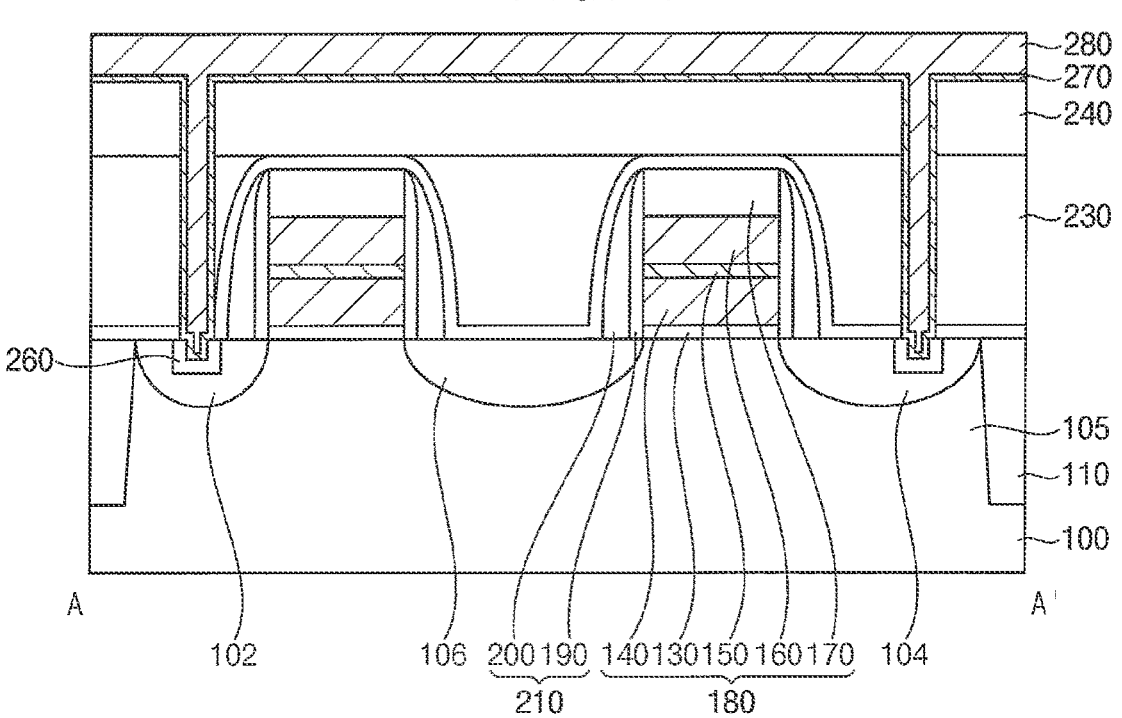
Figure 5:

Referring to FIG. 5, a first metal silicide pattern 260 may be formed on an upper surface of the active region 105 exposed by the first opening 250. In other words, the first metal silicide pattern 260 may be formed on the upper surfaces of each of the first and second impurity layers 102 and 104. A first barrier layer 270 may be formed on an upper surface of the first metal silicide pattern 260, on sidewalls of the first and second openings 250 and 255, and on an upper surface of the capping layer 240. A first metal layer 280 may be formed on the first barrier layer 270 and may fill the first and second openings 250 and 255.

The first metal silicide pattern 260 may be formed by forming a metal layer on the upper surface of the active region 105 exposed by the first opening 250, on the sidewalls of the first opening 250 and on the upper surface of the capping layer 240, then performing a heat treatment process, and then removing an unreacted portion of the metal layer. The metal layer may include, e.g., cobalt, nickel, titanium, or the like, and thus the first metal silicide pattern 260 may include cobalt silicide, nickel silicide, titanium silicide, or the like.

The first barrier layer 270 may include a metal nitride, e.g., titanium nitride, tantalum nitride, tungsten nitride, or the like, and the first metal layer 280 may include a metal, e.g., tungsten, copper, aluminum, or the like.

Figure 6:
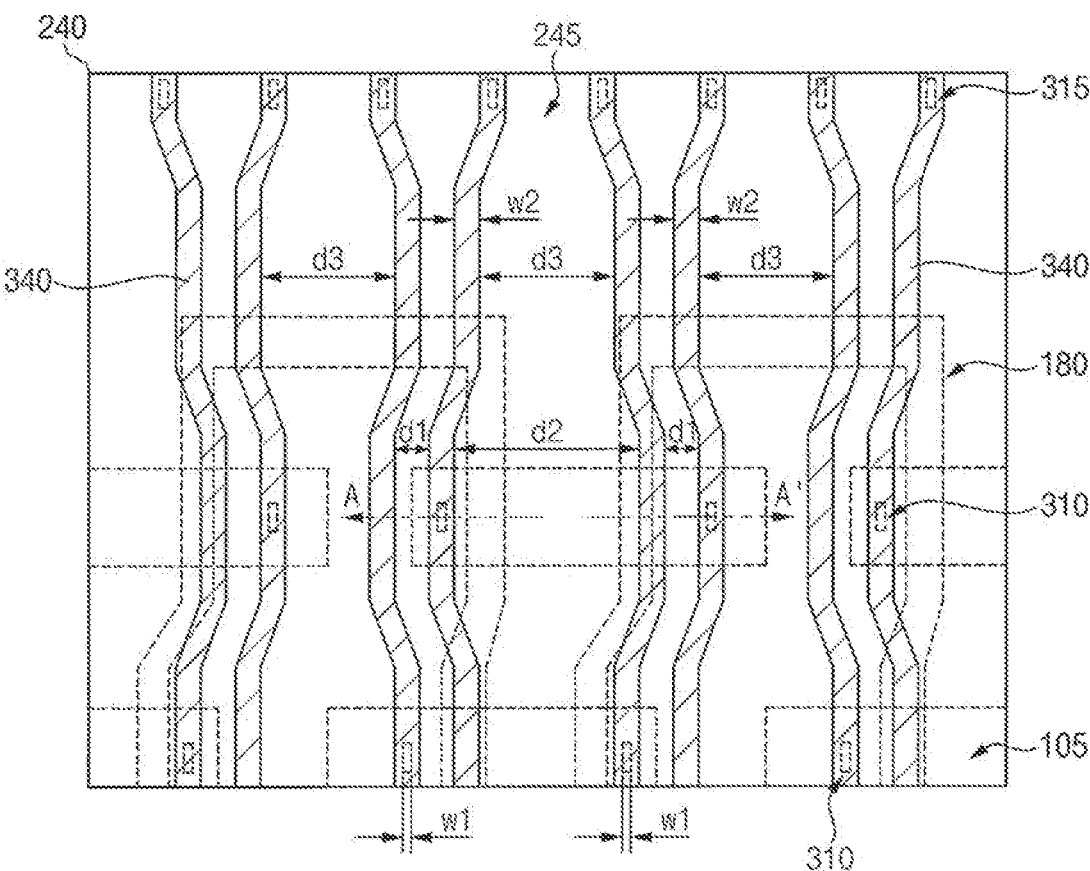
Figure 6:
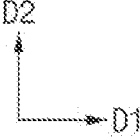
Figure 7:
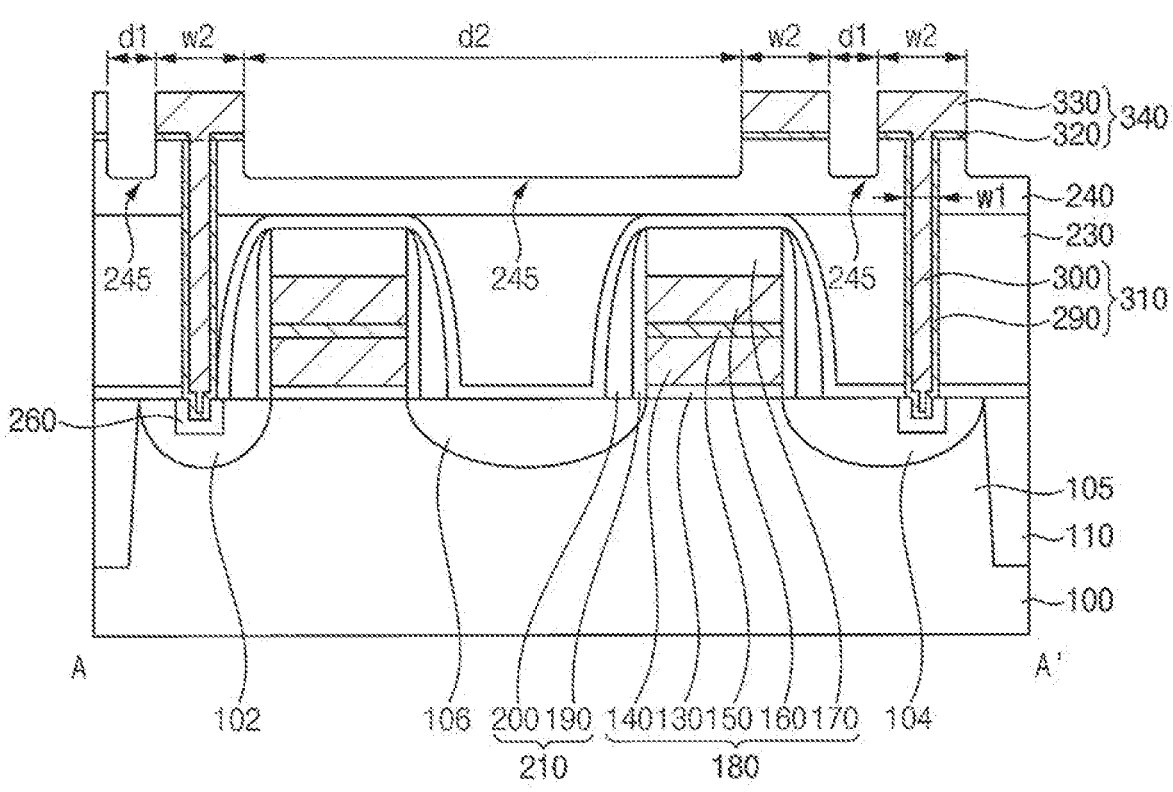

Referring to FIGS. 6 and 7, the first metal layer 280 and the first barrier layer 270 may be patterned by an etching process, and thus a second conductive structure 340 may be formed on the capping layer 240.

During the etching process, an upper portion of the capping layer 240 may also be etched, and thus a recess 245 may be formed on a portion of the capping layer 240 on which the second conductive structure 340 is not formed.

The second conductive structure 340 may be formed by performing an exposure process and a developing process on a photoresist layer to form a photoresist pattern, and then performing an etching process using the photoresist pattern as an etching mask. In some example embodiments, the exposure process and the developing process may be performed by an extreme ultraviolet (EUV) lithography process using EUV laser equipment.

The second conductive structure 340 may include a first metal pattern 330 and a first barrier pattern 320 that covers a lower surface of the first metal pattern 330. A portion of the first metal layer 280 may remain in the first opening 250 and may be referred to as a second metal pattern 300. A portion of the first barrier layer 270 covering a sidewall and a lower surface of the portion of the second metal pattern 300 within the first opening 250 may be referred to as a second barrier pattern 290. The second metal pattern 300 and the second barrier pattern 290 may form a first contact plug 310. The first contact plug 310 and the second conductive structure 340 may be sequentially stacked on each of the first and second impurity layers 102 and 104, and may contact each other. The first contact plug 310 may have a first width w1 in the first direction D1.

A portion of the first metal layer 280 remaining in the second opening 255 and a portion of the first barrier layer 270 covering a sidewall and a lower surface of the portion of the first metal layer 280 may be referred to as a third metal pattern and a third barrier pattern, respectively. The third metal pattern and the third barrier pattern may form a second contact plug 315. The second contact plug 315 and the second conductive structure 340 may be sequentially stacked on the conductive portion 125 of the first conductive structure 120 in the vertical direction, and may contact each other.

In some example embodiments, the second conductive structure 340 may extend in the second direction D2, and a plurality of second conductive structures 340 may be spaced apart from each other in the first direction D1. Each of the second conductive structures 340 may have a second width w2 in the first direction D1. In some example embodiments, the second width w2 of each of the second conductive structures 340 may be equal to or greater than the first width w1 of the first contact plug 310.

In some example embodiments, as seen in FIGS. 6 and 7, each of the second conductive structures 340 has a uniform width in the second direction D2, and the second conductive structures 340 have the same width, however, the inventive concepts are not limited thereto.

Each of the second conductive structures 340 may contact an upper surface of the first contact plug 310 on a corresponding one of the active regions 105 included in the first and second active region rows, and an end portion of each of the second conductive structures 340 may contact an upper surface of the second contact plug 315.

In some example embodiments, each of the second conductive structures 340 may not extend in a straight line in the second direction D2 but may be partially bent, and thus a distance between neighboring or adjacent ones of the second conductive structures 340 in the first direction D1 may not be uniform in the second direction D2, and may vary. In some example embodiments, as seen in FIGS. 6 and 7, a first distance d1 between the second conductive structures 340 that may be a relatively small distance, a second distance d2 between the second conductive structures 340 on the active region 105 included in the first active region row that may be a relatively large distance, and a third distance d3 that may be greater than the first distance d1 and smaller than the second distance d2 are shown, without limitation.

Figure 8:
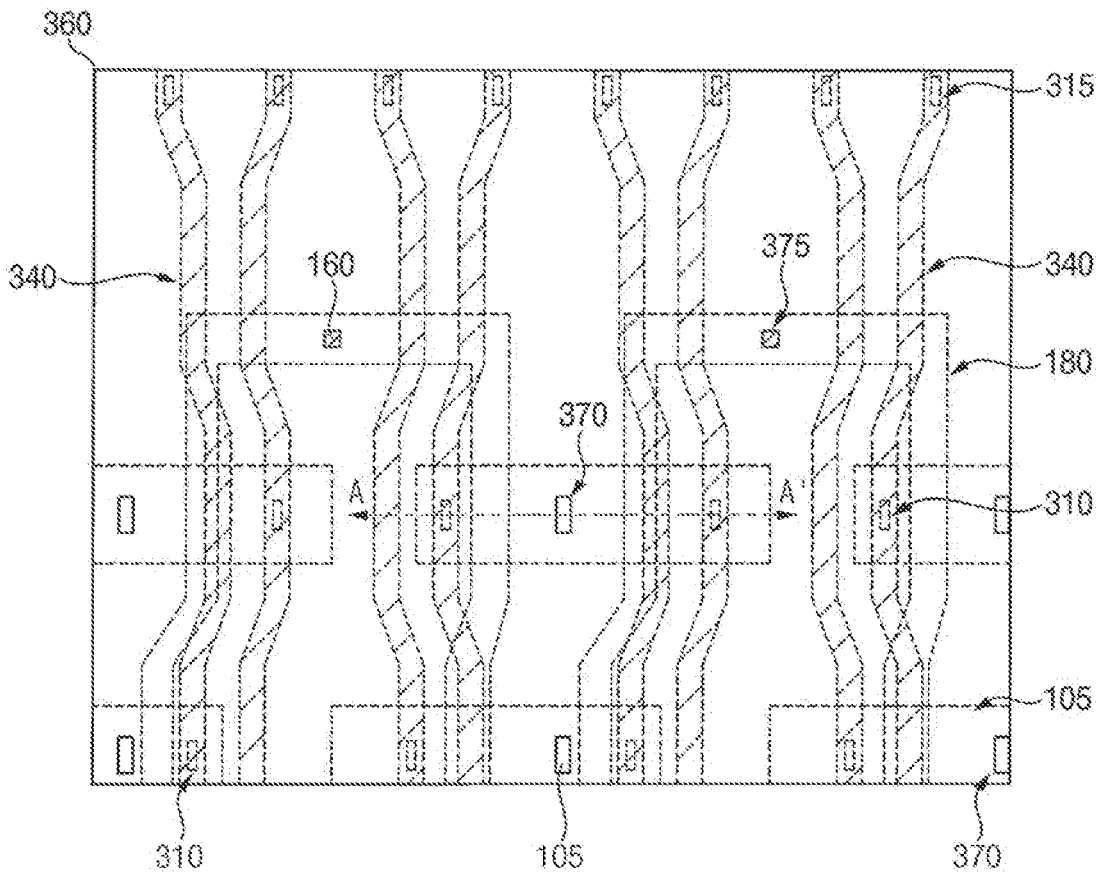
Figure 8:
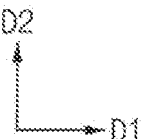
Figure 9:
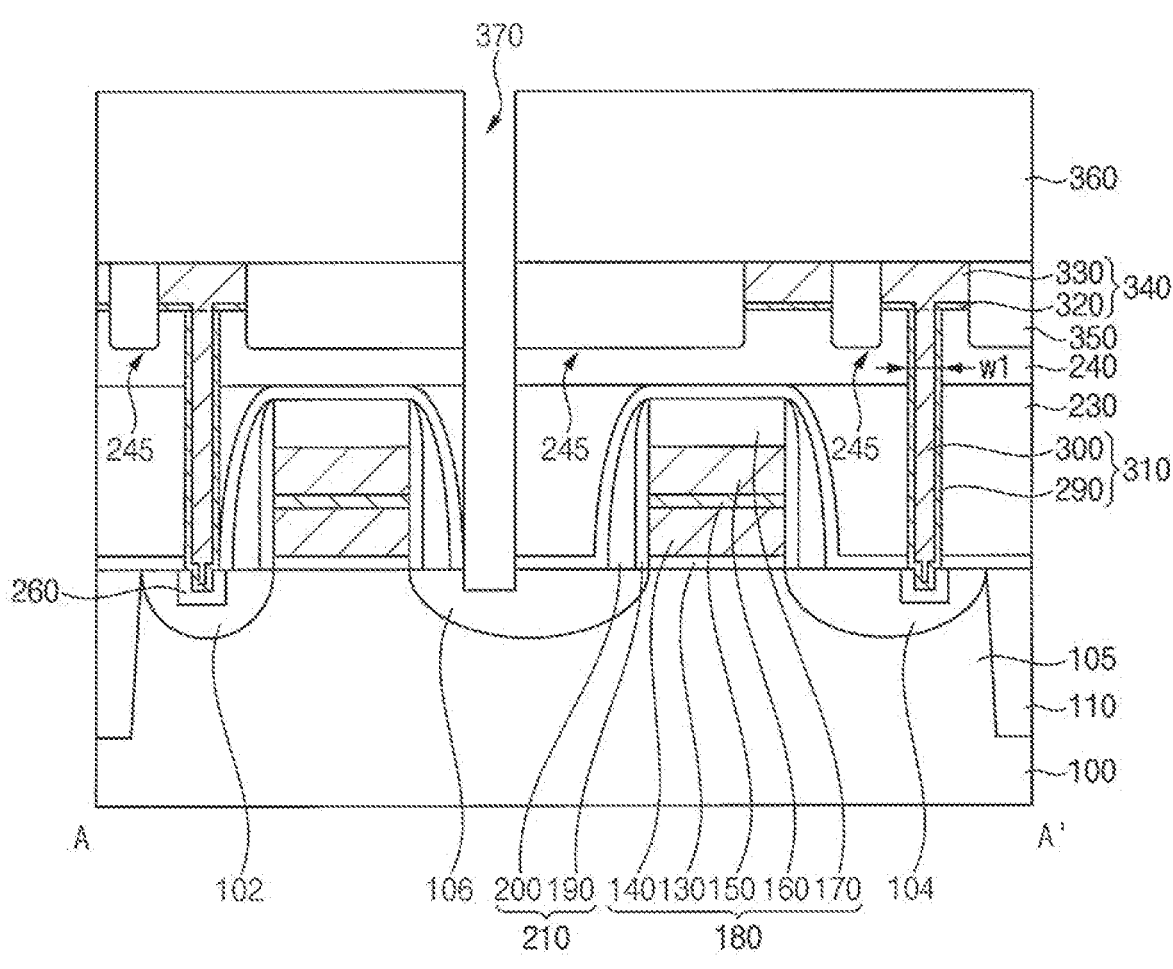
Figure 9:
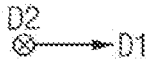

Referring to FIGS. 8 and 9, a second insulating interlayer 350 may be formed on the capping layer 240 and may fill the recess 245 and a space between the second conductive structures 340. A third insulating interlayer 360 may be formed on the second conductive structures 340 and the second insulating interlayer 350. A third opening 370 may be formed that extends through the first insulating interlayer 230, the capping layer 240, the second and third insulating interlayers 350 and 360 and the first etch stop layer 220 to expose the upper surface of the active region 105. A fourth opening 375 that extends through the capping layer 240, the second and third insulating interlayers 350 and 360, the first etch stop layer 220 and the gate mask 170 may be formed to expose the upper surface of the second conductive pattern 160.

Each of the second and third insulating interlayers 350 and 360 may include a nitride, e.g., silicon nitride or an oxide, e.g., silicon oxide, with the understanding that the inventive concepts are not limited thereto. In some example embodiments, the second insulating interlayer 350 may have a multi-layered structure including first and second layers containing different insulating materials, and the second layer may cover a lower surface and a sidewall of the first layer.

The third and fourth openings 370 and 375 may be formed by performing an exposure process and a developing process on a photoresist layer to form a photoresist pattern, and then performing an etching process using the photoresist pattern as an etching mask. In some example embodiments, the exposure process and the developing process may be performed by an ArF lithography process using ArF laser equipment.

In some example embodiments, the third opening 370 may expose an upper surface of a middle portion in the first direction D1 of each of the active regions 105. In other words, the third opening 370 may expose an upper surface of the third impurity layer 106. In some example embodiments, as seen in FIGS. 8 and 9, the third opening 370 is formed between neighboring sidewalls of the gate structures 180 that face each other in the first direction D1.

Figure 10:
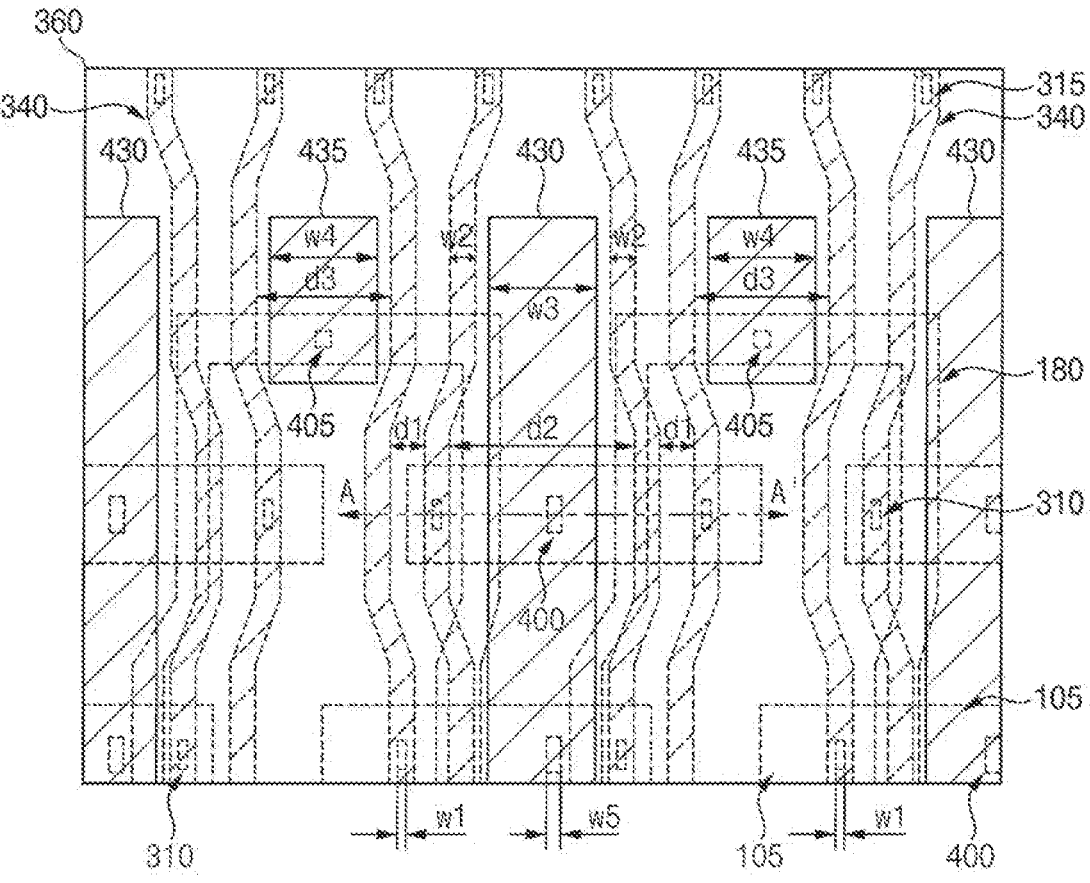
Figure 10:
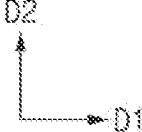
Figure 11:

Referring to FIGS. 10 and 11, a second metal silicide pattern 265 may be formed on the upper surface of the active region 105 exposed by the third opening 370. In other words, the second metal silicide pattern 265 may be formed on the upper surface of the third impurity layer 106. A second barrier layer may be formed on an upper surface of the second metal silicide pattern 265, on sidewalls of the third and fourth openings 370 and 375, and on an upper surface of the third insulating interlayer 360. A second metal layer may be formed on the second barrier layer and may fill the third and fourth openings 370 and 375.

The second metal silicide pattern 265 may include a material substantially the same as that of the first metal silicide pattern 260, the second barrier layer may include a material substantially the same as that of the first barrier layer 270, and the second metal layer may include a material substantially the same as that of the first metal layer 280.

An etching process may be performed on the second metal layer and the second barrier layer, and thus third and fourth conductive structures 430 and 435 may be formed on the third insulating interlayer 360.

The third and fourth conductive structures 430 and 435 may be formed by performing an exposure process and a developing process on a photoresist layer to form a photoresist pattern, and then performing an etching process using the photoresist pattern as an etching mask. In some example embodiments, the exposure process and the developing process may be performed by an ArF lithography process using ArF laser equipment.

The third conductive structure 430 may include a fourth metal pattern 420 and a fourth barrier pattern 410 that covers a lower surface of the fourth metal pattern 420, and the fourth conductive structure 435 may include a fifth metal pattern and a fifth barrier pattern that covers a lower surface of the fifth metal pattern.

A portion of the second metal layer may remain in the third opening 370 and may be referred to as a sixth metal pattern 390. A portion of the second barrier layer covering a sidewall and a lower surface of the portion of the second metal layer may be referred to as a sixth barrier pattern 380. The sixth metal pattern 390 and the sixth barrier pattern 380 may form a third contact plug 400. The third contact plug 400 and the third conductive structure 430 may be sequentially stacked in the vertical direction on the third impurity layer 106, and may contact each other. The third contact plug 400 may have a fifth width w5 in the first direction D1, which may be equal to or similar to the first width w1 of the first contact plug 310.

A portion of the second metal layer remaining in the fourth opening 375 and a portion of the second barrier layer covering a sidewall and a lower surface of the portion of the second metal layer may be referred to as a seventh metal pattern and a seventh barrier pattern 380, respectively, which may form a fourth contact plug 405. The fourth contact plug 405 and the third conductive structure 430 may be sequentially stacked in the vertical direction on the second conductive pattern 160 included in the gate structure 180, and may contact each other.

In some example embodiments, the third conductive structure 430 may extend in the second direction D2 between neighboring or adjacent ones of the second conductive structures 340 in the first direction D1, and may contact an upper surface of the third contact plug 400. In some example embodiments, as seen in FIGS. 10 and 11, the third conductive structure 430 extends in the second direction D2, and may contact the upper surfaces of multiple third contact plugs 400 on different active regions 105, e.g., two different active regions 105 included in the first and second active region rows. The inventive concepts are not limited thereto. For example, two third conductive structures 430, each of which may extend in the second direction D2 may be spaced apart from each other in the second direction D2, and may contact respectively two third contact plugs 400 on the active regions 105 included in the first and second active region rows.

The fourth conductive structure 435 may extend in the second direction D2 between neighboring or adjacent ones of the second conductive structures 340 in the first direction D1, and may contact an upper surface of the fourth contact plug 405. In some example embodiments, as seen in FIGS.

10 and 11, a length in the second direction D2 of the fourth conductive structure 435 may be less than a length in the second direction D2 of the third conductive structure 430, however, the inventive concepts are not limited thereto.

In some example embodiments, third and fourth widths w3 and w4 in the first direction D1 of the third and fourth conductive structures 430 and 435, respectively, may be less than a distance between the second conductive structures 340 adjacent to the third and fourth conductive structures 430 and 435, respectively. The third and fourth widths w3 and w4 may be greater than the second width w2 of each of the second conductive structures 340. The third and fourth widths w3 and w4 may be equal to or may be different from each other. In some example embodiments, as seen in FIG. 10, the third width w3 of the third conductive structure 430 is less than the second and third distances d2 and d3 between the second conductive structures 340, and the fourth width w4 is less than the third distance d3 between the second conductive structures 340.

However, the inventive concepts are not limited thereto, and the third and fourth widths w3 and w4 in the first direction D1 of the third and fourth conductive structures 430 and 435, respectively, may be greater than a distance between the second conductive structures 340 adjacent to the third and fourth conductive structures 430 and 435, respectively, because the third and fourth conductive structures 430 and 435 may be formed not at the same level (e.g., at different levels) as that of the second conductive structures 340. For example, the third and fourth conductive structures 430 and 435 may be formed at a level higher than that of the second conductive structures 340. Thus, the third and fourth conductive structures 430 and 435 may have various areas and layouts without limitation by the layout of the second conductive structures 340 or without being bounded by the layout of the second conductive structures 340. For example, each of the third and fourth conductive structures 430 and 435 may partially overlap the second conductive structures 340 in the vertical direction.

Figure 12:
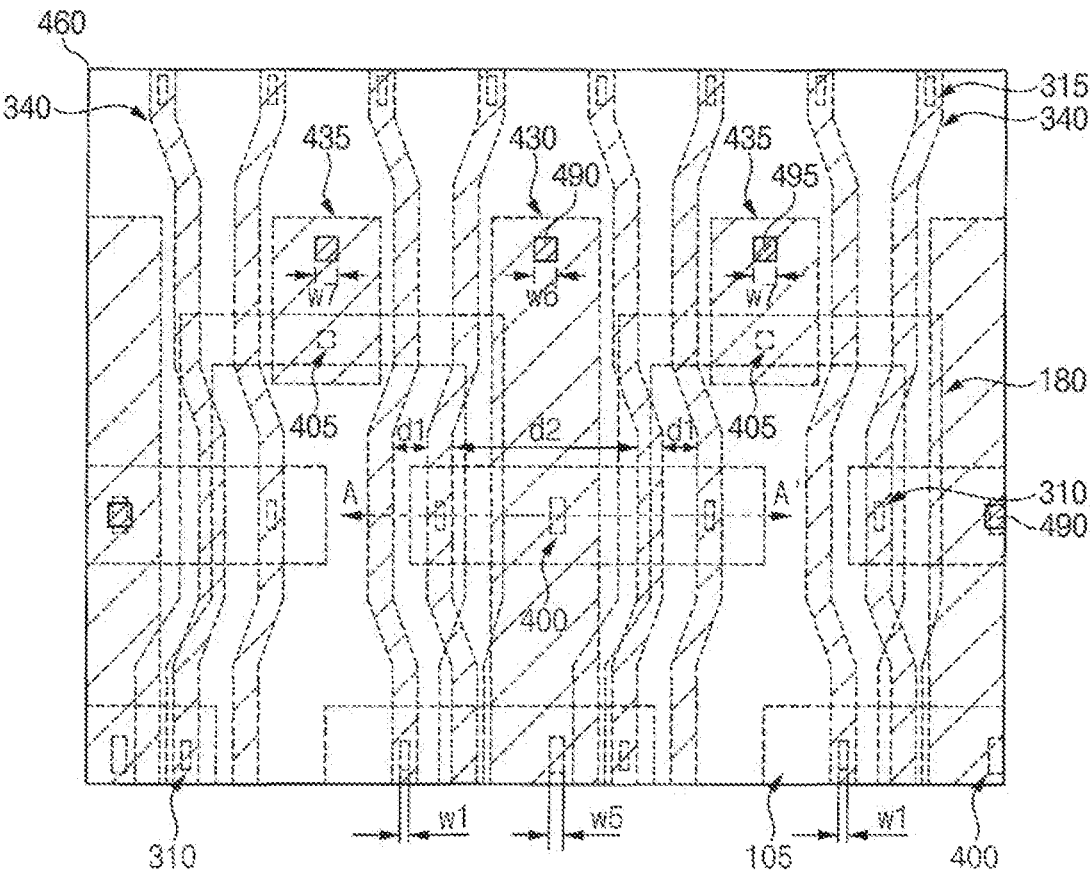
Figure 12:
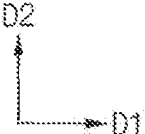
Figure 13:

Referring to FIGS. 12 and 13, a fourth insulating interlayer 440 may be formed on the third insulating interlayer 360 and may cover the third and fourth conductive structures 430 and 435. The fourth insulating interlayer 440 may be planarized until upper surfaces of the third and fourth conductive structures 430 and 435 are exposed, and thus sidewalls of the third and fourth conductive structures 430 and 435 may be covered by the fourth insulating interlayer 440.

A second etch stop layer 450 and a fifth insulating interlayer 460 may be sequentially stacked on the third and fourth conductive structures 430 and 435 and the fourth insulating interlayer 440. Fifth and sixth openings may be formed through the second etch stop layer 450 and the fifth insulating interlayer 460 to expose the upper surfaces of the third and fourth conductive structures 430 and 435, respectively, and fifth and sixth contact plugs 490 and 495 may fill the fifth and sixth openings, respectively.

The fourth insulating interlayer 440 may include a nitride, e.g., silicon nitride. The second etch stop layer 450 may include, e.g., silicon carbonitride, silicon oxynitride, or the like, and the fifth insulating interlayer 460 may include an oxide, e.g., silicon oxide, however, the inventive concepts are not limited thereto.

The fifth contact plug 490 may include an eighth metal pattern 480 and an eighth barrier pattern 470 covering a sidewall and a lower surface of the eighth metal pattern 480, and the sixth contact plug 495 may include a ninth metal pattern and a ninth barrier pattern that covers a sidewall and a lower surface of the ninth metal pattern.

In some example embodiments, as shown in FIGS. 12 and 13, some of the fifth contact plugs 490 on the third conductive structures 430 may overlap the third contact plugs 400 in the vertical direction, and other ones of the fifth contact plugs 490 on the third conductive structures 430 do not overlap the third contact plug 400 in the vertical direction, however, the inventive concepts are not limited thereto. In some example embodiments, as shown in FIGS. 12 and 13, the sixth contact plugs 495 on the fourth conductive structures 435 overlap the fourth contact plugs 405 in the vertical direction, however, the inventive concepts are not limited thereto. That is, the fifth and sixth contact plugs 490 and 495 may be formed at desired positions without limitation or without being bound by the third and fourth contact plugs 400 and 405 thereunder.

In some example embodiments, the fifth and sixth contact plugs 490 and 495 may have sixth and seventh widths w6 and w7, respectively, in the first direction D1, which may be greater than the first and fifth widths w1 and w5 of the first and third contact plugs 310 and 400, respectively. The third and fourth conductive structures 430 and 435 under the fifth and sixth contact plugs 490 and 495, respectively, may have the relatively large third and fourth widths w3 and w4, and thus, even if misalignment may occur during formation of the fifth and sixth contact plugs 490 and 495, the fifth and sixth contact plugs 490 and 495 may nevertheless be able to contact the third and fourth conductive structures 430 and 435. The sixth and seventh widths w6 and w7 may be the same as or different from each other.

By the above processes, the semiconductor device may be manufactured.

As illustrated above, the third and fourth conductive structures 430 and 435 may contact the third and fourth contact plugs 400 and 405 on the third impurity layer 106 and the gate structure 180, respectively. The third and fourth contact plugs 400 and 405 may be formed at a different level from, (e.g., at a higher level) than that of the second conductive structure 340 that contacts the first contact plug 310 on the first and second impurity layers 102 and 104. Thus, when the third and fourth conductive structures 430 and 435 are formed together with the second conductive structure 340 having a minute size by an EUV lithography process, the failure that some of the second to fourth conductive structures 340, 430 and 435 are not patterned to have undesired shapes may be prevented.

When compared to the case in which the third and fourth conductive structures 430 and 435 are formed between the second conductive structures 340, the third and fourth conductive structures 430 and 435 may have a relatively large area regardless of the distance between the second conductive structures 340 or the layout of the second conductive structures 340. Thus, the fifth and sixth contact plugs 490 and 495 on the third and fourth conductive structures 430 and 435 may have relatively large widths, and even if misalignment occurs during the formation of the fifth and sixth contact plugs 490 and 495, the fifth and sixth contact plugs 490 and 495 may contact with the third and fourth conductive structures 430 and 435.

The semiconductor device manufactured by the above processes may have some of the following structural characteristics.

The semiconductor device may include the gate structure 180 on the substrate 100, and may include the first and third impurity layers 102 and 106 (hereinafter, referred to as first and second source/drain layers 102 and 106, respectively) at upper portions of the substrate 100 (or, more particularly, the active region 105 adjacent to opposite sidewalls of the gate structure 180 in the first direction D1). The first and third contact plugs 310 and 400 may extend in the vertical direction on the first and second source/drain layers 102 and 106, respectively, and the second and third conductive structures 340 and 430 may contact the upper surfaces of the first and third contact plugs 310 and 400, respectively. The fifth contact plug 490 may contact the upper surface of the third conductive structure 430. A height of the third conductive structure 430 may be higher than a height of the second conductive structure 340, and the third width w3 in the first direction D1 of the third conductive structure 430 may be greater than the second width w2 in the first direction D1 of the second conductive structure 340.

In some example embodiments, the sixth width w6 in the first direction D1 of the fifth contact plug 490 may be greater than the first and fifth widths w1 and w5 in the first direction D1 of the first and third contact plugs 310 and 400, respectively.

In some example embodiments, the second and third widths w2 and w3 in the first direction D1 of the second and third conductive structures 340 and 430, respectively, may be greater than the first and fifth widths w1 and w5 in the first direction D1 of the first and third contact plugs 310 and 400, respectively.

In some example embodiments, the first and fifth widths w1 and w5 in the first direction D1 of the first and third contact plugs 310 and 400, respectively, may have a constant value or may increase at a constant ratio in the vertical direction.

In some example embodiments, each of the second and third conductive structures 340 and 430 may extend in the second direction D2, and the semiconductor device may further include the second contact plug 315 that contacts a lower surface of the end portion in the first direction D1 of the second conductive structure 340 and that extends in the vertical direction. The first conductive structure 120 may contact a lower surface of the second contact plug 315.

In some example embodiments, the third conductive structure 430 might not overlap the second conductive structure 340 or may partially overlap the second conductive structure 340 in the vertical direction. In other words, the second conductive structure 340 may be free of overlap (either partially or completely) with the third conductive structure 430 in the vertical direction.

In some example embodiments, the second conductive structure 340 may might not be formed in a straight line but may be partially bent along the second direction D2, while the third conductive structure 430 may be formed in a straight line along the second direction D2. The third width w3 in the first direction D1 of the third conductive structure 430 may be constant in the second direction D2.

In some example embodiments, a plurality of gate structures 180 may be spaced apart from each other in the first direction D1, and the above-mentioned gate structure 180 may be referred to as a first gate structure. Another gate structure 180 adjacent to the first gate structure in the first direction D1 may be referred to as a second gate structure. The first and second gate structures may share the second source/drain layer 106, and the second impurity layer 104 (hereinafter, referred to as a third source/drain layer 104) may be formed at an upper portion of the active region 105 that is opposite the second source/drain layer 106 with the second gate structure as a reference.

In some example embodiments, the semiconductor device may further include the first contact plug 310 that extends in the vertical direction on the third source/drain layer 104, and the semiconductor device may include the second conductive structure 340 that contacts the upper surface of the first contact plug 310 and that extends in the second direction D2. The semiconductor device may further include another second conductive structure 340 between the above-mentioned two second conductive structures 340 (when viewed in a plan view), and the third conductive structure 430 may be formed between the second conductive structure 340 electrically connected to the first source/drain layer 102 and the second conductive structure 340 electrically connected to the third source/drain layer 104. The two second conductive structures 340 might not be formed in a straight line in the second direction D2 but partially bent, and may be symmetrical with each other with the third conductive structure 430 as a reference.

In some example embodiments, each of the gate structures 180 may include a first extension portion that extends in the second direction D2 and a second extension portion that extends in the first direction from the first extension portion.

In some example embodiments, the semiconductor device may further include the fourth contact plug 405 that contacts the second extension portion of the gate structure 180 and that contacts in the vertical direction. The semiconductor device may further include the fourth conductive structure 435 that contacts the upper surface of the fourth contact plug 405 and that extends in the second direction D2.

In some example embodiments, the fourth conductive structure 435 may be formed at the same height as the third conductive structure 430, and may have the same width as the third conductive structure 430.

In some example embodiments, the fourth conductive structure 435 might not overlap, or may only partially overlap the second conductive structures 340 in the vertical direction. In other words, the second conductive structures 340 may be free from overlap (either partially or completely) by the fourth conductive structure 435 in the vertical direction.

In some example embodiments, the fifth contact plug 490 may or may not overlap the third contact plug 400 in the vertical direction. In other words, the third contact plug 400 may be free from overlap (either partially or completely) by the fifth contact plug 490 in the vertical direction.

FIGS. 14 to 23 are plan views and cross-sectional views illustrating a method of manufacturing a semiconductor device according to example embodiments. Particularly, FIGS. 14, 16, 18, 20 and 22 are the plan views, and FIGS. 15, 17, 19, 21 and 23 are the cross-sectional views, which care taken along lines A-A' of the corresponding plan views. This method may include processes substantially the same as or similar to those illustrated with reference to FIGS. 1 to 13, and thus repeated explanations thereon are omitted herein.

Figure 14:
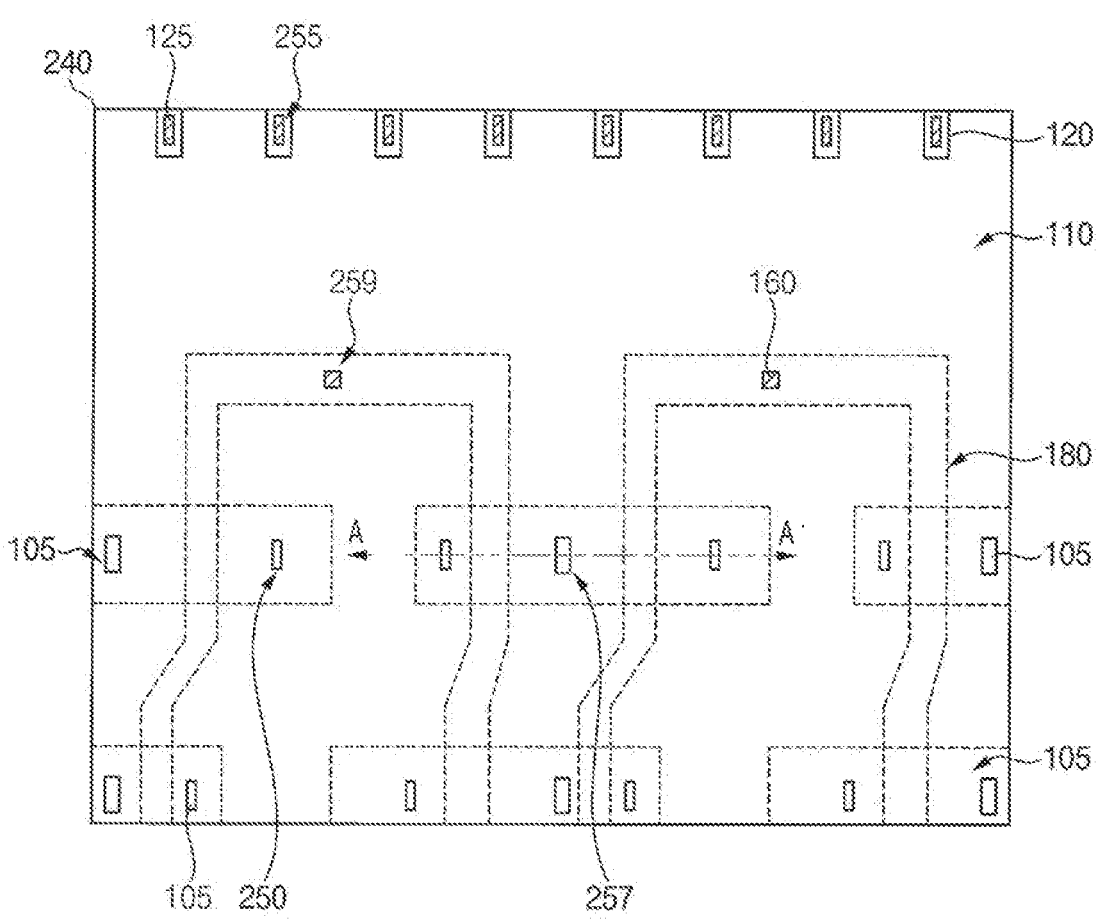
FIGS. 14 to 23 are plan views and cross-sectional views illustrating a method of manufacturing a semiconductor device according to some example embodiments.
Figure 14:
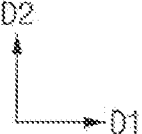
Figure 15:
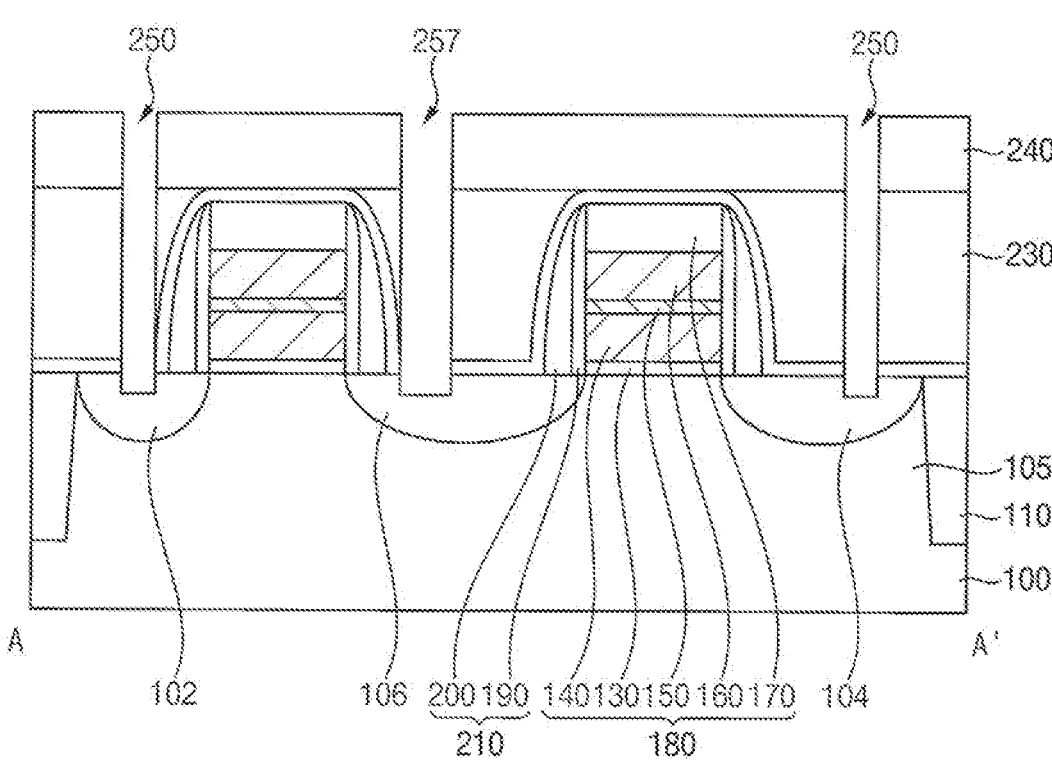
Figure 15:
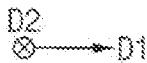

Referring to FIGS. 14 and 15, processes that are substantially the same as or similar to those illustrated with reference to FIGS. 1 to 4 may be performed.

However, when the first and second openings 250 and 255 are formed, a seventh opening 257 may be formed that extends through the first insulating interlayer 230, the capping layer 240 and the first etch stop layer 220 to expose an upper surface of the active region 105, that is, the upper surface of the third impurity layer 106. An eighth opening 259 may be formed that exposes the upper surface of the second conductive pattern 160 included in the gate structure 180.

Figure 16:
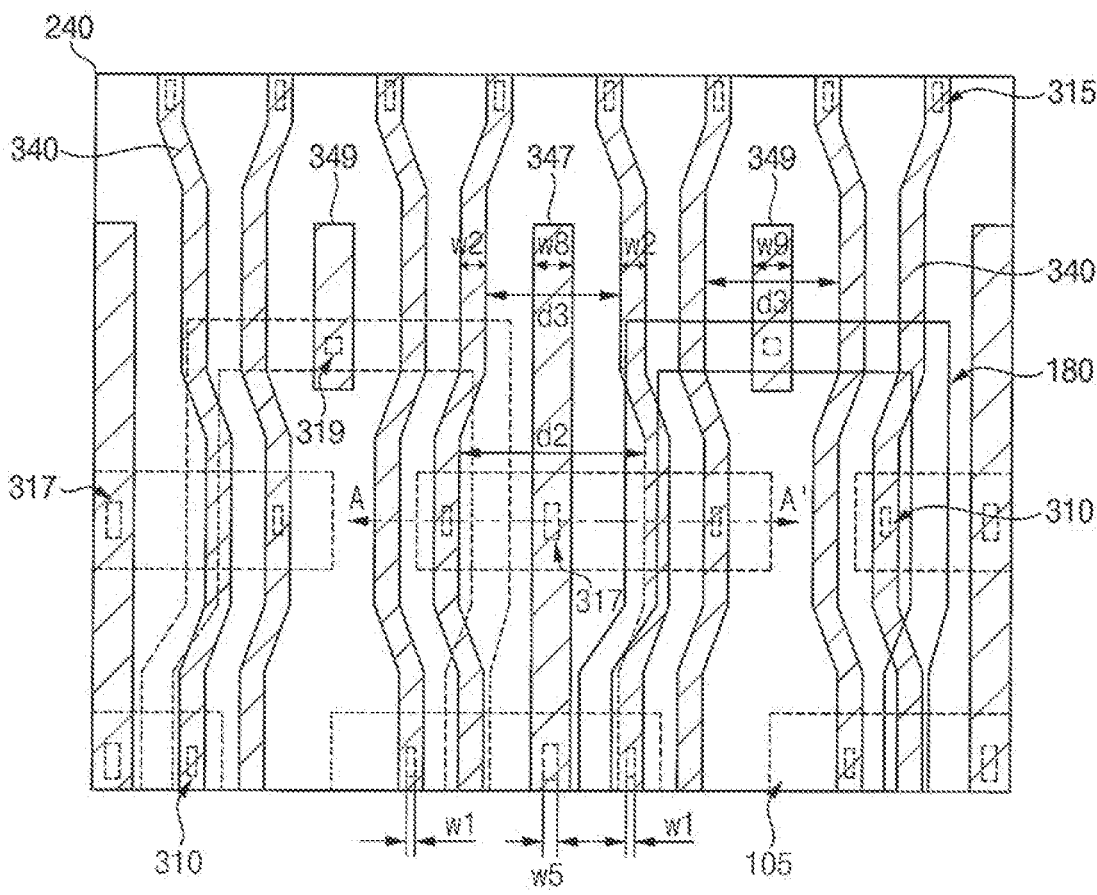
Figure 16:
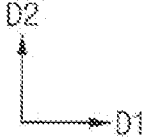
Figure 17:
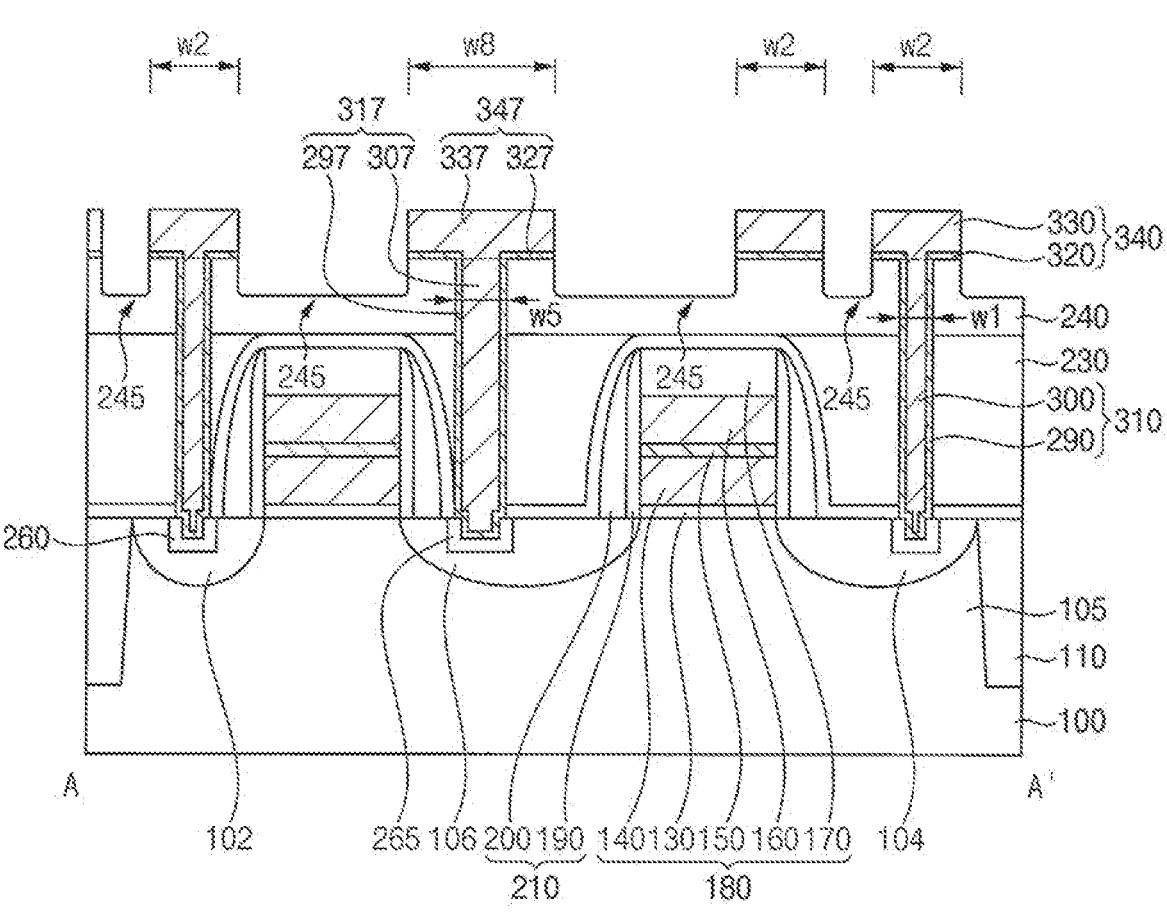
Figure 17:
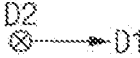

Referring to FIGS. 16 and 17, processes that are substantially the same as or similar to those illustrated with reference to FIGS. 5 to 7 may be performed.

However, when the second conductive structure 340 is formed on the capping layer 240, fifth and sixth conductive structures 347 and 349 may also be formed at the same height as the second conductive structure 340, and seventh and eighth contact plugs 317 and 319 may be formed under the fifth and sixth conductive structures 347 and 349, respectively. Additionally, a second metal silicide pattern 265 may be formed on an upper surface of the active region 105 exposed by the seventh opening 257, that is, on the upper surface of the third impurity layer 106.

Particularly, the seventh contact plug 317 may be formed in the seventh opening 257. The seventh contact plug 317 may include a twelfth metal pattern 307 and a twelfth barrier pattern 297 that covers a sidewall and a lower surface of the twelfth metal pattern 307. The seventh contact plug 317 may contact the upper surface of the third impurity layer 106. The eighth contact plug 319 may be formed in the eighth opening 259. The eighth contact plug 319 may include a thirteenth metal pattern 309 and a thirteenth barrier pattern 299 that covers a sidewall and a lower surface of the thirteenth metal pattern 309. The eighth contact plug 319 may contact the upper surface of the second conductive pattern 160 included in the gate structure 180.

The fifth conductive structure 347 may contact an upper surface of the seventh contact plug 317. The fifth conductive structure 347 may include a tenth metal pattern 337 and a tenth barrier pattern 327 that covers a lower surface of the tenth metal pattern 337. The sixth conductive structure 349 that contacts an upper surface of the eighth contact plug 319 may include an eleventh metal pattern and an eleventh barrier pattern covering a lower surface of the electrode metal pattern.

The seventh contact plug 317 may have the fifth width w5 in the first direction D1, which may be similar to the first width w1 of the first contact plug 310.

In some example embodiments, the fifth conductive structure 347 may extend in the first direction D1 between neighboring or adjacent ones of the second conductive structures 340 in the first direction D1, and may contact an upper surface of the seventh contact plug 317. In some example embodiments, as seen in FIGS. 16 and 17, the third conductive structure 430 may extend in the second direction D2, and may contact the upper surfaces of multiple seventh contact plugs 317 on the active regions 105 included in the first and second active rows, respectively. However, the inventive concepts are not limited thereto. For example, two fifth conductive structures 347, each of which may extend in the second direction D2, may be spaced apart from each other in the second direction D2, and may contact respective seventh contact plugs 317 on the active regions 105 included in the first and second active rows.

The sixth conductive structure 349 may extend in the second direction D2 between neighboring ones of the second conductive structures 340 in the first direction D1, and may contact an upper surface of the eighth contact plug 319. In some example embodiments, as seen in FIGS. 16 and 17, an extension length in the second direction D2 of the sixth conductive structure 349 may be less than an extension length in the second direction D2 of the fifth conductive structure 347, however, the inventive concepts are not limited thereto.

In some example embodiments, eighth and ninth widths w8 and w9 in the first direction D1 of the fifth and sixth conductive structures 347 and 349, respectively, may be less than a distance between the second conductive structures 340 adjacent thereto, and may be similar or equal to the second width w2 of each of the second conductive structures 340. The eighth and ninth widths w8 and w9 may be equal to or different from each other. In some example embodiments, as seen in FIGS. 16 and 17, the eighth width w8 of the fifth conductive structure 347 may be less than the second and third distances d2 and 3 between the second conductive structures 340, and the ninth width w9 of the sixth conductive structure 349 may be less than the third distance d3 between the second conductive structures 340.

That is, the fifth and sixth conductive structures 347 and 349 may be formed at the same level as the second conductive structures 340, and thus the area and the layout of the fifth and sixth conductive structures 347 and 349 may be limited or bounded by the layout of the second conductive structures 340.

Figure 18:
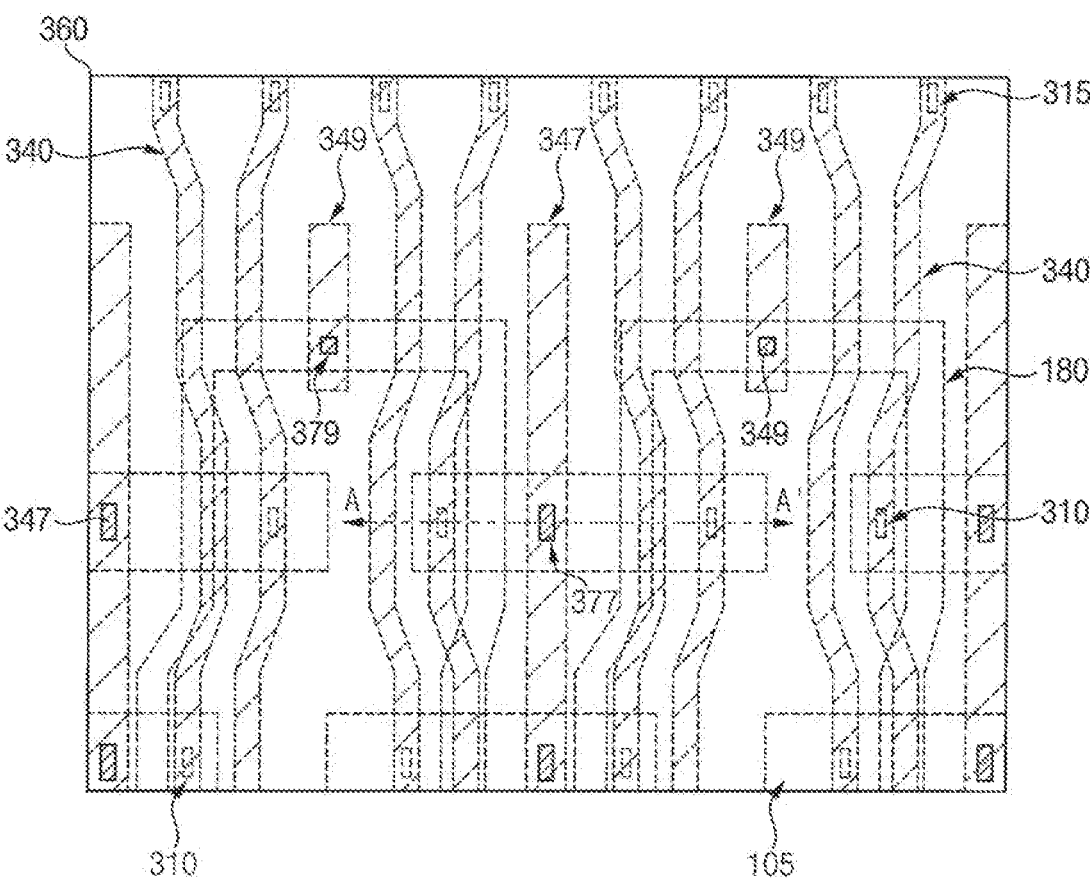
Figure 18:
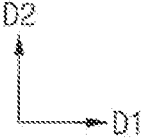
Figure 19:
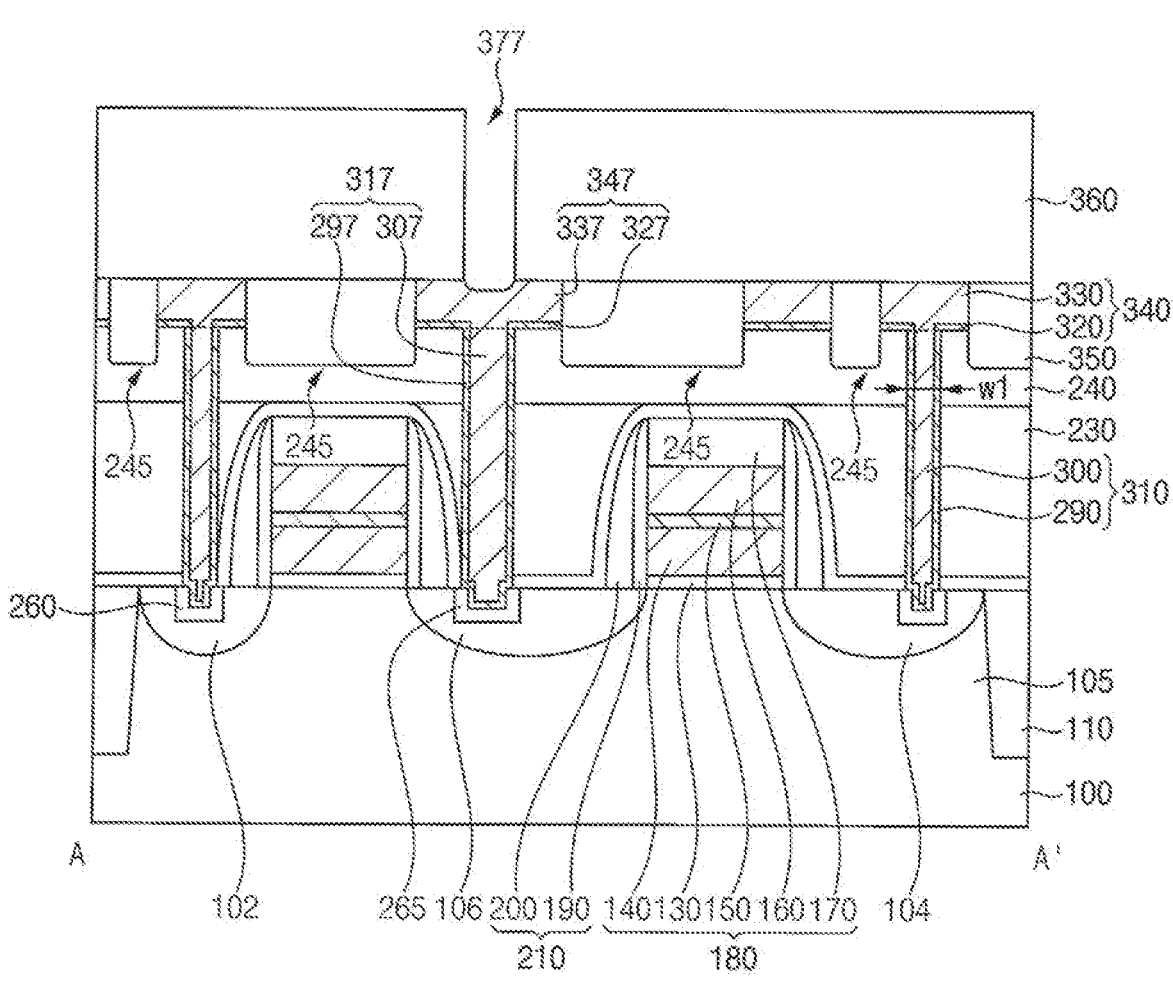
Figure 19:
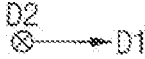

Referring to FIGS. 18 and 19, processes that are substantially the same as or similar to those illustrated with reference to FIGS. 8 and 9 may be performed.

However, instead of the third and fourth openings 370 and 375, ninth and tenth openings 377 and 379 may be formed that extend through the third insulating interlayer 360 to expose upper surfaces of the fifth and sixth conductive structures 347 and 349, respectively.

Figure 20:
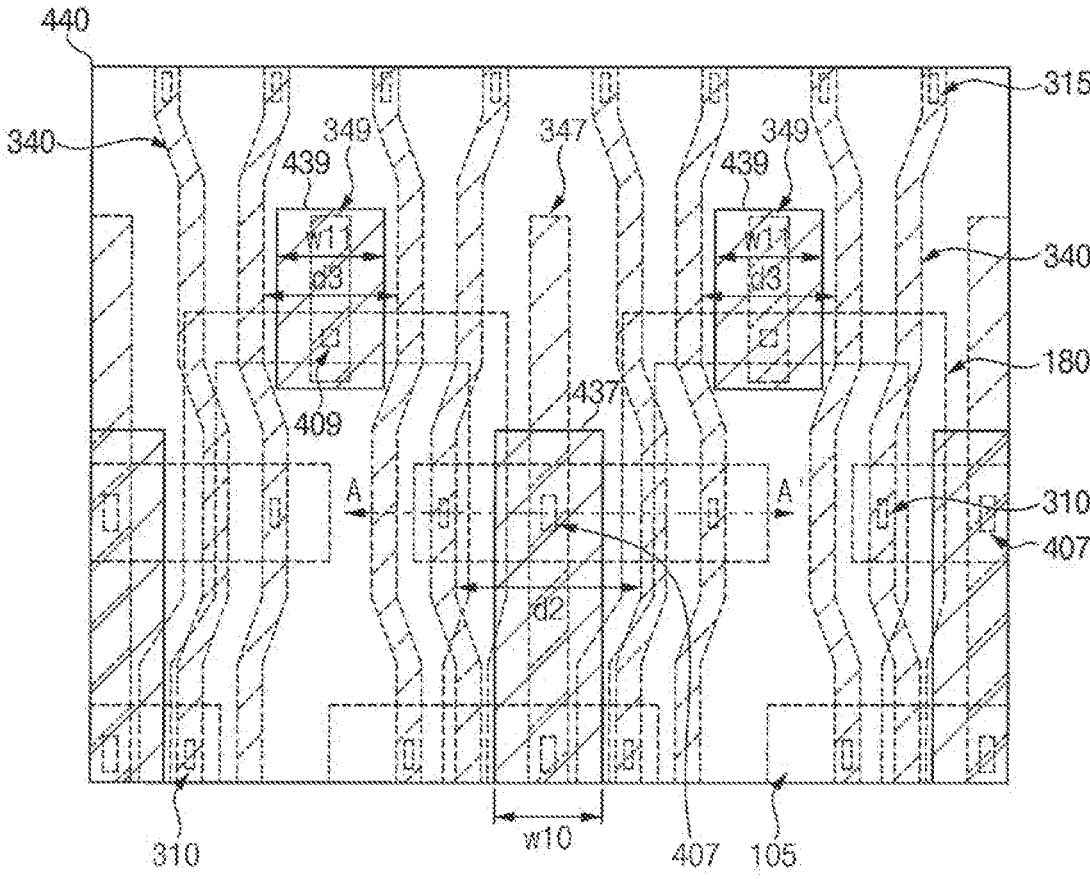
Figure 20:
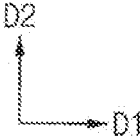
Figure 21:
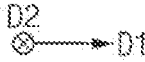

Referring to FIGS. 20 and 21, processes that are substantially the same as or similar to those illustrated with reference to FIGS. 10 and 11 may be performed.

However, a ninth contact plug 407 may be formed in the ninth opening 377. The ninth contact plug 407 may include a sixteenth metal pattern 397 and a sixteenth barrier pattern 387 that covers a sidewall and a lower surface of the sixteenth metal pattern 397. The ninth contact plug 407 may contact the upper surface of the fifth conductive structure 347. A tenth contact plug 409 may be formed in the tenth opening 379. The tenth contact plug 409 may include a seventeenth metal pattern and a seventeenth barrier pattern that covers a sidewall and a lower surface of the sixteenth metal pattern. The tenth contact plug 409 may contact the upper surface of the sixth conductive structure 349.

Additionally, a seventh conductive structure 437 may be formed on and may contact an upper surface of the ninth contact plug 407, and may include a fourteenth metal pattern 427 and a fourteenth barrier pattern 417 that covers a lower surface of the fourteenth metal pattern 427. An eighth conductive structure 439 may be formed on and may contact an upper surface of the tenth contact plug 409, and may include a fifteenth metal pattern and a fifteenth barrier pattern covering a lower surface of the fifteenth metal pattern.

In some example embodiments, tenth and eleventh widths w10 and w11 in the first direction D1 of the seventh and eighth conductive structures 437 and 439 may be less than the distance between the second conductive structures 340 adjacent thereto, but may be greater than the second width w2 of each of the second conductive structures 340 and the eighth and ninth widths w8 and w9 of the fifth and sixth conductive structures 347 and 349, respectively. The tenth and eleventh widths w10 and w11 may be equal to or different from each other. In some embodiments, as seen in FIGS. 20 and 21, the tenth width w10 of the seventh conductive structure 437 is less than the second and third distances d2 and d3 between the second conductive structures 340, and the eleventh width w11 of the eighth conductive structure 439 is less than the third distance d3 between the second conductive structures 340.

However, the inventive concepts are not limited thereto, and the tenth and eleventh widths w10 and w11 in the first direction D1 of the seventh and eighth conductive structures 437 and 439 may be greater than the distance between the second conductive structures 340 adjacent thereto, because the seventh and eighth conductive structures 437 and 439 might not be formed at the same level as the second, fifth and sixth conductive structures 340, 347 and 349 but may be formed at a higher level. Accordingly, the seventh and eighth conductive structures 437 and 439 may have various areas and layouts regardless of the layouts of the second, fifth and sixth conductive structures 340, 347 and 349.

In some embodiments, as seen in FIGS. 20 and 21, the seventh and eighth conductive structures 437 and 439 may be formed on and overlapping the fifth and sixth conductive structures 347 and 349, respectively, and further may partially overlap the second conductive structures 340 in the vertical direction.

The seventh conductive structures 437 may have an extension length in the second direction D2 less than that of the third conductive structure 430 shown in FIG. 10. Particularly, the third conductive structure 430 shown in FIG. 10 may extend to an area where the second conductive structures 340 are spaced apart from each other by the third distance d3, and an end portion of the third conductive structure 430 may be aligned with end portions of the fourth conductive structures 435 in the first direction D1, while the seventh conductive structure 437 may extend to an area where the second conductive structures 340 are spaced apart from each other by the second distance d2, and an end portion of the seventh conductive structure 437 might not be aligned with the end portions of the fourth conductive structures 435 in the first direction D1.

Figure 22:
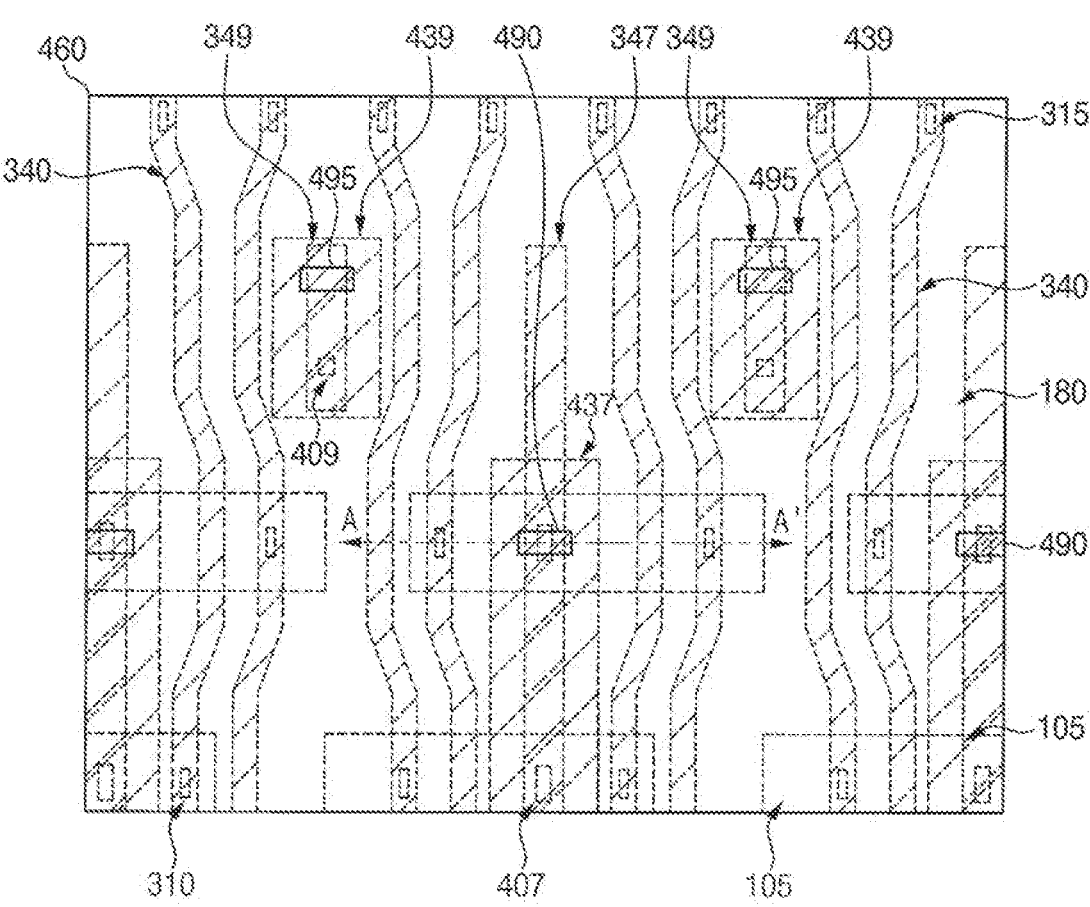
Figure 22:
Figure 23:
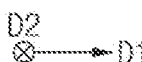

Referring to FIGS. 22 and 23, processes that are substantially the same as or similar to those illustrated with reference to FIGS. 12 and 13 may be performed to complete the fabrication of the semiconductor device.

In some embodiments, as seen in FIGS. 22 and 23, some or all of the fifth contact plugs 490 on the seventh conductive structure 437 may overlap the ninth contact plugs 407, respectively, in the vertical direction. However, the inventive concepts are not limited thereto.

As described above, for example, the fifth and sixth conductive structures 347 and 349, which may be formed at the same level as the second conductive structures 340 having minute or smaller sizes through an EUV lithography process, may have minute or smaller sizes, while the seventh and eighth conductive structures 437 and 439, which may be formed at a higher level, may have larger areas regardless of the layout of the fifth and sixth conductive structures 347 and 349. Thus, the fifth and sixth contact plugs 490 and 495, which may be formed on the seventh and eighth conductive structures 437 and 439, respectively, may have relatively large widths, and thus, even if misalignment occurs during the formation of the fifth and sixth contact plugs 490 and 495, the fifth and sixth contact plugs 490 and 495 may contact the seventh and eighth conductive structures 437 and 439, respectively, and may have good contact with the seventh and eighth conductive structures 437 and 439.

The semiconductor device manufactured by the above processes may have some of the following structural characteristics.

The semiconductor device may include the gate structure 180 on the substrate 100, and may include the first and third impurity layers 102 and 106 (hereinafter, first and second source/drain layers 102 and 106, respectively) on portions of the substrate 100, (or, stated differently on portions of the active region 105 at respective opposite sides of the gate structure 180 and serving as source/drain areas). The semiconductor device may include the first and seventh contact plugs 310 and 317 on the first and second source/drain layers 102 and 106, respectively, which may extend in the vertical direction, and the semiconductor device may include the second and fifth conductive structures 340 and 347, which may be on and may contact the upper surfaces of the first and seventh contact plugs 310 and 317, respectively, at the same level. The semiconductor device may include the ninth contact plug 407 that may contact the upper surface of the fifth conductive structure 347 and may extend in the vertical direction, the seventh conductive structure 437 that may contact the upper surface of the ninth contact plug 407, and the fifth contact plug 490 that may contact the upper surface of the seventh conductive structure 437. The tenth width w10 in the first direction D1 of the seventh conductive structure 437 may be greater than the width of the fifth conductive structure 347, and the sixth width w6 in the first direction D1 of the fifth contact plug 490 may be greater than the with in the first direction of the ninth contact plug 407.

In some example embodiments, the fifth contact plug 490 may overlap the ninth contact plug 407 in the vertical direction.

FIGS. 24 to 56 are plan views and cross-sectional views illustrating a method of manufacturing a semiconductor device according to example embodiments. Specifically, FIGS. 24, 27, 31, 35, 39, 42, 46, 50, 52 and 54 are the plan views, FIGS. 25, 29, 32, 34, 43, 44, 47, 51, 53 and 55 are cross-sectional views, which are taken along lines A-A' of a corresponding plan views, and each of FIGS. 26, 28, 30, 33, 36-38, 40-41, 45, 48-49 and 56 are cross-sectional views taken along lines B-B' and C-C' of a corresponding plan view.

Hereinafter, in the specification (but not necessarily in the claims), two directions substantially parallel to an upper surface of a substrate 500 and substantially perpendicular to each other may be referred to as first and second directions D1 and D2, and a direction substantially parallel to the upper surface of the substrate 500 and having an acute angle with each of the first and second directions D1 and D2 may be referred to as a third direction D3.

In some embodiments, aspects of the method of manufacturing the semiconductor device illustrated with reference to FIGS. 1 to 13 may be applied to a method of manufacturing a DRAM device, and more particularly, to peripheral circuit patterns on a peripheral circuit region of the DRAM device, and may include processes that are substantially the same as or similar to those illustrated with reference to FIGS. 1 to 13. Thus, repeated explanations on the same or similar processes are omitted herein. In some embodiments, aspects of manufacturing the semiconductor device illustrated with reference to FIGS. 14 to 23 may be also applied to a method of manufacturing a DRAM device.

Figure 24:
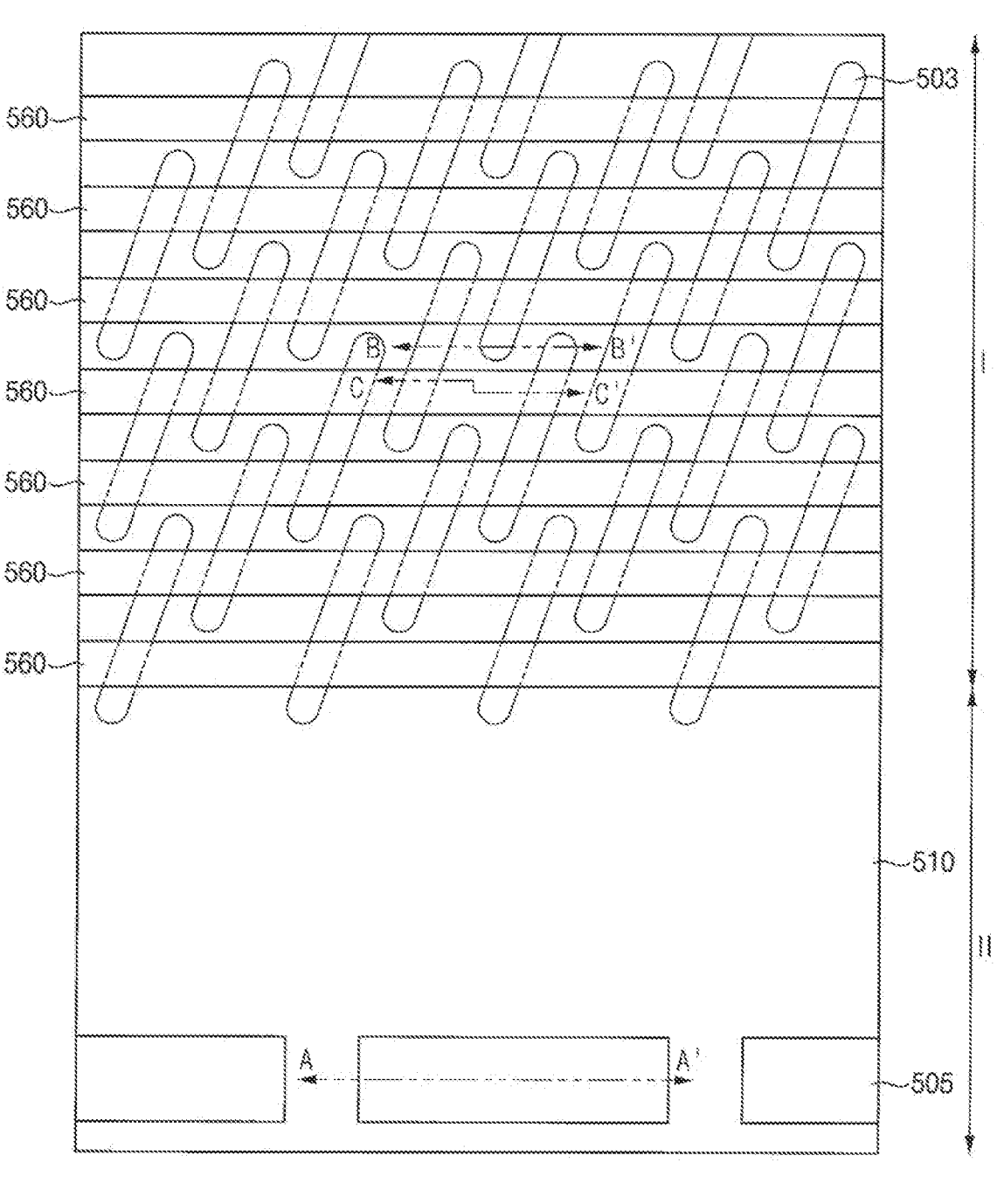
Figure 25:
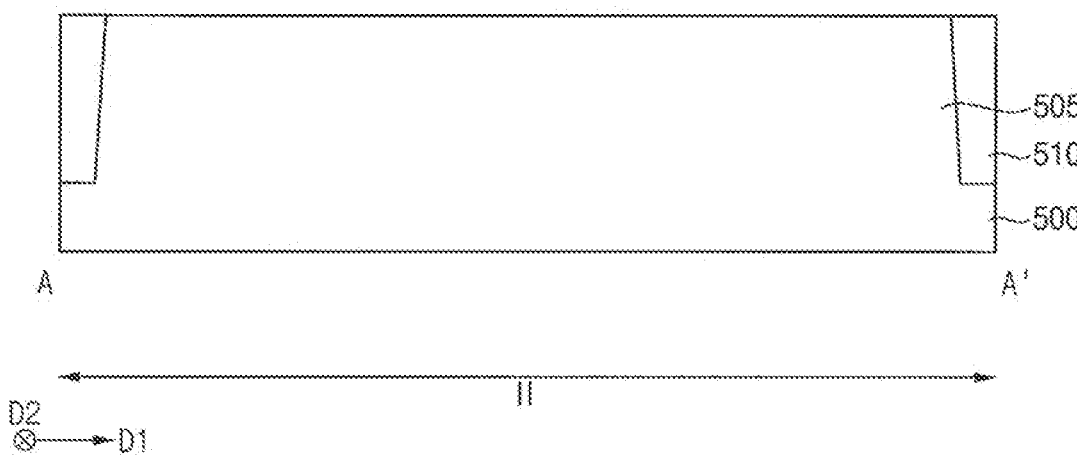
Figure 26:
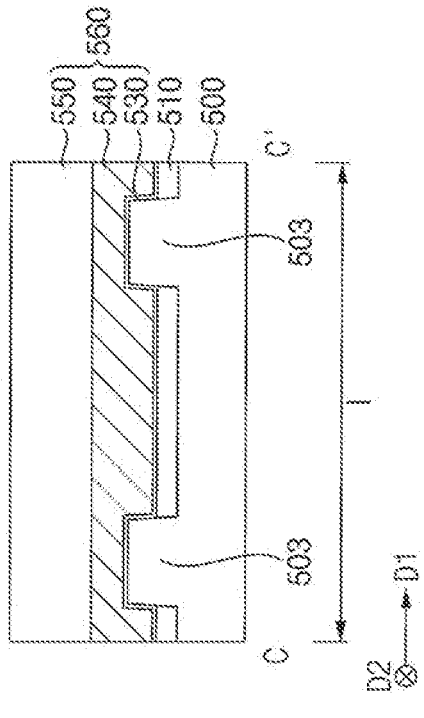
Figure 26:
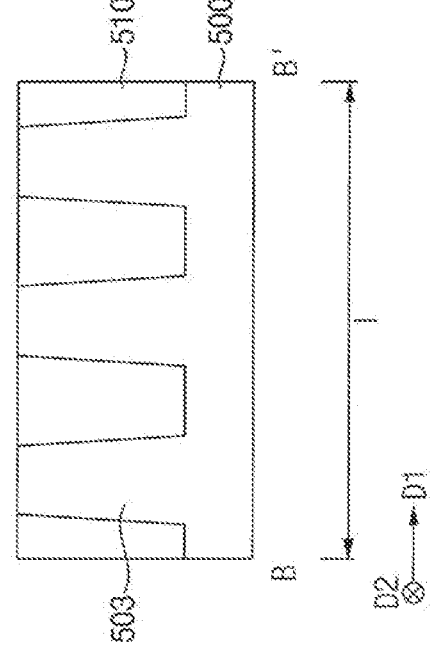

Referring to FIGS. 24 to 26, first and second active patterns 503 and 505 may be formed on the substrate 500 including first and second regions I and II, and an isolation pattern 510 may be formed to cover sidewalls of the first and second active patterns 503 and 505.

The first region I of the substrate 500 may be a cell region in which memory cells are formed, and the second region II of the substrate 500 may be a peripheral circuit region in which peripheral circuit patterns for driving the memory cells are formed. The second region II of the substrate 500 may surround the first region I of the substrate 500.

The first and second active patterns 503 and 505 may be formed by removing an upper portion of the substrate 500 to form a first recess. In some example embodiments, a plurality of first active patterns 503 each of which may extend in the third direction D3 may be formed to be spaced apart from each other in the first and second directions D1 and D2. The second active pattern 505 may correspond to the active region 105 illustrated with reference to FIGS. 1 and 2. In some example embodiments, a plurality of second active patterns 505 may be formed to be spaced apart from each other in the first direction D1 to form a second active pattern row, and a plurality of second active pattern rows may be formed to be spaced apart from each other in the second direction D2. Hereinafter, only the second active patterns 505 included in one second active pattern row will be shown.

The first active pattern 503 and the isolation pattern 510 on the first region I of the substrate 500 may be partially etched to form a second recess extending in the first direction D1.

A first gate structure 560 may be formed in the second recess. The first gate structure 560 may include a first gate insulation layer 530 on a bottom and a sidewall of the second recess, a first gate electrode 540 on the first gate insulation layer 530 that fills a lower portion of the second recess, and a first gate mask 550 on the first gate electrode 540 that fills an upper portion of the second recess. The first gate structure 560 may extend in the first direction D1 on the first region I of the substrate 500, and a plurality of first gate structures 560 may be spaced apart from each other in the second direction D2.

The first gate insulation layer 530 may include an oxide, e.g., silicon oxide. The first gate electrode 540 may include a metal, a metal nitride, a metal silicide, doped polysilicon, or the like, and the first gate mask 550 may include a nitride, e.g., silicon nitride.

Figure 27:
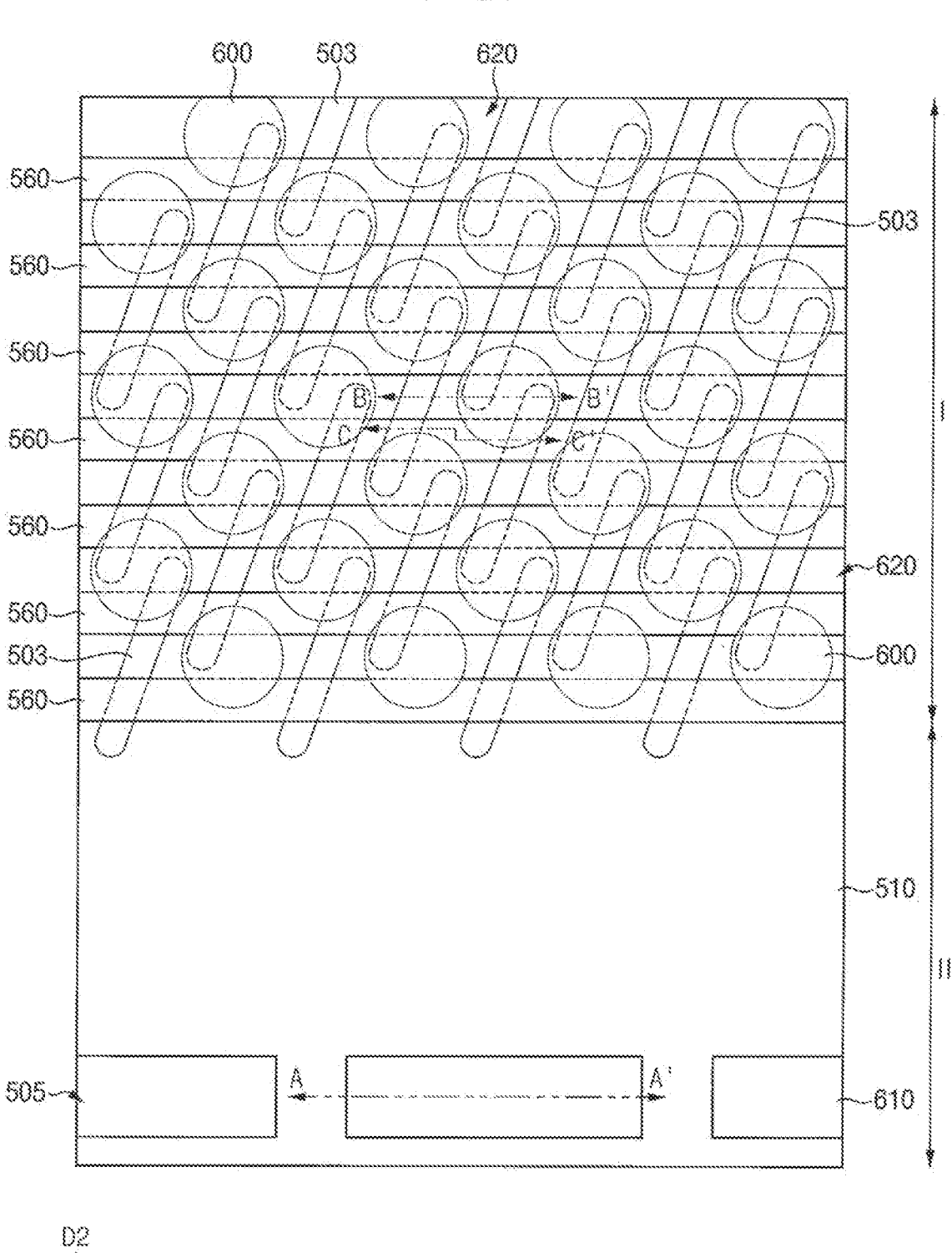
Figure 28:
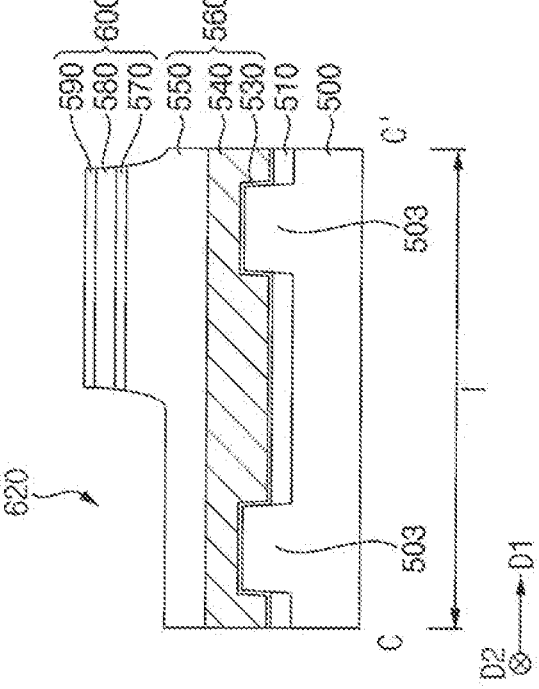
Figure 28:
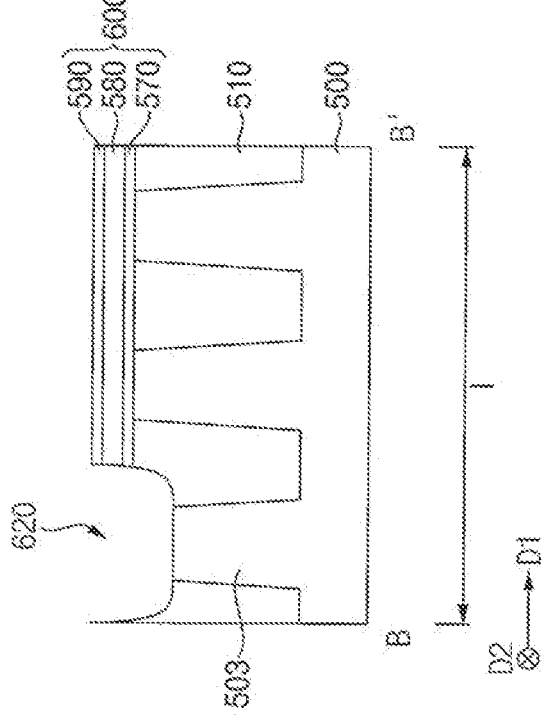

Referring to FIGS. 27 and 28, an insulation layer structure 600 may be formed on the first and second regions I and II of the substrate 500, and a portion of the insulation layer structure 600 on the second region II of the substrate 500 except for a portion of the second region II adjacent to the first region I may be removed. For example, a thermal oxidation process may be performed on the second active pattern 505 on the second region II of the substrate 500 to form a second gate insulation layer 610.

The insulation layer structure 600 may include first, second and third insulation layers 570, 580 and 590 sequentially stacked. The first and third insulation layers 570 and 590 may include an oxide, e.g., silicon oxide, and the second insulation layer 580 may include a nitride, e.g., silicon nitride.

The insulation layer structure 600 may be patterned, and the first active pattern 503, the isolation pattern 510 and the first gate mask 550 of the first gate structure 560 may be partially etched using the patterned insulation layer structure 600 as an etching mask to form an eleventh opening 620. In some example embodiments, the insulation layer structure 600 that remains after the etching process may have a shape of a circuit or ellipse in a plan view, and a plurality of insulation layer structures 600 may be spaced apart from each other in each of the first and second directions D1 and D2. Each of the insulation layer structures 600 may overlap in the vertical direction end portions in the third direction D3 of neighboring or adjacent ones of the first active patterns 503 facing each other.

Figure 29:
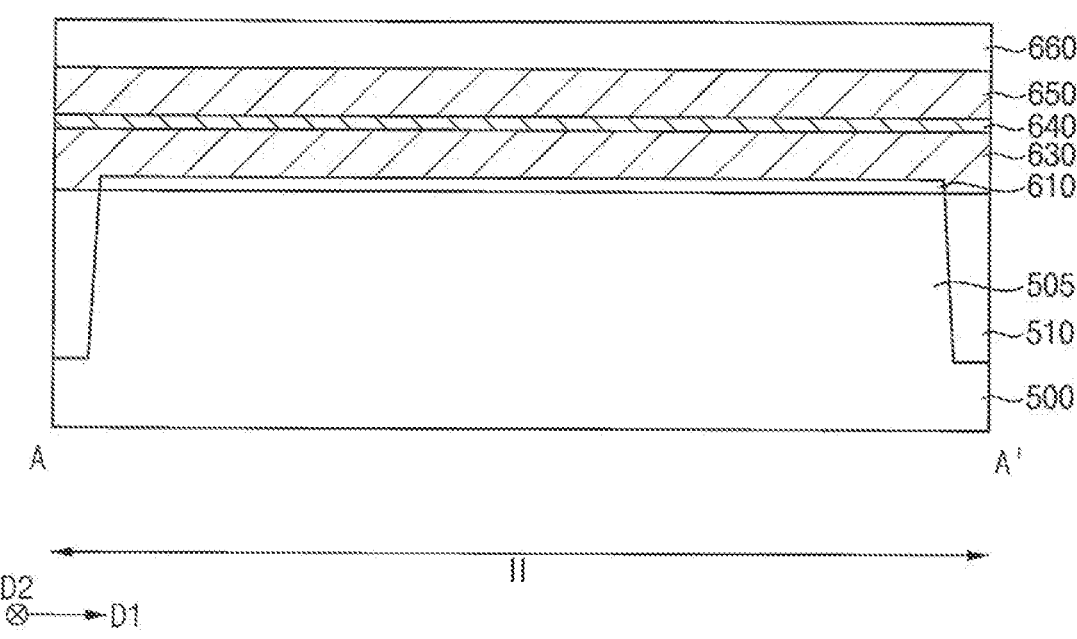
Figure 30:
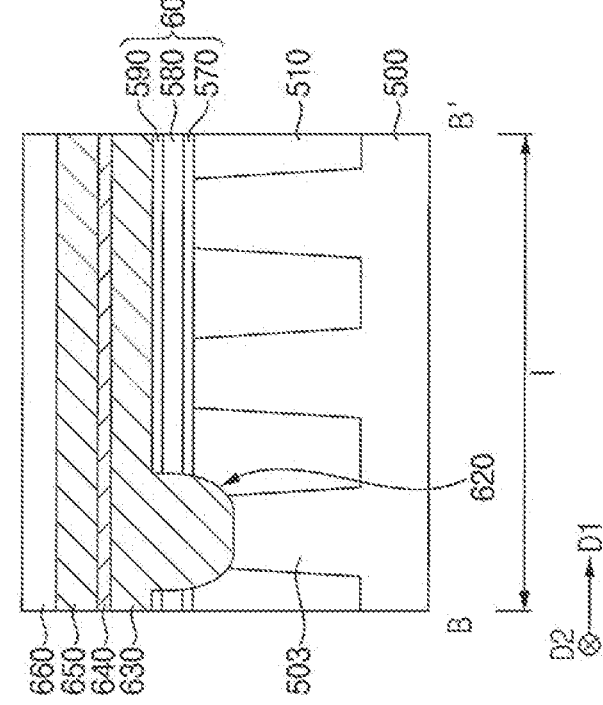

Referring to FIGS. 29 and 30, a first conductive layer 630, a diffusion barrier layer 640, a second conductive layer 650 and a first mask layer 660 may be sequentially formed on the insulation layer structure 600, the first active pattern 503, the isolation pattern 510 and an upper surface of the first gate structure 560 exposed by the eleventh opening 620 on the first region I of the substrate 500. The second gate insulation layer 610 and the isolation pattern 510 on the second region II of the substrate 500, and the first conductive layer 630 may fill the eleventh opening 620.

The first conductive layer 630 may include, e.g., polysilicon doped with impurities, the diffusion barrier layer 640 may include a metal silicon nitride, e.g., titanium silicon nitride, the second conductive layer 650 may include a metal, e.g., tungsten, and the first mask layer 660 may include a nitride, e.g., silicon nitride.

Figure 31:
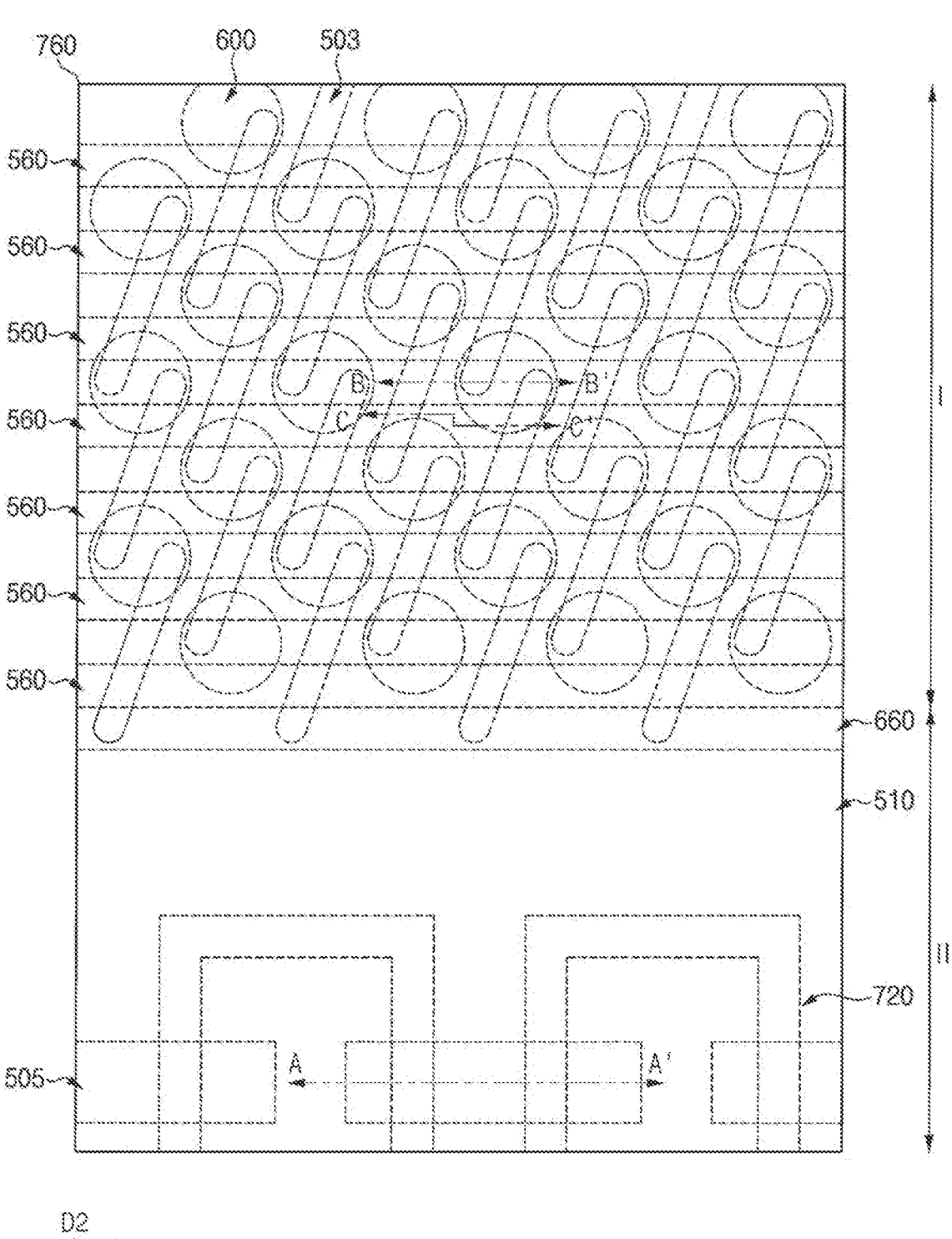
Figure 32:
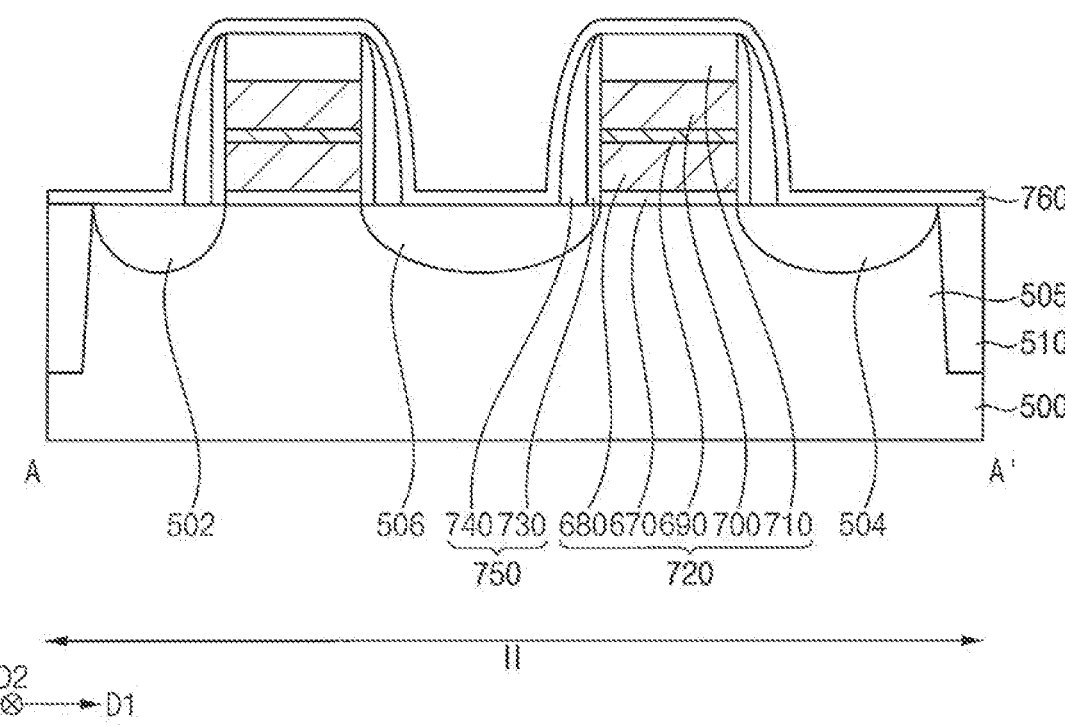
Figure 33:
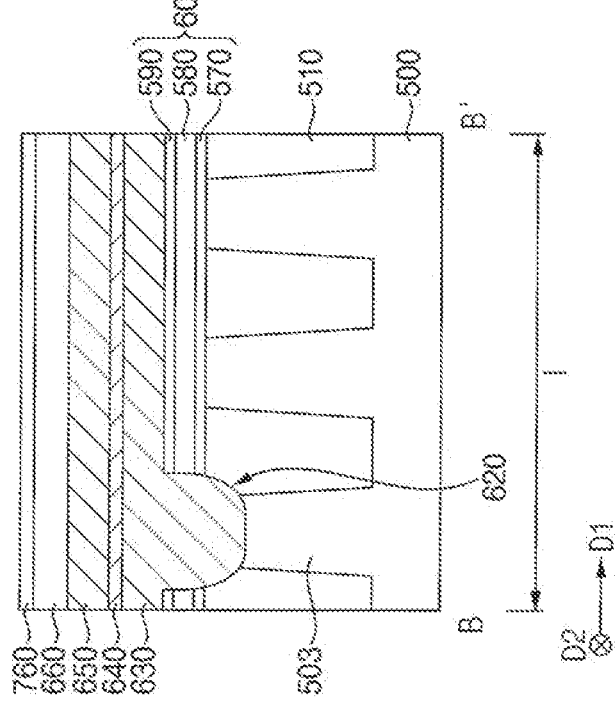

Referring to FIGS. 31 to 33, processes that are substantially the same as or similar to those illustrated with reference to FIGS. 1 and 2 may be performed to form a second gate structure 720 and a gate spacer structure 750 on the second region II of the substrate 500. The second gate structure 720 and the gate spacer structure 750 may correspond to the gate structure 180 and the gate spacer structure 210, respectively, of FIGS. 1 and 2.

Thus, the second gate structure 720 may include a second gate insulation pattern 670, a first conductive pattern 680, a first diffusion barrier 690, a second conductive pattern 700 and a second gate mask 710 that are sequentially stacked in the vertical direction, and the first conductive pattern 680, the first diffusion barrier 690 and the second conductive pattern 700 that are sequentially stacked may form a second gate electrode.

After forming the second gate structure 720, for example, an ion implantation process may be performed on an upper portion of the second active pattern 505 adjacent to the second gate structure 720 to form first, second and third impurity layers 502, 504 and 506. The third impurity layer 506 may be formed an upper portion of the second active pattern 505 between neighboring or adjacent ones of the second gate structures 720 in the first direction D1, and each of the first and second impurity layers 502 and 504 may be formed at an upper portion of the second active pattern 505 at an opposite side to the third impurity layer 506 with the second gate structure 720 as a reference.

The gate spacer structure 750 may include first and second gate spacers 730 and 740 that are sequentially stacked in a horizontal direction parallel to the upper surface of the substrate 500 from a sidewall of the second gate structure 720.

A first etch stop layer 760 may be formed on the first mask layer 660, the isolation pattern 510, the second active pattern 505, the second gate structure 720 and the gate spacer structure 750 on the first and second regions I and II of the substrate 500.

Figure 34:
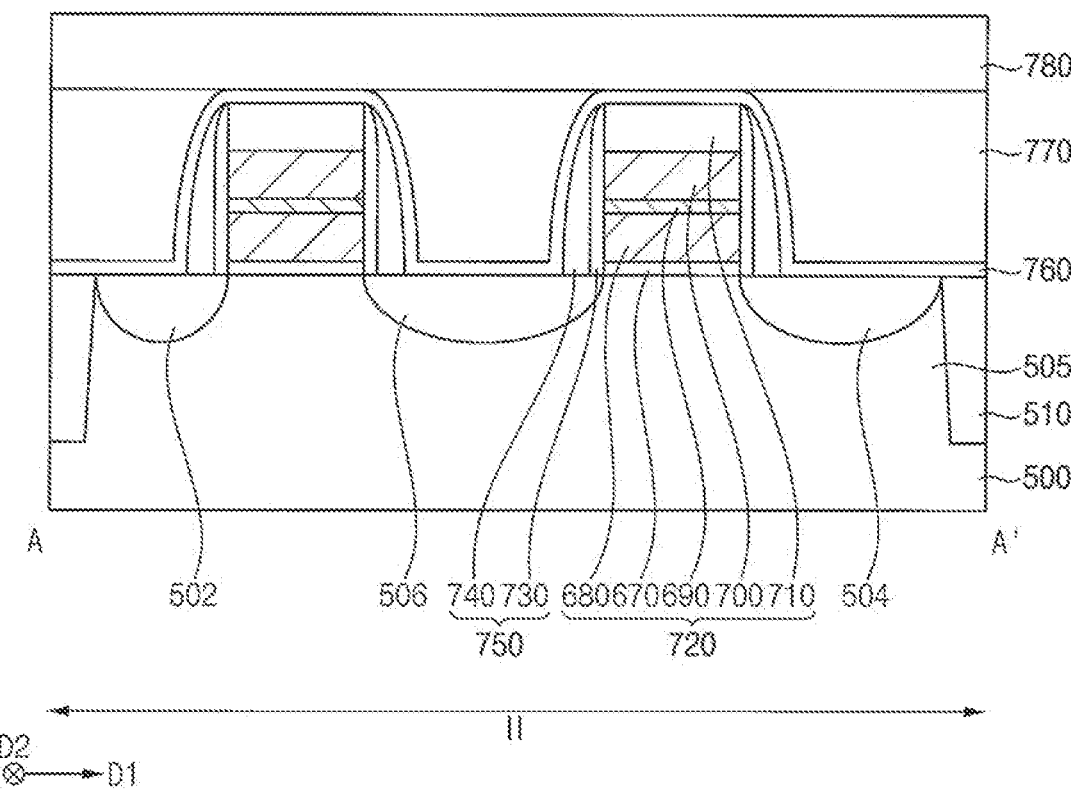

Referring to FIG. 34, a first insulating interlayer 770 may be formed on the first etch stop layer 760, and may be planarized until a portion of the first etch stop layer 760 on upper surfaces of the second gate structure 720 and the first mask layer 660 is exposed. A capping layer 780 may be formed on the first insulating interlayer 770 and the first etch stop layer 760.

Thus, the first insulating interlayer 770 may fill a space between the gate spacer structures 750 on the sidewalls of the second gate structures 720.

Figure 35:
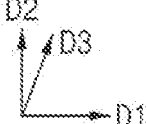
Figure 36:
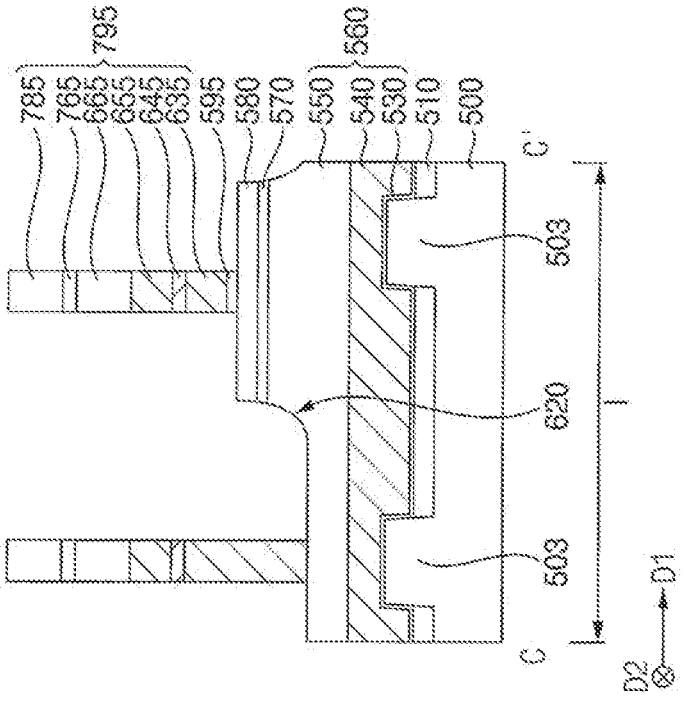
Figure 36:
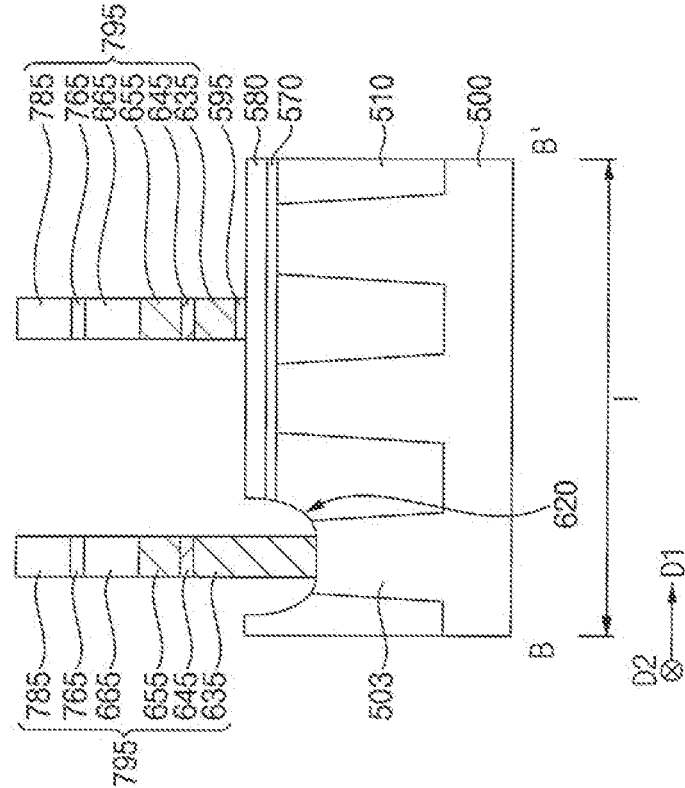

Referring to FIGS. 35 and 36, a portion of the capping layer 780 on the first region I and a portion of the second region II adjacent to the first region I in the second direction D2 may be partially etched to form a first capping pattern 785. The first etch stop layer 760, the first mask layer 660, the second conductive layer 650, the diffusion barrier layer 640 and the first conductive layer 630 may be sequentially etched using the first capping pattern 785 as an etching mask.

In some example embodiments, the first capping pattern 785 may extend in the second direction D2 on the first region I and a portion of the second region II adjacent thereto, and a plurality of first capping patterns 785 may be spaced apart from each other in the first direction D1. The capping layer 780 may remain on the second region II of the substrate 500.

By the etching process, on the first region I of the substrate 500 and the portion of the second region II of the substrate 500 adjacent thereto, a third conductive pattern 635, a second diffusion barrier 645, a fourth conductive pattern 655, a first mask 665, a first etch stop pattern 765 and the first capping pattern 785 may be sequentially stacked on the eleventh opening 620. A third insulation pattern 595, the third conductive pattern 635, the second diffusion barrier 645, the fourth conductive pattern 655, the first mask 665, the first etch stop pattern 765 and the first capping pattern 785 may be sequentially stacked on the second insulation layer 580 at an outside of the eleventh opening 620.

Hereinafter, the third conductive pattern 635, the second diffusion barrier 645, the fourth conductive pattern 655, the first mask 665, the first etch stop pattern 765 and the first capping pattern 785, which are sequentially stacked, may be referred to as a bit line structure 795. The bit line structure 795 may correspond to the first conductive structure 120 of FIG. 3, and the third conductive pattern 635, the second diffusion barrier 645 and the fourth conductive pattern 655 may together correspond to the conductive portion 125 of FIG. 3.

In some example embodiments, the bit line structure 795 may extend in the second direction D2 on the first region I of the substrate 500 and the portion of the second region II of the substrate 500 adjacent to the first region I, and a plurality of bit line structures 795 may be spaced apart from each other in the first direction D1.

Figure 37:
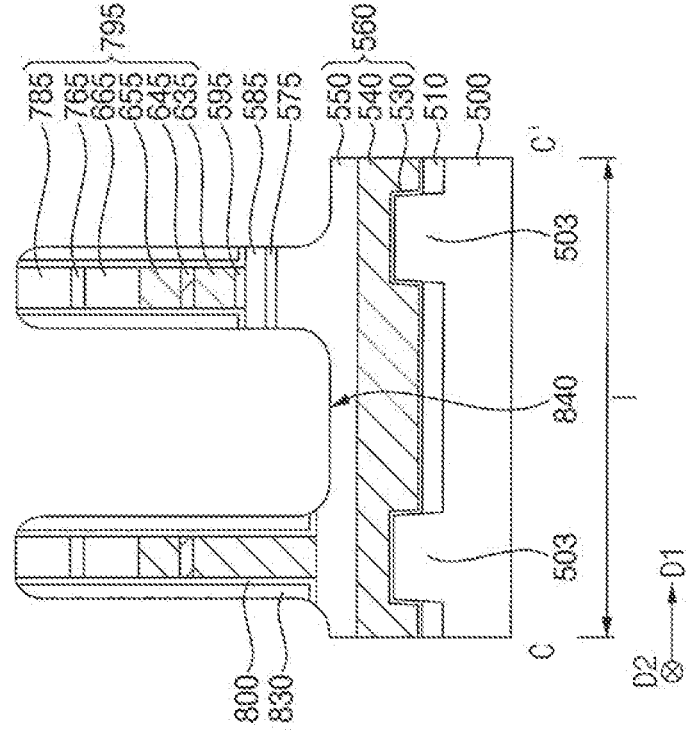
Figure 37:
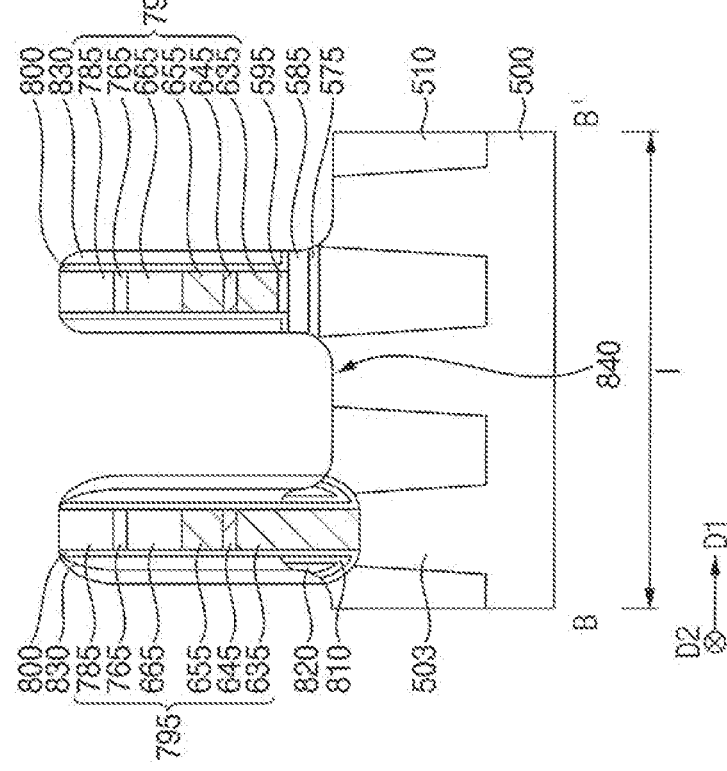

Referring to FIG. 37, a first spacer layer may be formed on the first active pattern 503, the isolation pattern 510 and the upper surface of the first gate mask 550 exposed by the eleventh opening 620, an inner wall of the eleventh opening 620, the second insulation layer 580 and the capping layer 780 to cover the bit line structure 795. Fourth and fifth insulation layers may be sequentially formed on the first spacer layer.

The first spacer layer may cover a sidewall of the third insulation pattern 595 under the bit line structure 795 on the second insulation layer 580. The fifth insulation layer may fill a remaining portion of the eleventh opening 620.

The first spacer layer may include a nitride, e.g., silicon nitride, the fourth insulation layer may include an oxide, e.g., silicon oxide, and the fifth insulation layer may include a nitride, e.g., silicon nitride.

The fourth and fifth insulation layers may be etched by, e.g., a wet etching process. In example embodiments, the wet etching process may be performed using phosphoric acid ($H_3PO_4$), SC1 solution and hydrofluoric acid (HF), and other portions of the fourth and fifth insulation layers except for a portion in the eleventh opening 620 may be removed. Thus, a portion of a surface of the first spacer layer (e.g., most of a surface of the first spacer layer), that is, other portions of the surface of the first spacer layer except for a portion of the surface in the eleventh opening 620 may be exposed, and portions of the fourth and fifth insulation layers that remain in the eleventh opening 620 may form fourth and fifth insulation patterns 810 and 820, respectively.

A second spacer layer may be formed on the exposed surface of the first spacer layer, the fourth and fifth insulation patterns 810 and 820 in the eleventh opening 620, and the capping layer 780, and may be anisotropically etched to form a second spacer 830 on the surface of the first spacer and the fourth and fifth insulation patterns 810 and 820 to cover a sidewall of the bit line structure 795. The second spacer layer may include an oxide, e.g., silicon oxide.

A dry etching process may be performed using the first capping pattern 785 and the second spacer 830 as an etching mask to form a twelfth opening 840 exposing an upper surface of the first active pattern 503, and upper surfaces of the isolation pattern 510 and the first gate mask 550 may also be exposed by the twelfth opening 840.

As a result of the dry etching process, a portion of the first spacer layer on upper surfaces of the first capping pattern 785, the second insulation layer and the capping layer 780 may be removed, and thus a first spacer 800 may be formed to cover the sidewall of the bit line structure 795. During the dry etching process, the first and second insulation layers 570 and 580 may be partially removed to form first and second insulation patterns 575 and 585, respectively, under the bit line structure 795. The first to third insulation patterns 575, 585 and 595 that are sequentially sacked under the bit line structure 795 may form an insulation pattern structure.

Figure 38:
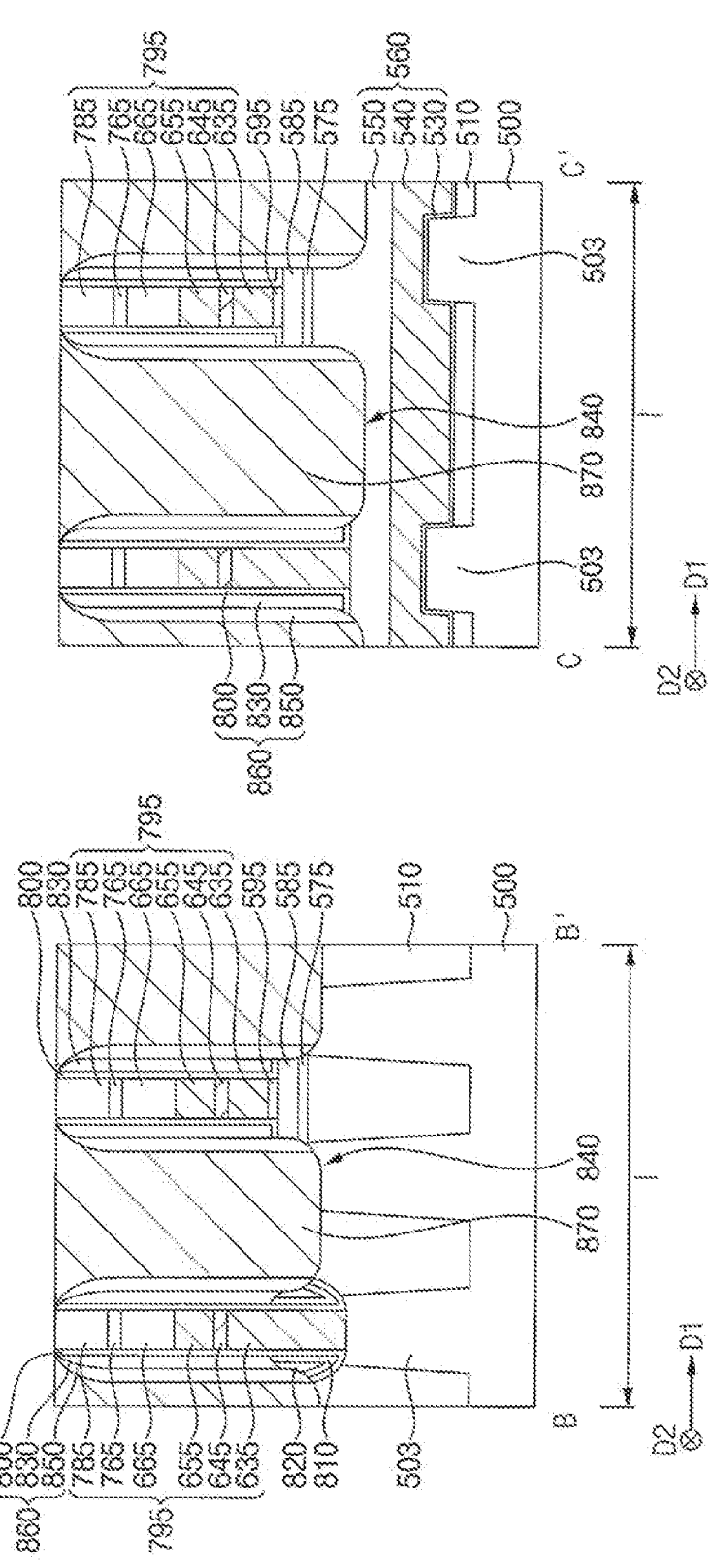

Referring to FIG. 38, a third spacer layer may be formed on the upper surface of the first capping pattern 785, the upper surface of the capping layer 780, an outer sidewall of the second spacer 830, portions of upper surfaces of the fourth and fifth insulation patterns 810 and 820, and the first active pattern 503, the isolation pattern 510 and the first gate mask 550 exposed by the twelfth opening 840, and may be anisotropically etched to form a third spacer 850 covering the sidewall of the bit line structure 795. The third spacer layer may include a nitride, e.g., silicon nitride.

The first to third spacers 800, 830 and 850 sequentially stacked in the horizontal direction on the sidewall of the bit line structure 795 on the first region I of the substrate 500 may be referred to as a preliminary spacer structure 860.

A lower contact plug layer 870 may be formed to fill the twelfth opening 840 on the first region I of the substrate 500, and may be planarized until the upper surfaces of the first capping pattern 785 and the capping layer 780 are exposed.

In some example embodiments, the lower contact plug layer 870 may extend in the second direction D2, and a plurality of lower contact plug layers 870 may be formed to be spaced apart from each other in the first direction D1 by the bit line structures 795. The lower contact plug layer 870 may include, e.g., doped polysilicon.

Figure 39:
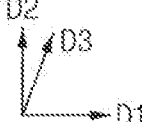
Figure 40:
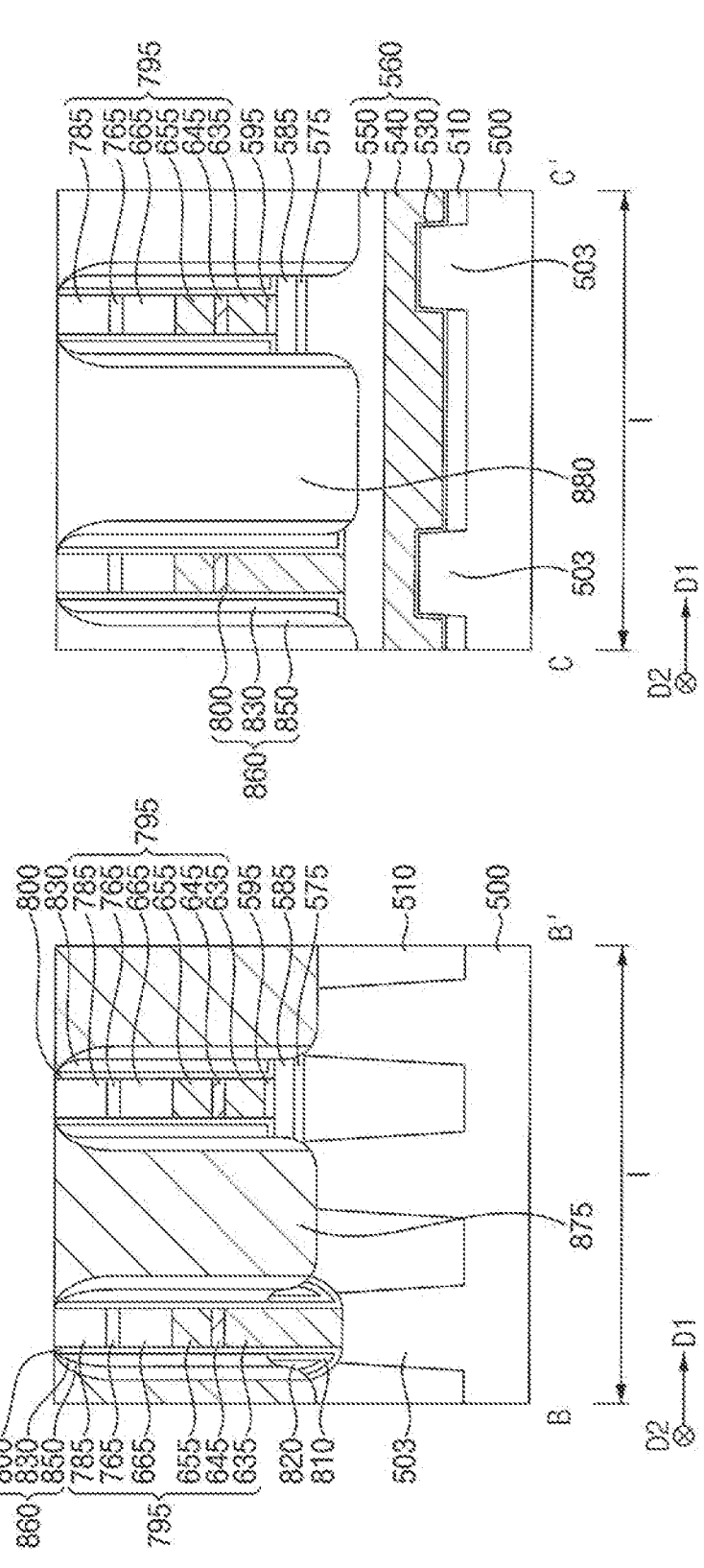

Referring to FIGS. 39 and 40, a second mask (not shown) including thirteenth openings, each of which may extend in the first direction D1 on the first region I of the substrate 500, and which are spaced apart from each other in the second direction D2, may be formed on the first capping pattern 785, the capping layer 780, and the lower contact plug layer 870. The lower contact plug layer 870 may be etched using the second mask as an etching mask.

In some example embodiments, each of the thirteenth openings may overlap the first gate structure 560 in a vertical direction on the first region I of the substrate 500. As a result of the etching process, a fourteenth opening may be formed to expose the upper surface of the first gate mask 550 of the first gate structure 560 between the bit line structures 795 on the first region I of the substrate 500.

After removing the second mask, a second capping pattern 880 may be formed on the first region I of the substrate 500 to fill the fourteenth opening. The second capping pattern 880 may include a nitride, e.g., silicon nitride. In some example embodiments, the second capping pattern 880 may extend in the first direction D1 between the bit line structures 795, and a plurality of second capping patterns 880 may be formed in the second direction D2.

Thus, the lower contact plug layer 870 that extends in the second direction D2 between the bit line structures 795 may be divided into a plurality of lower contact plugs 875 spaced apart from each other in the second direction D2 by the second capping patterns 880 on the first region I of the substrate 500.

Figure 41:
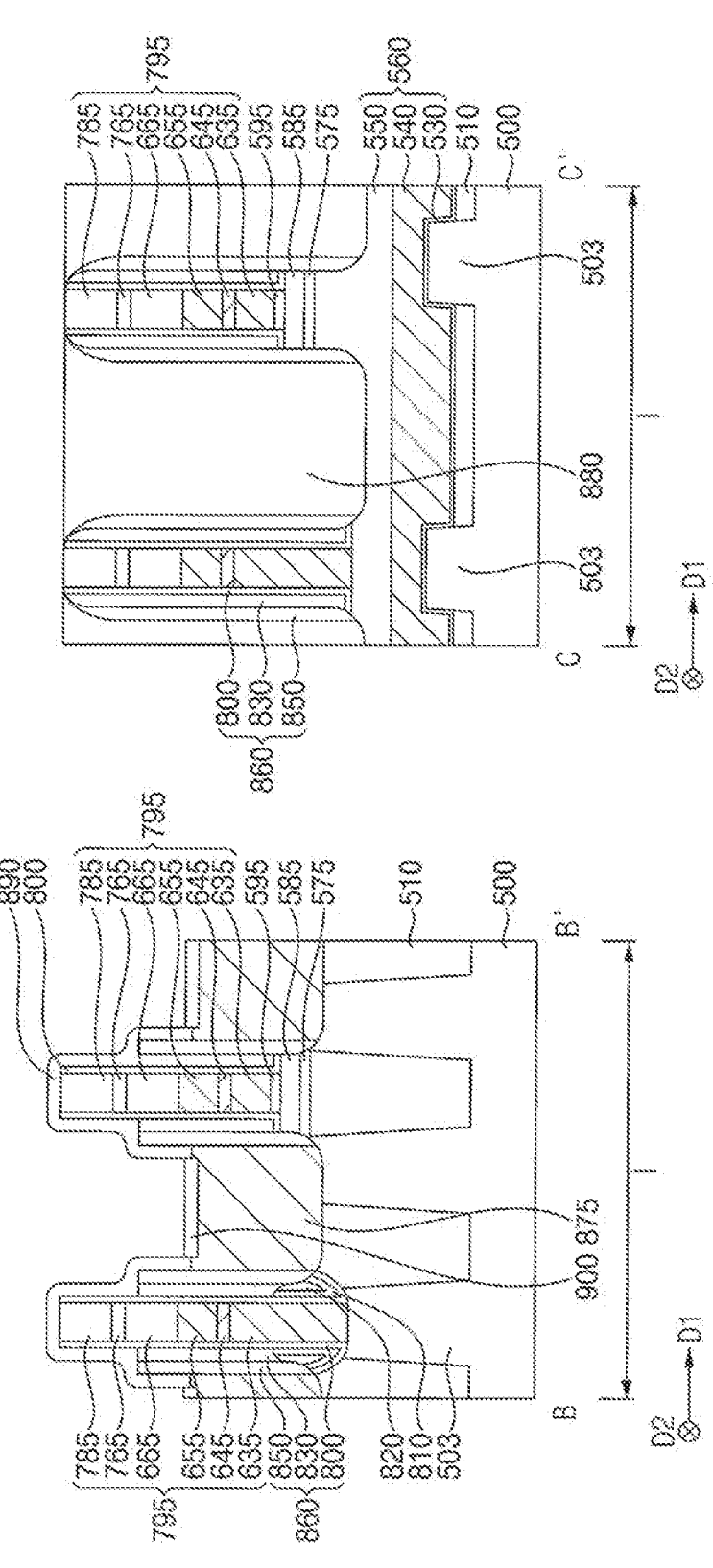

Referring to FIG. 41, an upper portion of the lower contact plug 875 may be removed to expose an upper portion of the preliminary spacer structure 860 on the sidewall of the bit line structure 795, and upper portions of the second and third spacers 830 and 850 of the exposed preliminary spacer structure 860 may be removed.

An upper portion of the lower contact plug 875 may be further removed. Thus, the upper surface of the lower contact plug 875 may be lower than uppermost surfaces of the second and third spacers 830 and 850.

A fourth upper spacer layer may be formed on the bit line structure 795, the preliminary spacer structure 860, the second capping pattern 880, and the lower contact plug 875. The fourth upper spacer layer may be anisotropically etched so that a fourth spacer 890 may be formed to cover an upper portion of the preliminary spacer structure 860 on each of opposite sidewalls of the bit line structure 795 in the first direction D1 and that an upper surface of the lower contact plug 875 may be exposed.

A third metal silicide pattern 900 may be formed on the exposed upper surface of the lower contact plug 875. In some example embodiments, the third metal silicide pattern 900 may be formed by forming a metal layer on the lower contact plug 875, the fourth spacer 890, the first and second capping patterns 785 and 880, and the capping layer 780, then thermally treating the metal layer and removing an unreacted portion of the metal layer. The third metal silicide pattern 900 may include, e.g., cobalt silicide, nickel silicide, titanium silicon, or the like.

Figure 42:
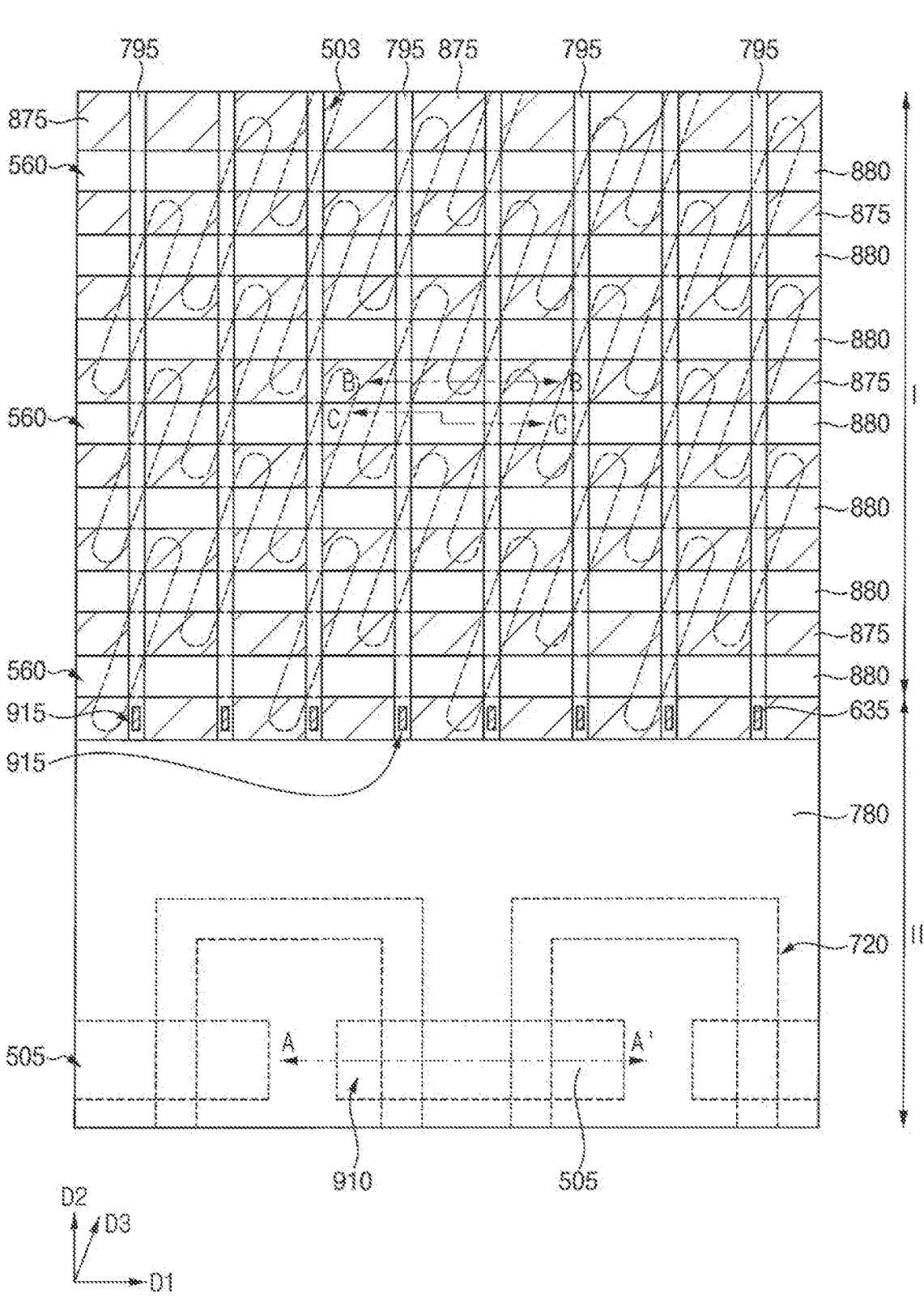
Figure 43:
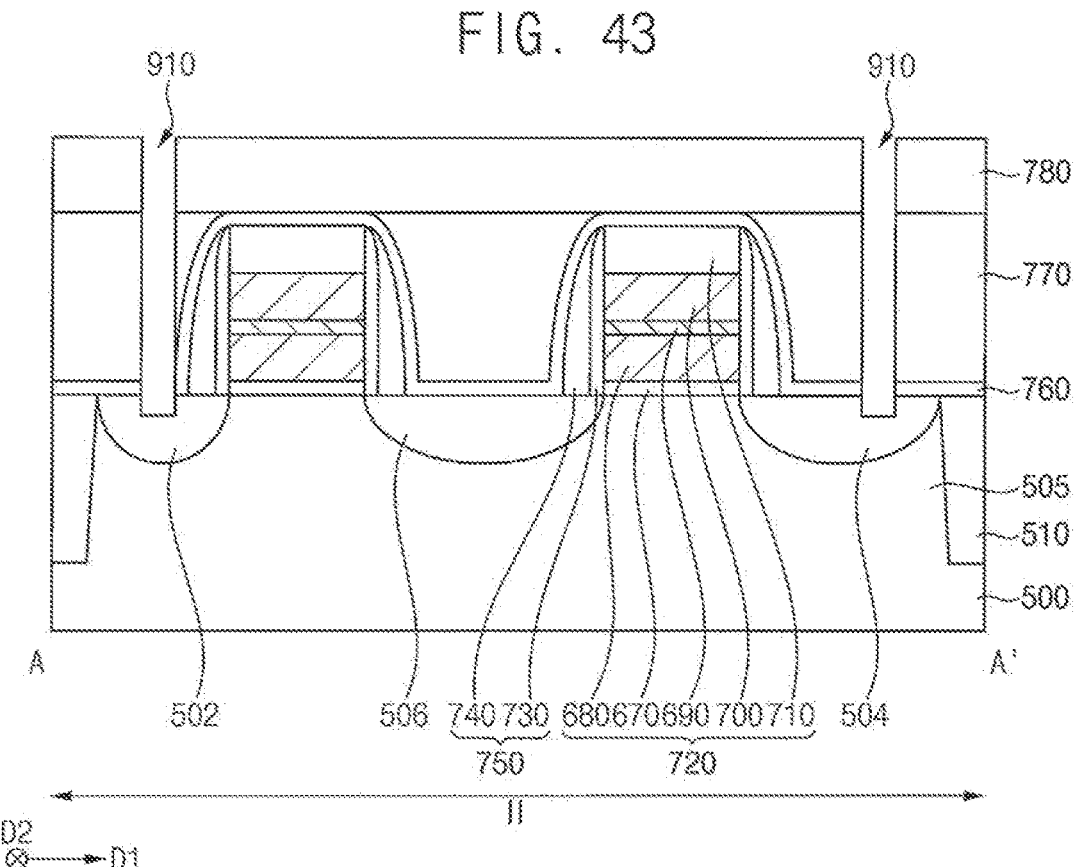

Referring to FIGS. 42 and 43, a first sacrificial layer may be formed on the first and second capping patterns 785 and 880, the capping layer 780, the fourth spacer 890, the third metal silicide pattern 900 and the lower contact plug 875. The first sacrificial layer may be planarized until the upper surfaces of the first and second capping patterns 785 and 880 and the capping layer 780 are exposed.

The first sacrificial layer may include, e.g., spin-on-hardmask (SOH), amorphous carbon layer (ACL), etc.

Processes that are substantially the same as or similar to those illustrated with reference to FIGS. 3 and 4 may be performed to form a first opening 910 extending through the capping layer 780, the first insulating interlayer 770 and the first etch stop layer 760 to expose the second active pattern 505 on the second region II of the substrate 500, and a second opening 915 extending through the first capping pattern 785, the first etch stop pattern 765, the first mask 665, the fourth conductive pattern 655 and the second diffusion barrier 645 included in the bit line structure 795 to expose an upper surface of the third conductive pattern 635. The first opening 910 may expose the first impurity layer 502 or the second impurity layer 504. Additionally, a first metal silicide pattern 920 may be formed on the first and second impurity layers 502 and 504 exposed by the first opening 910.

Figure 44:
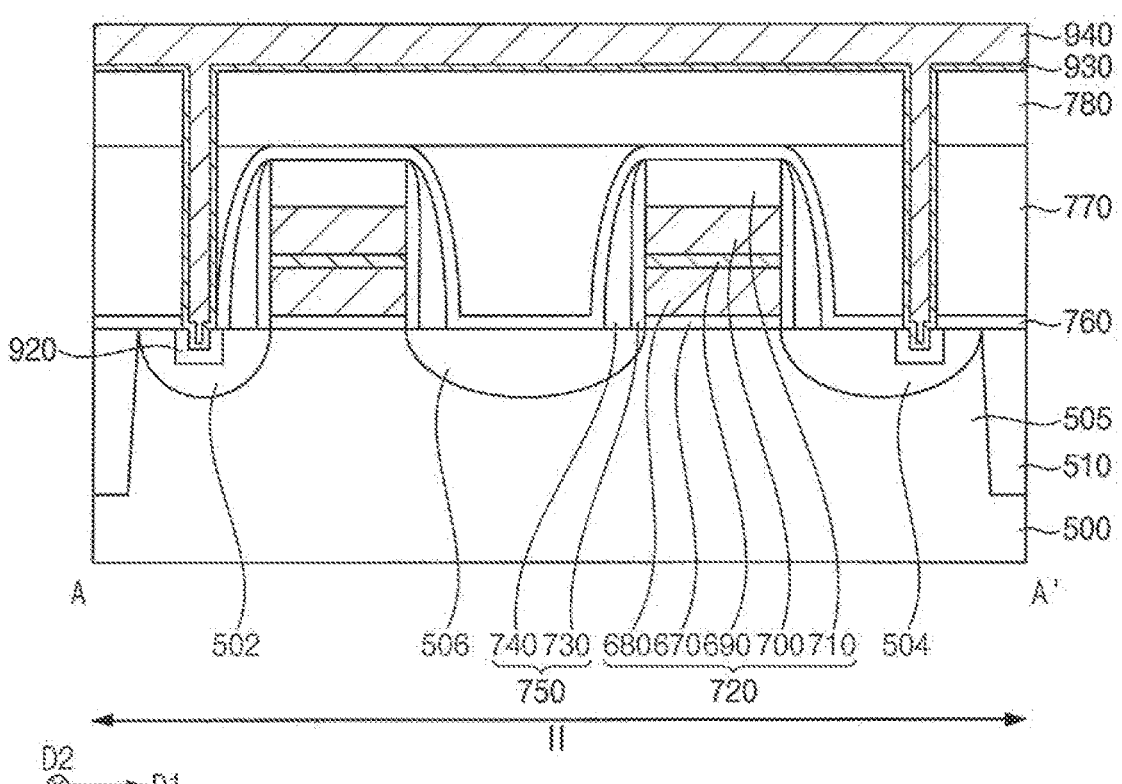
Figure 45:
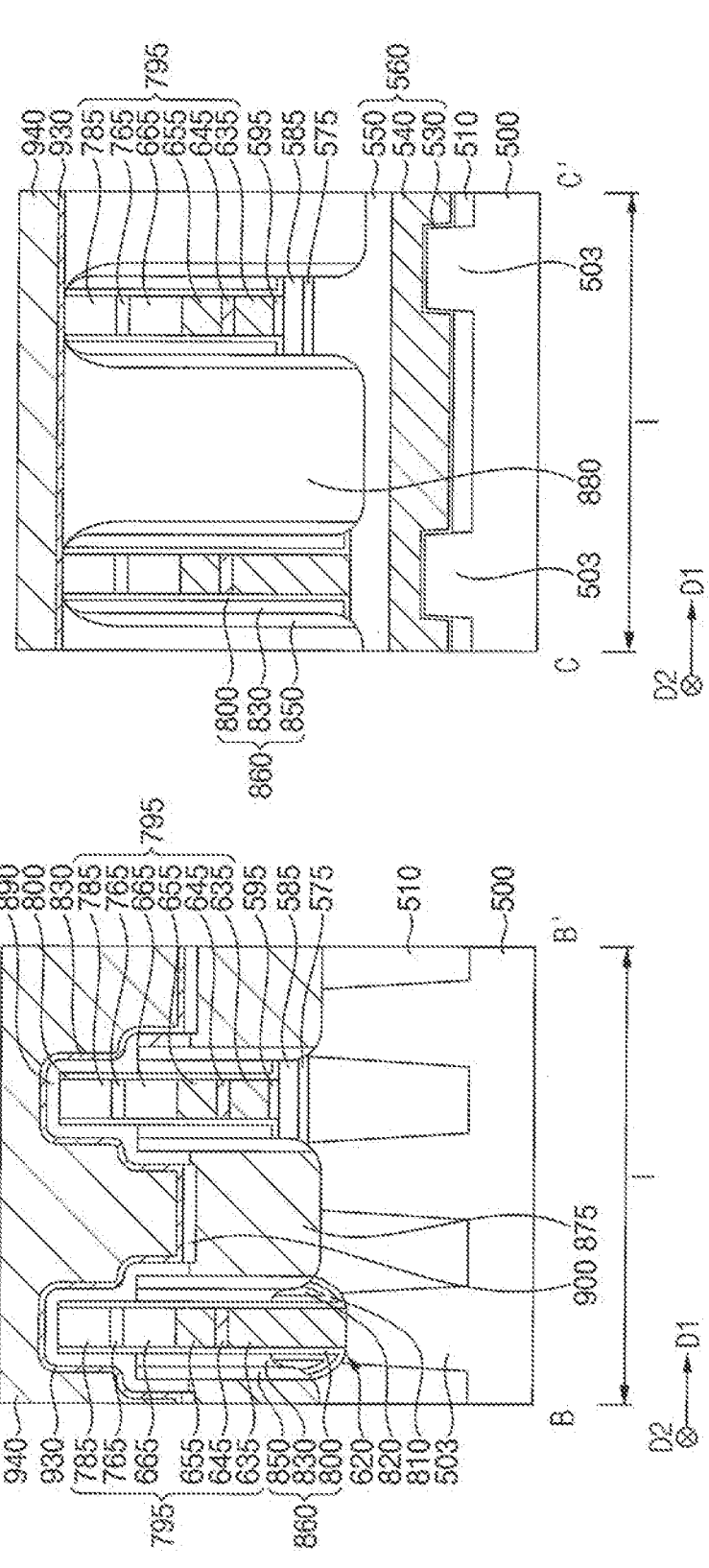

Referring to FIGS. 44 and 45, after removing the first sacrificial layer, processes that are substantially the same as or similar to those illustrated with reference to FIG. 5 may be performed.

Thus, a first barrier layer 930 may be formed on the first and second capping patterns 785 and 880, the fourth spacer 890, the third metal silicide pattern 900 and the lower contact plug 875 on the first region I of the substrate 500, and the capping layer 780, the first metal silicide pattern 920 and the first gate electrode 540 at lower portions of the first and second openings 910 and 915, and sidewalls of the first and second openings 910 and 915 on the second region II of the substrate 500, and a first metal layer 940 may be formed on the first barrier layer 930 to fill a space between the bit line structures 795 and the first and second openings 910 and 915.

The first metal layer 940 may be further planarized. The planarization process may include, e.g., chemical mechanical polishing (CMP) process and/or an etch back process.

Figure 46:
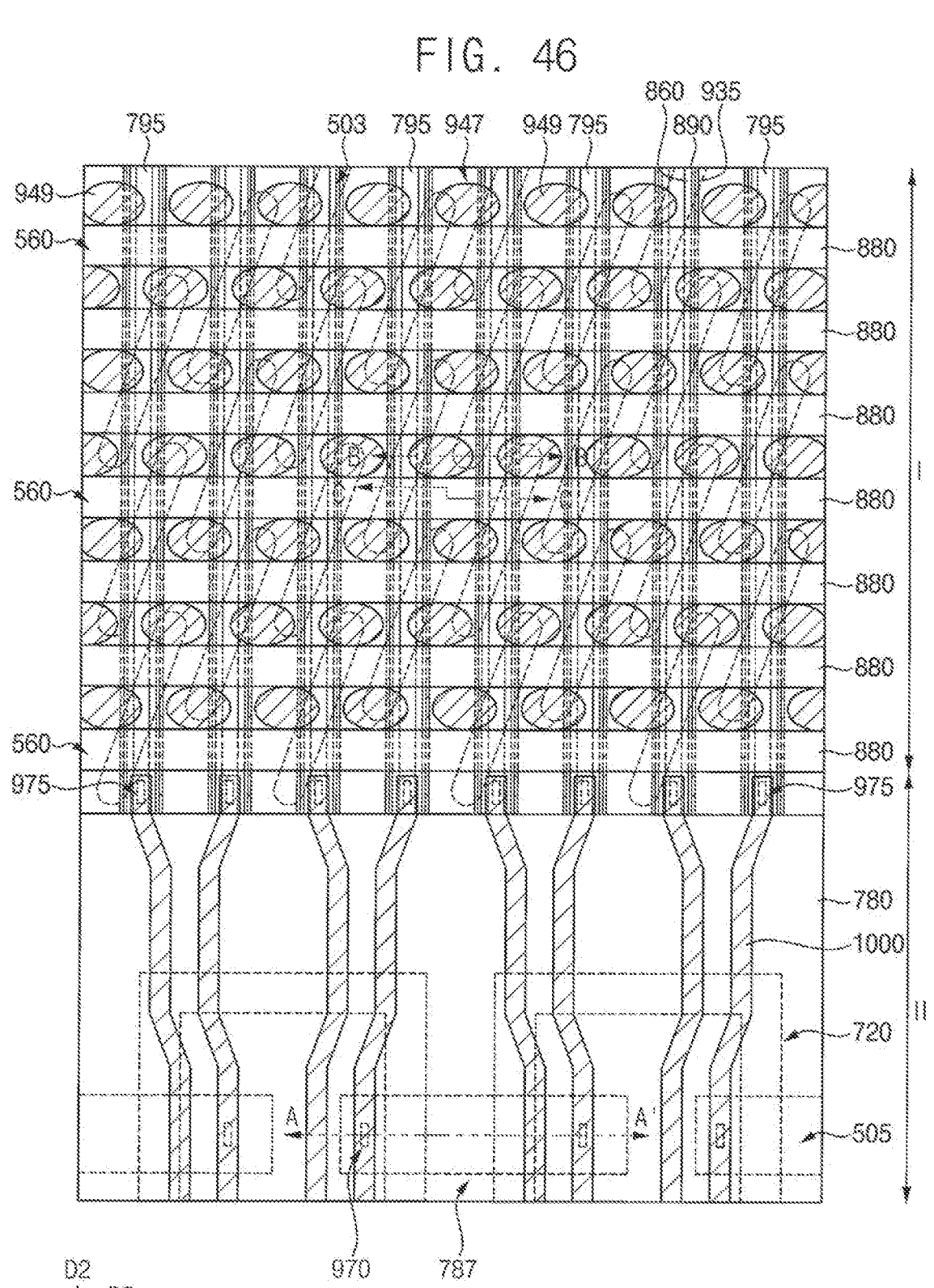
Figure 47:
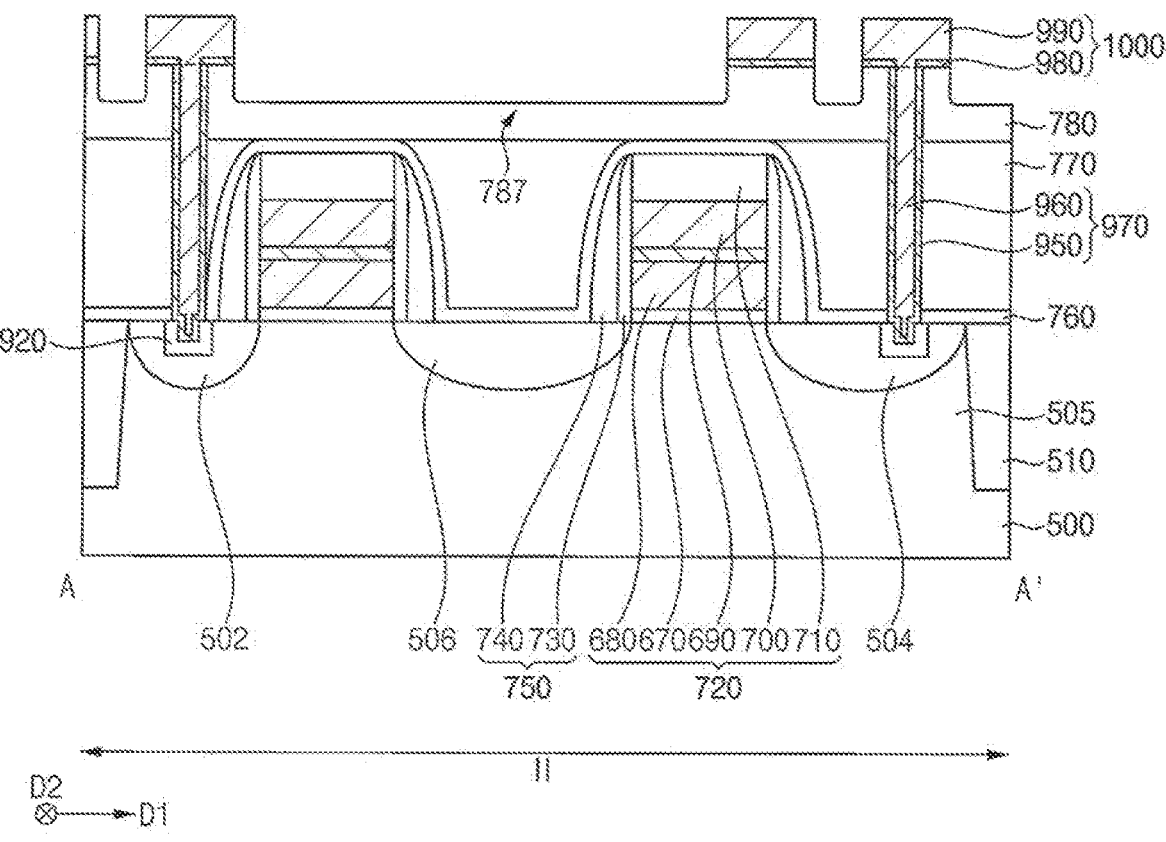
Figure 48:
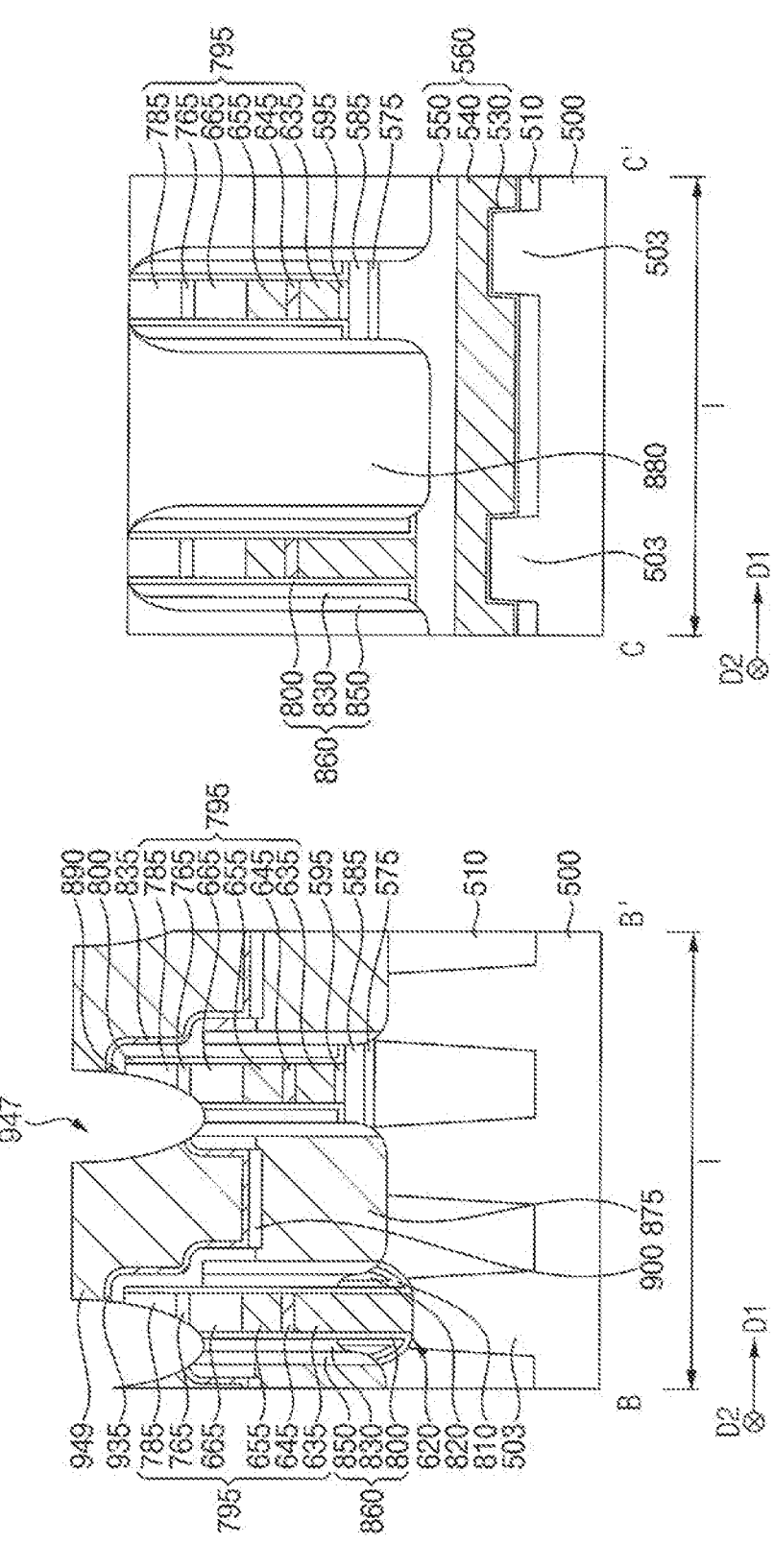

Referring to FIGS. 46 to 48, processes that are substantially the same as or similar to those illustrated with reference to FIGS. 6 and 7 may be performed so that the first metal layer 940 and the first barrier layer 930 may be patterned.

Thus, a fifteenth opening 947 and an upper contact plug 949 may be formed on the first region I of the substrate 500, and a third recess 787 and a second conductive structure 1000 may be formed on the second region II of the substrate 500.

The fifteenth opening 947 may be formed by removing not only the first metal layer 940 and the first barrier layer 930, but also upper portions of the first capping pattern 785, the preliminary spacer structure 860 and the fourth spacer 890. Thus, an upper surface of the second spacer 830 may be exposed.

As the fifteenth opening 947 is formed, the first metal layer 940 and the first barrier layer 930 may be transformed into an eighteenth metal pattern and an eighteenth barrier pattern, respectively, covering a lower surface of the eighteenth metal pattern on the first region I of the substrate 500, which may form an upper contact plug 949. In example embodiments, a plurality of upper contact plugs 949 may be spaced apart from each other in each of the first and second directions D1 and D2, and may be arranged in a honeycomb pattern in a plan view. Each of the upper contact plugs 949 may have a shape of a circle, ellipse, polygon, or the like.

The lower contact plug 875, the third metal silicide pattern 900, and the upper contact plug 949 that are sequentially stacked on the first region I of the substrate 500 may form a contact plug structure.

The second conductive structure 1000 may include a first metal pattern 990 and a first barrier pattern 980 that covers a lower surface of the first metal pattern 990. A first contact plug 970 including a second metal pattern 960 and a second barrier pattern 950 may be formed in the first opening 910, and a second contact plug 975 including a third metal pattern and a third barrier pattern may be formed in the second opening 915.

The exposed second spacer 830 may be removed to form an air gap 835 connected to the fifteenth opening 947. The second spacer 830 may be removed by, e.g., a wet etching process.

In some example embodiments, not only a portion of the second spacer 830 on the sidewall of the bit line structure 795 that extends in the second direction D2 and is directly exposed by the fifteenth opening 947, but also other portions of the second spacer 830 parallel to the directly exposed portion thereof in the horizontal direction may be removed. That is, not only the portion of the second spacer 830 exposed by the fifteenth opening 947 and not covered by the upper contact plug 949, but also a portion of the second spacer 830 adjacent to the exposed portion in the second direction D2 to be covered by the second capping pattern 880 and a portion of the second spacer 830 adjacent to the exposed portion in the second direction D2 to be covered by the upper contact plug 949 may be all removed.

Figure 49:
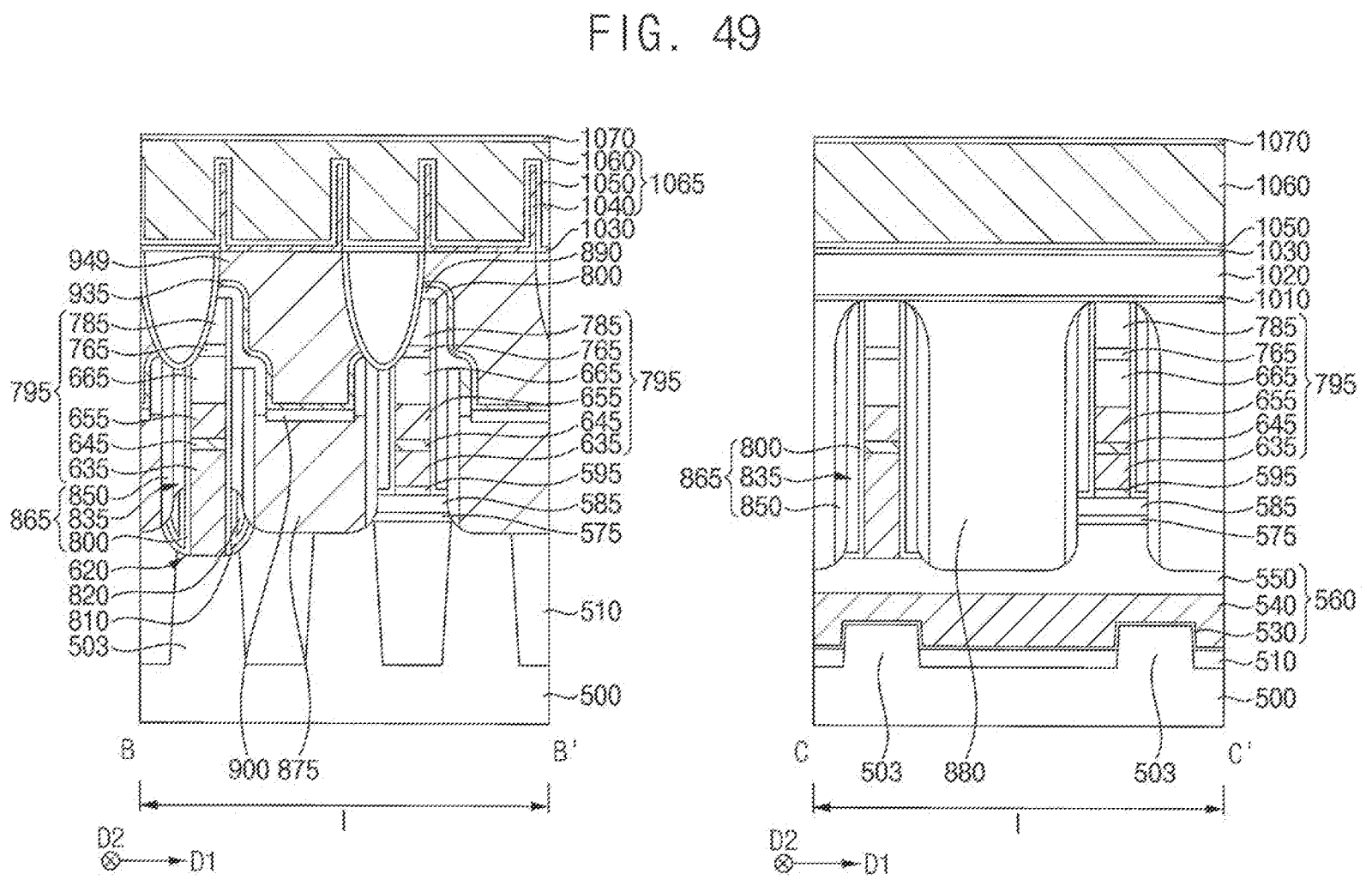

Referring to FIG. 49, a second insulating interlayer may be formed to fill the fifteenth opening 947 on the first region I of the substrate 500 and the third recess 787 on the second region II of the substrate 500.

In some example embodiments, the second insulating interlayer may include first and second layers 1010 and 1020 sequentially stacked, and may also be formed on the second capping pattern 880.

The first layer 1010 may include a material having a low gap filling characteristic, and thus the air gap 835 under the fifteenth opening 947 may not be filled. The air gap 835 may also be referred to as an air spacer 835, and may form a spacer structure 865 together with the first and third spacers 800 and 850. That is, the air gap 835 may be a spacer including an air. The second layer 1020 may include an oxide, e.g., silicon oxide or a nitride, e.g., silicon nitride.

A capacitor 1065 may be formed to contact an upper surface of the upper contact plug 949.

Particularly, a third etch stop layer 1030 and a mold layer (not shown) may be sequentially formed on the upper contact plug 949, the second insulating interlayers and the second conductive structure 1000, and partially etched to form a sixteenth opening partially exposing the upper surface of the upper contact plug 949. The third etch stop layer 1030 may include a nitride, e.g., silicon nitride.

A lower electrode layer (not shown) may be formed on a sidewall of the sixteenth opening, the exposed upper surface of the upper contact plug 949 and the mold layer, a second sacrificial layer (not shown) may be formed on the lower electrode layer to fill the sixteenth opening, and the lower electrode layer and the second sacrificial layer may be planarized until an upper surface of the mold layer is exposed to divide the lower electrode layer. The second sacrificial layer and the mold layer may be removed by, e.g., a wet etching process, and thus a lower electrode 1040 having a cylindrical shape may be formed on the exposed upper surface of the upper contact plug 949. Alternatively, the lower electrode 1040 may have a pillar shape filling the sixteenth opening. The lower electrode 1040 may include, e.g., a metal, a metal nitride, a metal silicide, doped polysilicon, or the like.

A dielectric layer 1050 may be formed on a surface of the lower electrode 1040 and the third etch stop layer 1030, and an upper electrode 1060 may be formed on the dielectric layer 1050. The capacitor 1065 including the lower electrode 1040, the dielectric layer 1050 and the upper electrode 1060 may be formed.

The dielectric layer 1050 may include a metal oxide, and the upper electrode 1060 may include, e.g., a metal, a metal nitride, a metal silicide, doped polysilicon, or the like.

Figure 50:
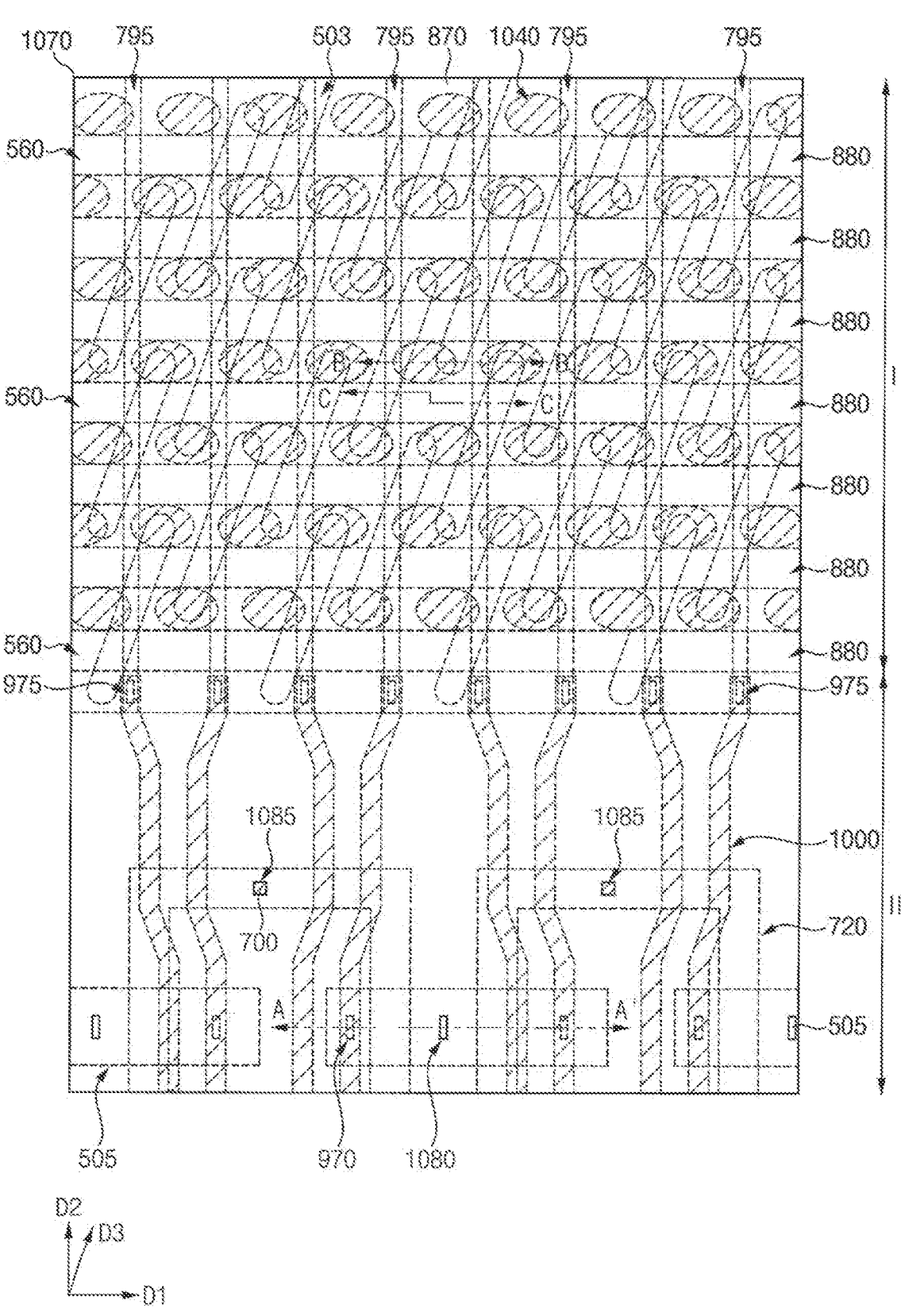
Figure 51:
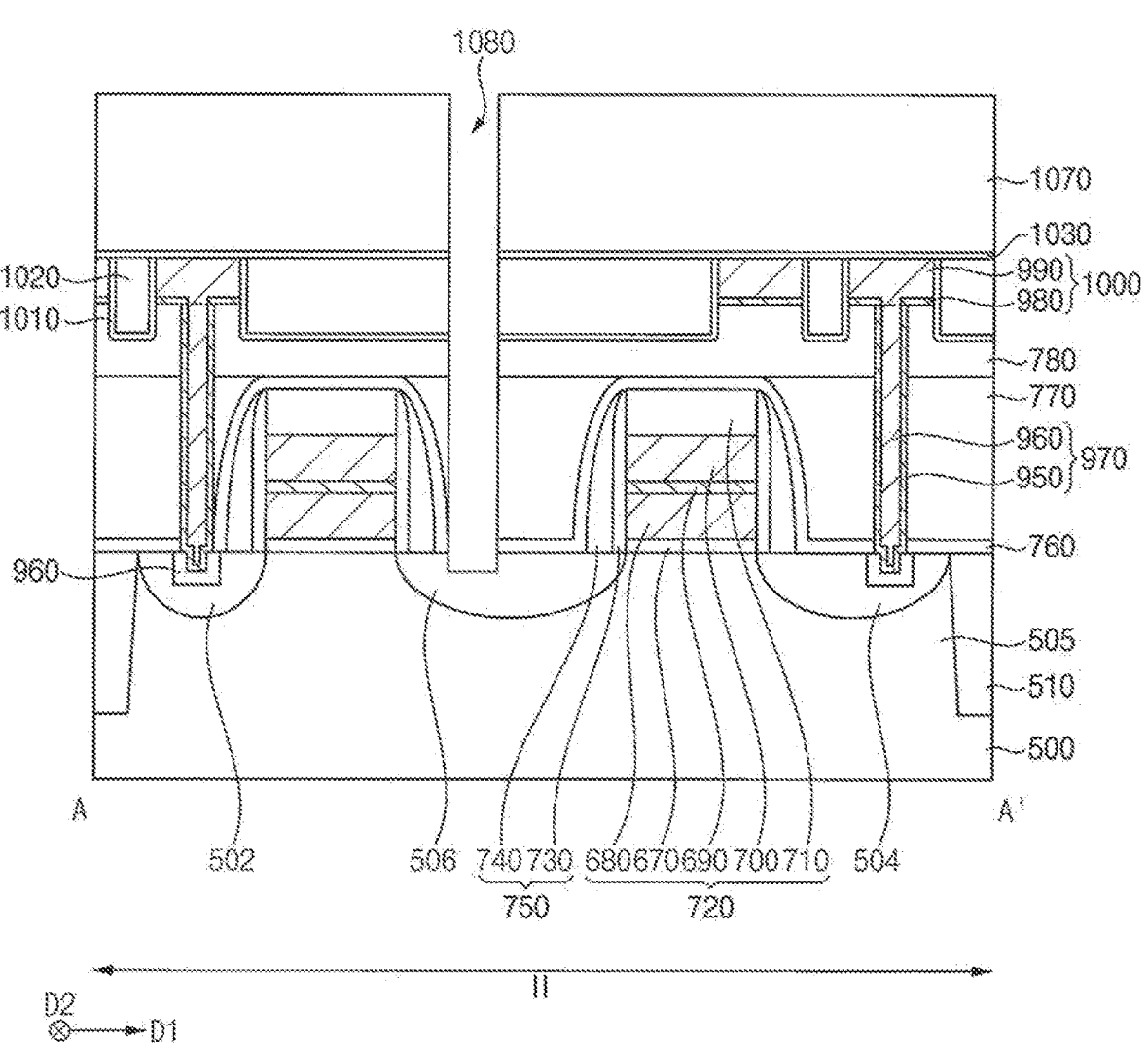

Referring to FIGS. 50 and 51, processes that are substantially the same as or similar to those illustrated with reference to FIGS. 8 and 9 may be performed.

Thus, a third insulating interlayer 1070 may be formed on the capacitor 1065 on the first region I of the substrate 500 and the third etch stop layer 1030 on the second region II of the substrate 500. A third opening 1080 may be formed extending through the third insulating interlayer 1070, the third etch stop layer 1030, the second insulating interlayer, the capping layer 780, the first insulating interlayer 770 and the first etch stop layer 760 to expose the upper surface of the second active pattern 505, that is, the upper surface of the third impurity layer 506, and a fourth opening 1085 extending through the third insulating interlayer 1070, the third etch stop layer 1030, the second insulating interlayer, the capping layer 780, the first etch stop layer 220 and the second gate mask 710 to expose the upper surface of the second conductive pattern 700.

Figure 52:
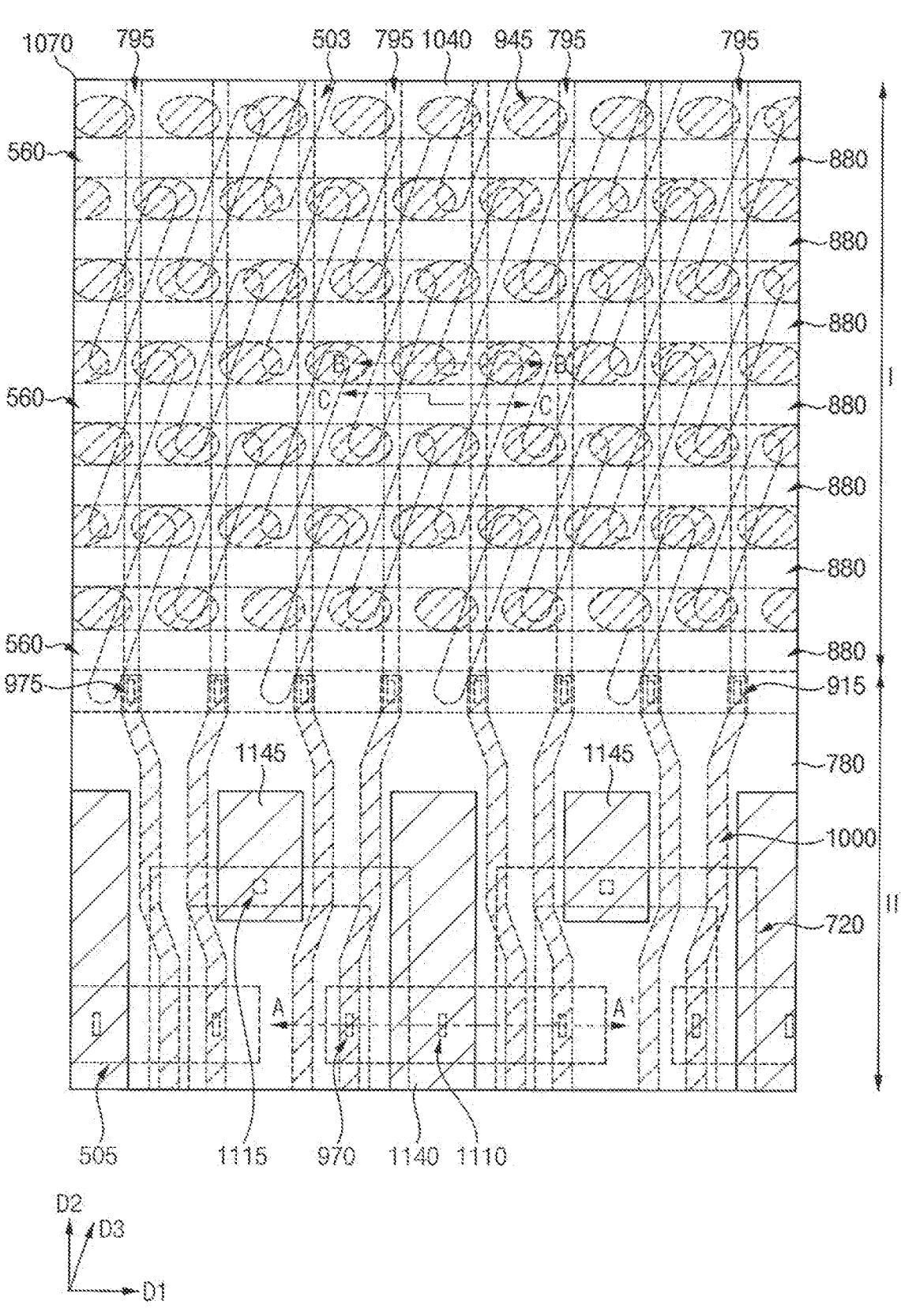
Figure 53:
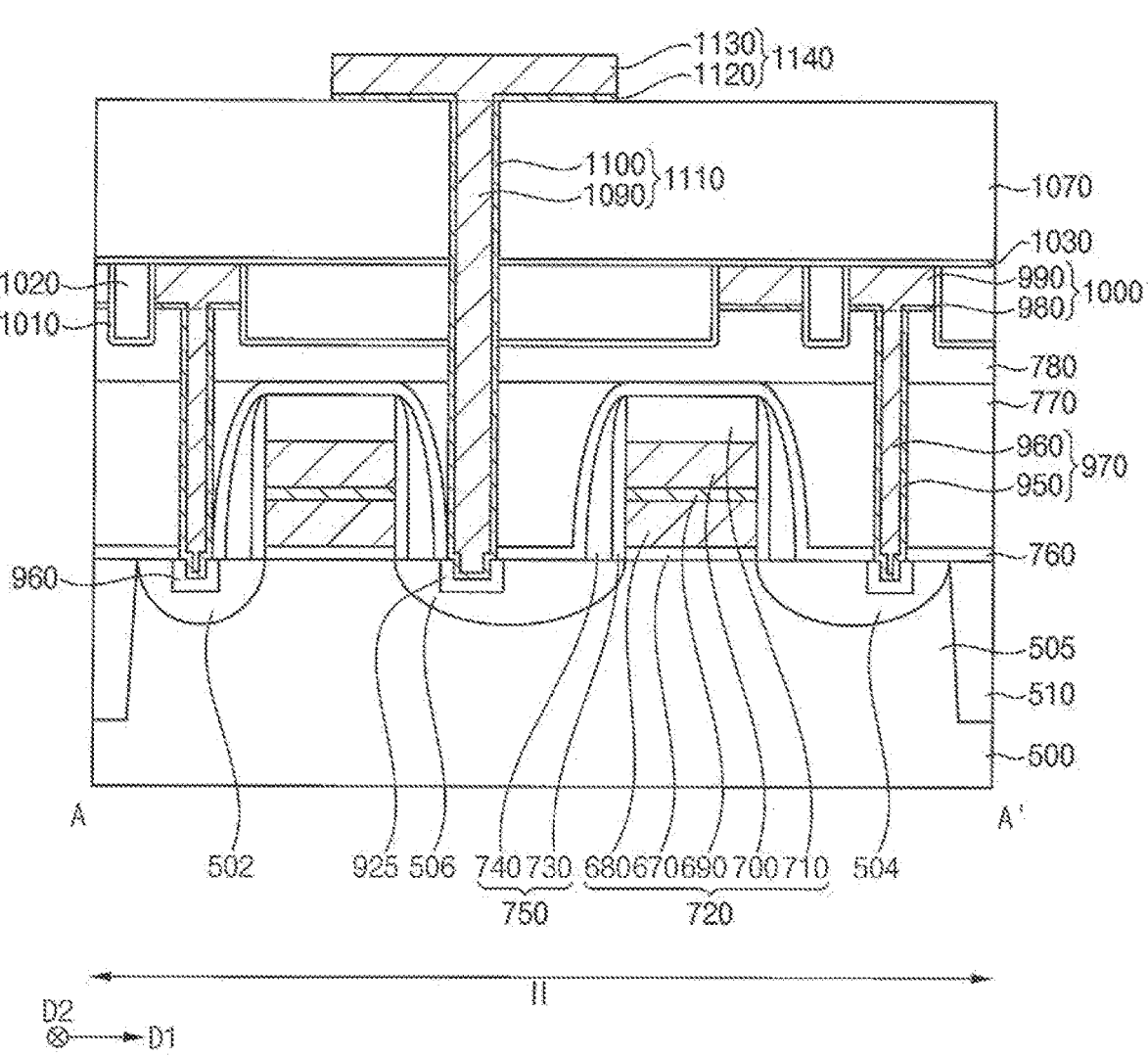

Referring to FIGS. 52 and 53, processes that are substantially the same as or similar to those illustrated with reference to FIGS. 10 and 11 may be performed.

Thus, a second metal silicide pattern 925 may be formed on the upper surface of the third impurity layer 506 exposed by the third opening 1080, a third contact plug 1110 including a sixth metal pattern 1100 and a sixth barrier pattern 1090 may be formed in the third opening 1080, a fourth contact plug 1115 including a seventh metal pattern and a seventh barrier pattern may be formed in the fourth opening 1085, and third and fourth conductive structures 1140 and 1145 contacting upper surfaces of the third and fourth contact plugs 1110 and 1115, respectively, may be formed on the third insulating interlayer 1070.

The third conductive structure 1140 may include a fourth metal pattern 1130 and a s fourth barrier pattern 1120 covering a lower surface of the fourth metal pattern 1130, and the fourth conductive structure 1145 may include a fifth metal pattern and a fifth barrier pattern covering a lower surface of the fifth metal pattern.

Figure 54:
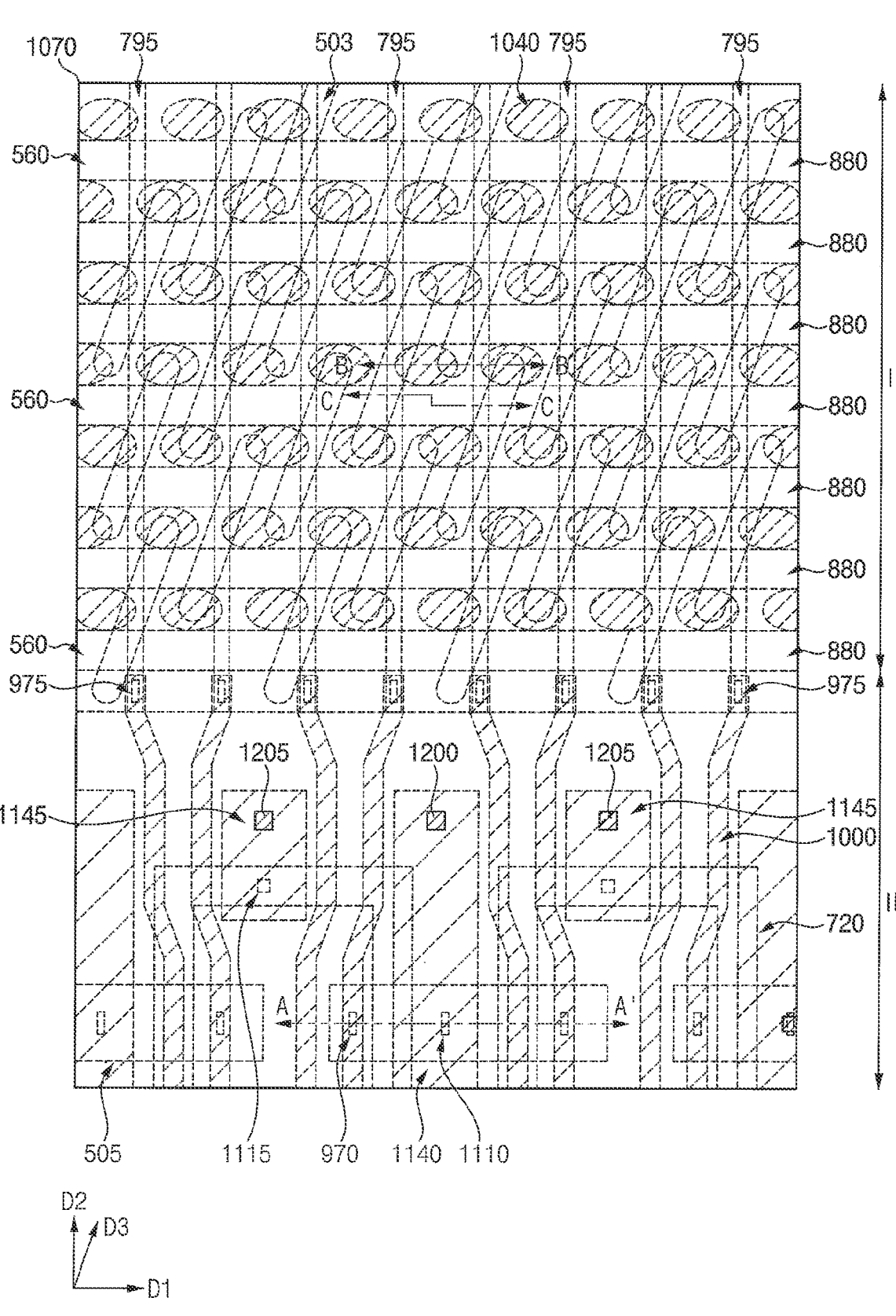
Figure 55:
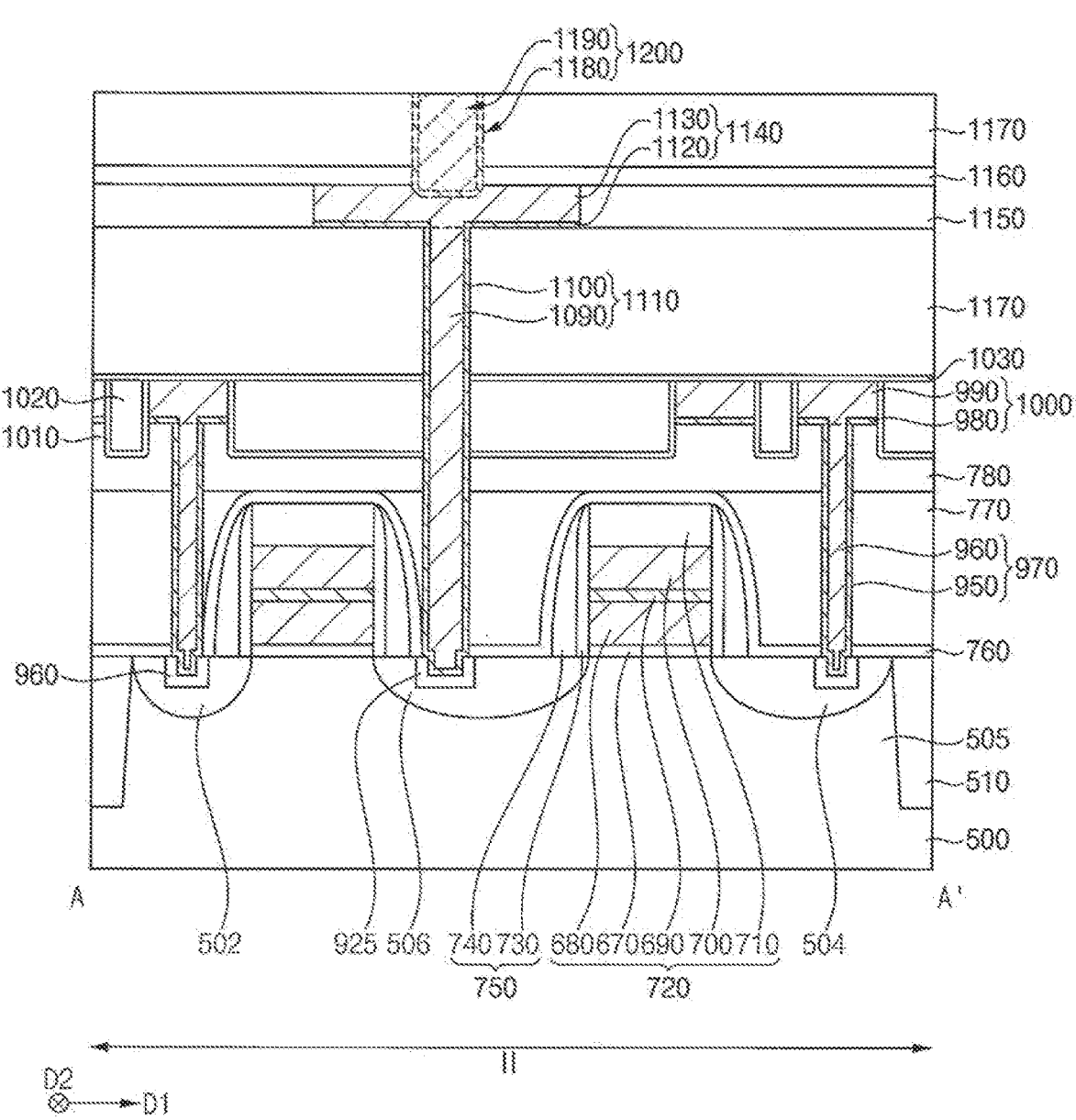
Figure 56:
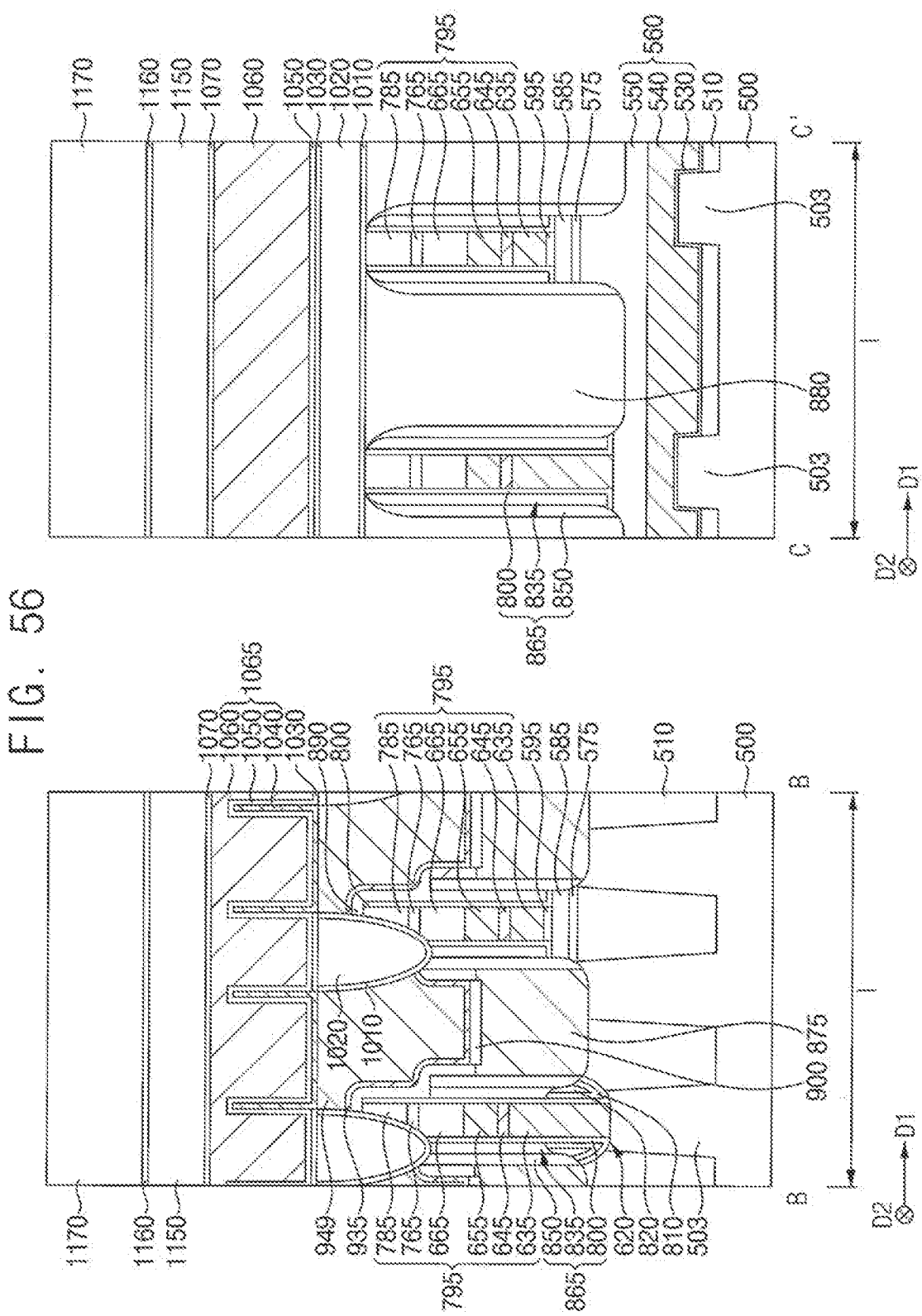

Referring to FIGS. 54 to 56, processes that are substantially the same as or similar to those illustrated with reference to FIGS. 12 and 13 may be performed.

Thus, a fourth insulating interlayer 1150 may be formed on the third insulating interlayer 1070 to cover the third and fourth conductive structures 1140 and 1145, and may be planarized until upper surfaces of the third and fourth conductive structures 1140 and 1145 are exposed, so that sidewalls of the third and fourth conductive structures 1140 and 1145 may be covered by the fourth insulating interlayer 1150.

A second etch stop layer 1160 and a fifth insulating interlayer 1170 may be sequentially formed on the third and fourth conductive structures 1140 and 1145 and the fourth insulating interlayer 1150, fifth and sixth openings may be formed through the second etch stop layer 1160 and the fifth insulating interlayer 1170 to expose the upper surfaces of the third and fourth conductive structures 1140 and 1145, and fifth and sixth contact plugs 1200 and 1205 may be formed to fill the fifth and sixth openings, respectively.

The fifth contact plug 1200 may include an eighth metal pattern 1490 and an eighth barrier pattern 1480 covering a sidewall and a lower surface of the eighth metal pattern 1490, and the sixth contact plug 1205 may include a ninth metal pattern and a ninth barrier pattern covering a sidewall and a lower surface of the ninth metal pattern.

A semiconductor device may be manufactured by the above processes, which may have some of the following structural characteristics.

Particularly, the semiconductor device may include the first and second active patterns 503 and 505 on the cell region I and the peripheral circuit region II, respectively, of the substrate 500. The first gate structure 560 may extend in the first direction D1 in an upper portion of the first active pattern 503, the bit line structure 795 may contact an upper surface of a middle portion of the first active pattern 503 and may extend in the second direction D2 on the cell region I and a portion of the peripheral circuit region II adjacent thereto. The contact plug structure may contact an upper surface of each of opposite edges in the third direction D3 of the first active pattern 503, the capacitor 1065 on the contact plug structure, the second gate structure 720 on the peripheral circuit region II of the substrate 500 and may partially overlap the second active pattern 505 in the vertical direction. The first and third impurity layers 502 and 506 (hereinafter, first and second source/drain layers 502 and 506, respectively) on upper surfaces of the second active pattern 505 adjacent the opposite sidewalls, respectively, in the first direction D1 of the second gate structure 720 may serve as source/drains. The first and third contact plugs 970 and 1110 on the first and second source/drain layers 502 and 506, respectively, may extend in the vertical direction, the second and third conductive structures 1000 and 1140 may contact the upper surfaces of the first and third contact plugs 970 and 1110, respectively, and may extend in the second direction D2 on the peripheral circuit region II of the substrate 500, and the second contact plug 975 may contact a lower surface of an end portion in the second direction D2 of the second conductive structure 1000 and extend in the vertical direction to contact an end portion in the second direction D2 of the bit line structure 795. The fifth contact plug 1200 may contact the upper surface of the third conductive structure 1140. A height of the third conductive structure 1140 may be greater than a height of the second conductive structure 1000, and a width of the third conductive structure 1140 may be greater than a width of the second conductive structure 1000.

In some example embodiments, a plurality of first active patterns 503, each of which may extend in the third direction D3, may be spaced apart from each other in each of the first and second directions D1 and D2, a plurality of second active patterns 505 each of which may extend in the first direction D1 may be spaced apart from each other in the second direction D2. Thus, a plurality of first gate structures 560 may be spaced apart from each other in the second direction D2, and each of the bit line structure 795, the second gate structure 720, and the second and third conductive structures 1000 and 1140 may be formed in the first direction D1 in plural numbers.

In some example embodiments, the second gate structures 720 may share the second source/drain layer 506 neighboring in the first direction D1.

In some example embodiments, the bit line structure 795 on the first region I of the substrate 500 may be electrically connected to the first impurity layer 502 or the second impurity layer 504 on the second region II of the substrate 500. An end portion in the second direction D2 of the bit line structure 795 may extend to an edge of the second region II of the substrate 500 to be connected to the second contact plug 975 and the second conductive structure 1000 stacked on the second region II of the substrate 500. The second conductive structure 1000 may extend in the second direction D2 on the second region II of the substrate 500, and may be electrically connected to the first impurity layer 502 or the second impurity layer 504 through the first contact plug 970 and the first metal silicide pattern 920.

In some example embodiments, the third impurity layer 506 on the second region II of the substrate 500 may be electrically connected to the fifth contact plug 1200 through the third contact plug 1110 and the third conductive structure 1140, which may be sequentially stacked.

In some example embodiments, the second gate structure 720 on the second region II of the substrate 500 may be electrically connected to the fourth conductive structure 1145 through the fourth contact plug 1115.

While the present inventive concepts have been shown and described with reference to some example embodiments thereof, it will be understood by those of ordinary skill in the art that various changes in form and details may be made thereto without departing from the scope of the present inventive concepts as set forth by the following claims.

What is claimed is:

1. A semiconductor device comprising:
first and second gate structures on a substrate;
first and second source/drain layers at upper first and second portions, respectively, of the substrate that are adjacent to first and second sidewalls of the first gate structure;
first and third contact plugs on the first and second source/drain layers, respectively, the first and third contact plugs each extending in a vertical direction perpendicular to an upper surface of the substrate;
second and third conductive structures respectively in contact with upper surfaces of the first and third contact plugs; and
a fifth contact plug in contact with an upper surface of the third conductive structure,
wherein a height of the third conductive structure is greater than a height of the second conductive structure, a width of the third conductive structure is greater than a width of the second conductive structure, a width of the fifth contact plug is less than a width of the third conductive structure, and widths of the second and third conductive structures are greater than widths of the first and third contact plugs, respectively,
wherein a width of the fifth contact plug is greater than a width of each of the first and third contact plugs,
wherein the third contact plug is between the first and second gate structures in a plan view, and is free from overlap by the fifth contact plug in the vertical direction,
wherein the first and second gate structures are free from overlap by the fifth contact plug in the vertical direction, and
wherein a thickness in the vertical direction of the fifth contact plug is less than a thickness in the vertical direction of the third contact plug, is less than a thickness in the vertical direction of the first contact plug, and is greater than a thickness in the vertical direction of the third conductive structure.

2. The semiconductor device according to claim 1, wherein a width of each of the first and third contact plugs is uniform or decreases at a given ratio from a bottom toward a top thereof in the vertical direction, and
wherein a width of the third contact plug is greater than a width of the first contact plug.

3. The semiconductor device according to claim 1, wherein each of the second and third conductive structures extends in a first direction parallel to the upper surface of the substrate, and
wherein the semiconductor device further comprises:
a second contact plug in contact with a lower surface of an end portion in the first direction of the second conductive structure and extending in the vertical direction; and
a first conductive structure in contact with a lower surface of the second contact plug.

4. The semiconductor device according to claim 3, wherein the second conductive structure is partially bent in the first direction, and

wherein the third conductive structure is in a straight line in the first direction, and has a constant width in a second direction parallel to the upper surface of the substrate and perpendicular to the first direction.

5. The semiconductor device according to claim 3, wherein the second gate structure is spaced apart from the first gate structure in a second direction parallel to the upper surface of the substrate and perpendicular to the first direction, wherein the first and second gate structures share the second source/drain layer, wherein the fifth contact plug is electrically connected to the second source/drain layer, the semiconductor device further comprising:
a third source/drain layer at an upper portion of the substrate at an opposite side of the second gate structure from the second source/drain layer,
wherein the second gate structure, the second source/drain layer, and the third source/drain layer are included in a same transistor.

6. The semiconductor device according to claim 5, further comprising:
another first contact plug on the third source/drain layer, the another first contact plug extending in the vertical direction; and
another second conductive structure in contact with an upper surface of the another first contact plug and extending in the first direction,
wherein the another second conductive structure is at the same height as the second conductive structure,
wherein a thickness in the vertical direction of the another first contact plug is the same as a thickness in the vertical direction of the first contact plug, and
wherein the third source/drain layer has a width that is different from a width of at least one of the first source/drain layer or the second source/drain layer.

7. The semiconductor device according to claim 1, wherein the second conductive structure is free from overlap by the third conductive structure in the vertical direction,
wherein the second conductive structure is electrically connected to the first source/drain layer, and the third conductive structure is electrically connected to the second source/drain layer, and
wherein the first gate structure, the first source/drain layer, and the second source/drain layer are included in a same transistor.

8. The semiconductor device according to claim 1, wherein a thickness of the third contact plug in the vertical direction is greater than a thickness of each of the first and fifth contact plugs in the vertical direction, and
wherein the third contact plug is electrically connected to the fifth contact plug.

9. A semiconductor device comprising:
an active region on a substrate;
gate structures on the substrate, the gate structures spaced apart from each other in a first direction parallel to an upper surface of the substrate, each of the gate structures partially overlapping the active region in a vertical direction perpendicular to the upper surface of the substrate;
first, second and third impurity layers each in an upper portion of the active region and adjacent to a gate structure of the gate structures;
first contact plugs on the first and second impurity layers, respectively, each extending in the vertical direction;
a third contact plug on the third impurity layer and extending in the vertical direction;
second conductive structures in contact with upper surfaces of the first contact plugs, respectively, each of the second conductive structures extending in a second direction parallel to the upper surface of the substrate and crossing the first direction, wherein the second conductive structures are wider than the first contact plugs, and wherein the second conductive structures extend beyond respective edges of the first contact plugs in the second direction;

a third conductive structure in contact with an upper surface of the third contact plug and extending in the second direction; and a fifth contact plug in contact with an upper surface of the third conductive structure, wherein a height of the third conductive structure is greater than a height of each of the second conductive structures, wherein a width of the third conductive structure is greater than a width of each of the second conductive structures, wherein a width of the fifth contact plug is less than a width of the third conductive structure, and wherein widths of the second and third conductive structures are greater than widths of the first and third contact plugs, respectively, wherein the third contact plug extends between the first contact plugs and has a width greater than that of each of the first contact plugs, and wherein, in a plan view, the fifth contact plug is between the second conductive structures.

10. The semiconductor device according to claim 9, wherein the third impurity layer is between the gate structures, wherein the third contact plug is between the first contact plugs in the first direction, wherein a thickness in the vertical direction of the third contact plug is greater than a thickness in the vertical direction of each of the first contact plugs, and wherein the first contact plugs have a same thickness in the vertical direction.

11. The semiconductor device according to claim 9, further comprising:

a second contact plug in contact with a lower surface of an end portion in the second direction of at least one of the second conductive structures and extending in the vertical direction; and a first conductive structure in contact with a lower surface of the second contact plug.

12. The semiconductor device according to claim 9, wherein the third impurity layer is between the first and second impurity layers, wherein the first contact plugs are electrically connected to the first and second impurity layers, respectively, and wherein the third and fifth contact plugs are electrically connected to the third impurity layer.

13. The semiconductor device according to claim 9, wherein the third contact plug is spaced apart from the second conductive structures on the active region by first and second distances, respectively, and wherein the first distance is different from the second distance.

14. The semiconductor device according to claim 9, wherein a distance between the third contact plug and at least one of the second conductive structures on the active region is greater than the width of each of the second conductive structures.

15. The semiconductor device according to claim 9, wherein the third contact plug is between the gate structures in a plan view, and is free from overlap by the fifth contact plug in the vertical direction, and wherein the gate structures are free from overlap by the fifth contact plug in the vertical direction.

16. A semiconductor device comprising:

first and second gate structures on a substrate and spaced apart from each other in a first direction;

first, second, and third source/drain layers at respective upper portions of the substrate, the first gate structure between the first and second source/drain layers, and the second gate structure between the second and third source/drain layers in the first direction;

first contact plugs on the first and third source/drain layers, respectively, the first contact plugs each extending in a vertical direction perpendicular to an upper surface of the substrate;

second conductive structures respectively in contact with upper surfaces of the first contact plugs;

a third contact plug on the second source/drain layer and extending in the vertical direction;

a third conductive structure in contact with an upper surface of the third contact plug; and a fifth contact plug in contact with an upper surface of the third conductive structure, wherein a height of the third conductive structure is greater than a height of each of the second conductive structures, a width of the third conductive structure is greater than a width of each of the second conductive structures, a width of the fifth contact plug is less than a width of the third conductive structure, and a widest portion of each of the second conductive structures is greater than a widest portion of each of the first contact plugs, and wherein a thickness in the vertical direction of the fifth contact plug is less than a thickness in the vertical direction of the third contact plug, is less than a thickness in the vertical direction of each of the first contact plugs, and is greater than a thickness in the vertical direction of the third conductive structure.

17. The semiconductor device according to claim 16, wherein a width of the third contact plug is greater than a width of each of the first contact plugs and is less than a width of the fifth contact plug, wherein the second source/drain layer is between the first and third source/drain layers, wherein the first contact plugs are electrically connected to the first and third source/drain layers, respectively, wherein the second conductive structures are electrically connected to the first and third source/drain layers, respectively, and wherein the third contact plug, the third conductive structure, and the fifth contact plug are electrically connected to the second source/drain layer.

18. The semiconductor device according to claim 17, wherein the third contact plug is closer in the first direction to the first gate structure than to the second gate structure, and wherein the thickness in the vertical direction of the third contact plug is greater than the thickness in the vertical direction of each of the first contact plugs.

19. The semiconductor device according to claim 16, wherein the width of each of the second conductive structures is less than a width of at least one of the first source/drain layer, the second source/drain layer, or the third source/drain layer, wherein a width of each of the first contact plugs and the third contact plug is uniform or decreases at a given ratio from a bottom toward a top thereof in the vertical direction, and wherein the first gate structure, the first source/drain layer, and the second source/drain layer are included in a same transistor.

20. The semiconductor device according to claim 16, wherein the third contact plug is between the first and second gate structures in a plan view, and is free from overlap by the fifth contact plug in the vertical direction, and wherein the first and second gate structures are free from overlap by the fifth contact plug in the vertical direction.

\* \* \* \* \*